(12) United States Patent
Park et al.

(10) Patent No.: US 11,217,037 B2
(45) Date of Patent: Jan. 4, 2022

(54) APPARATUS FOR TRANSMITTING POINT CLOUD DATA, A METHOD FOR TRANSMITTING POINT CLOUD DATA, AN APPARATUS FOR RECEIVING POINT CLOUD DATA AND A METHOD FOR RECEIVING POINT CLOUD DATA

(71) Applicant: LG ELECTRONICS INC., Seoul (KR)

(72) Inventors: Yousun Park, Seoul (KR); Sejin Oh, Seoul (KR); Hyejung Hur, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/994,310

(22) Filed: Aug. 14, 2020

(65) Prior Publication Data

US 2021/0049828 A1 Feb. 18, 2021

Related U.S. Application Data

(60) Provisional application No. 62/958,269, filed on Jan. 17, 2020.

(30) Foreign Application Priority Data

Aug. 14, 2019 (KR) .......................... 10-2019-0099819
Aug. 12, 2020 (WO) ................. PCT/KR2020/010661

(51) Int. Cl.
*H04N 19/124* (2014.01)
*G06T 19/20* (2011.01)
*G06T 17/00* (2006.01)
*H04N 19/184* (2014.01)

(52) U.S. Cl.
CPC .............. *G06T 19/20* (2013.01); *G06T 17/00* (2013.01); *H04N 19/124* (2014.11); *H04N 19/184* (2014.11); *G06T 2207/10028* (2013.01)

(58) Field of Classification Search
None
See application file for complete search history.

(56) References Cited

U.S. PATENT DOCUMENTS

| 9,286,538 | B1 | 3/2016 | Chen et al. | |
|---|---|---|---|---|
| 2003/0184555 | A1* | 10/2003 | Fraser | G06T 15/00 345/582 |
| 2012/0082218 | A1* | 4/2012 | Misra | H04N 19/124 375/240.12 |
| 2016/0234353 | A1* | 8/2016 | Kwon | H04N 21/2383 |

(Continued)

FOREIGN PATENT DOCUMENTS

| WO | 2019/011637 A1 | 1/2019 |
|---|---|---|
| WO | 2019/055963 A1 | 3/2019 |
| WO | 2019/140510 A1 | 7/2019 |

*Primary Examiner* — Bernard Krasnic
(74) *Attorney, Agent, or Firm* — Dentons US LLP

(57) ABSTRACT

Disclosed herein is a point cloud data reception device including a receiver configured to receive a bitstream containing geometry data of point cloud data and/or attribute data of the point cloud data, and/or a decoder configured to decode the point cloud data in the bitstream. Disclosed herein is a point cloud data transmission device including an encoder configured to encode point cloud data, and/or a transmitter configured to transmit a bitstream containing the point cloud data and/or signaling information about the point cloud data.

16 Claims, 45 Drawing Sheets

(56) References Cited

U.S. PATENT DOCUMENTS

| | | | |
|---|---|---|---|
| 2017/0150186 A1* | 5/2017 | Zhang | H04N 19/625 |
| 2017/0347122 A1* | 11/2017 | Chou | H04N 19/36 |
| 2018/0081034 A1 | 3/2018 | Guo | |
| 2018/0227585 A1* | 8/2018 | Wang | H04N 19/503 |
| 2019/0087979 A1* | 3/2019 | Mammou | H04N 19/597 |
| 2020/0221139 A1* | 7/2020 | Vosoughi | H04N 19/119 |

* cited by examiner

FIG. 6
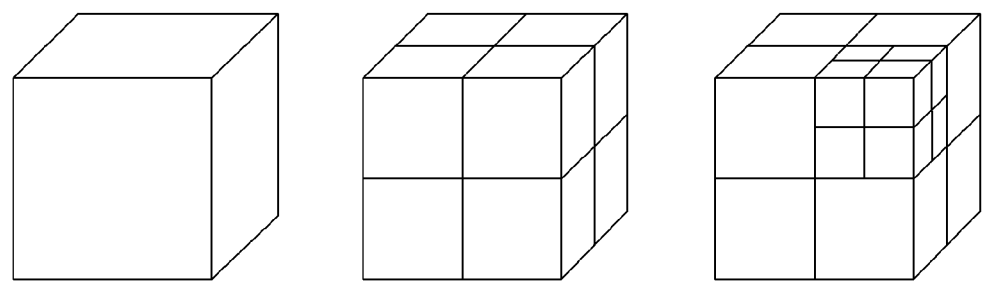
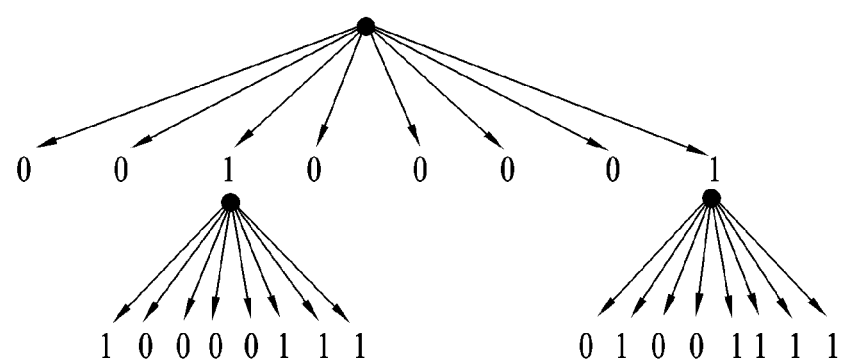

FIG. 7
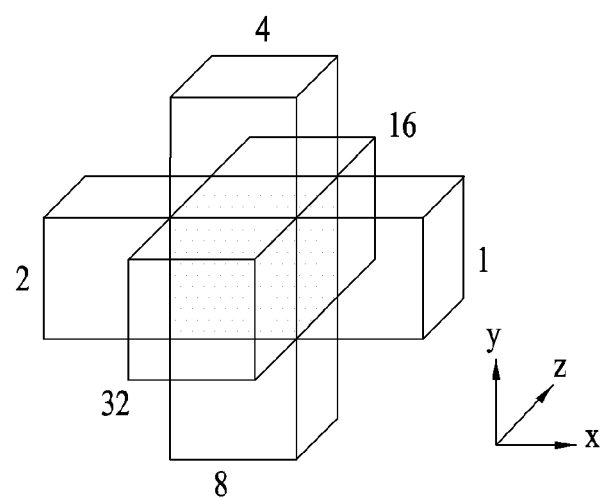
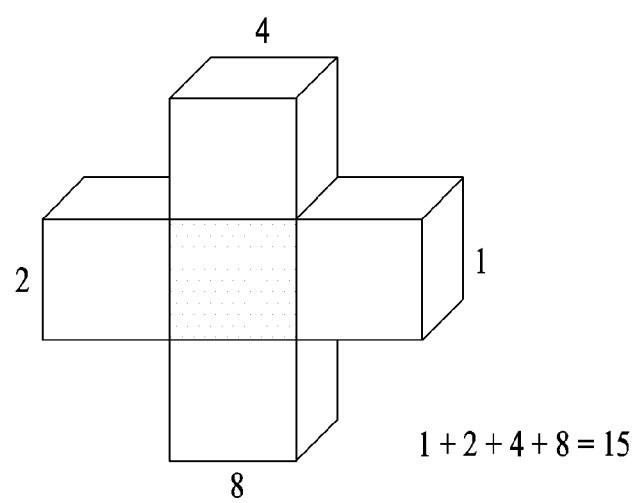
1 + 2 + 4 + 8 = 15

FIG. 39

| seq_parameter_set_rbsp() { | Descriptor |
|---|---|
| profile_idc | u(8) |
| profile_compatibility_flags | u(24) |
| level_idc | u(8) |
| sps_bounding_box_present_flag | u(1) |
| if( sps_bounding_box_present_flag ) { | |
| sps_bounding_box_offset_x | se(v) |
| sps_bounding_box_offset_y | se(v) |
| sps_bounding_box_offset_z | se(v) |
| sps_bounding_box_scale_factor | ue(v) |
| sps_bounding_box_size_width | ue(v) |
| sps_bounding_box_size_height | ue(v) |
| sps_bounding_box_size_depth | ue(v) |
| } | |
| sps_source_scale_factor | u(32) |
| sps_seq_parameter_set_id | ue(v) |
| sps_num_attribute_sets | ue(v) |
| for( i = 0; i < sps_num_attribute_sets; i++ ) { | |
| attribute_dimension[ i ] | ue(v) |
| attribute_instance_id[ i ] | ue(v) |
| attribute_bitdepth[ i ] | ue(v) |
| attribute_cicp_colour_primaries[ i ] | ue(v) |
| attribute_cicp_transfer_characteristics[ i ] | ue(v) |
| attribute_cicp_matrix_coeffs[ i ] | ue(v) |
| attribute_cicp_video_full_range_flag[ i ] | u(1) |
| known_attribute_label_flag[ i ] | u(1) |
| if( known_attribute_label_flag[ i ] ) | |
| known_attribute_label[ i ] | ue(v) |
| else | |
| attribute_label_four_bytes[ i ] | u(32) |
| } | |

| | |
|---|---|
| partitioning_enabling_flag | u(1) |
| split_recursive_enabling_flag | u(1) |
| if (partitioning_enabling_flag) { | |
| multiple_brick_partitioning_flag | ue(1) |
| partitioning_unit_size | ue(v) |
| partitioning_type_index | ue(v) |
| } | |
| If(split_recursive_enabling_flag) { | |
| partition_current_unit | ue(v) |
| } | |
| combining_filter_index | ue(v) |
| duplicated_attribute_index | ue(v) |
| sps_extension_present_flag | u(1) |
| if( sps_extension_present_flag ) | |
| while( more_data_in_byte_stream( ) ) | |
| sps_extension_data_flag | u(1) |
| byte_alignment() | |
| } | |

| | |
|---|---|
| sequential_input_slice_configuration_in_tile_flag | u(1) |
| overlapping_slice_compose_flag | u(1) |
| if(overlapping_slice_compose_flag) { | |
| overlapping_slice_compose_method[] | ue(v) |
| } | |

FIG. 40

| | Descriptor |
|---|---|
| tile_parameter_set( ) { | |
| num_tiles | ue(v) |
| for( i = 0; i < num_tiles; i++ ) { | |
|   tile_bounding_box_offset_x[ i ] | se(v) |
|   tile_bounding_box_offset_y[ i ] | se(v) |
|   tile_bounding_box_offset_z[ i ] | se(v) |
|   tile_bounding_box_scale_factor[ i ] | ue(v) |
|   tile_bounding_box_size_width[ i ] | ue(v) |
|   tile_bounding_box_size_height[ i ] | ue(v) |
|   partitioning_enabling_flag | u(1) |
|   if (partitioning_enabling_flag) { | |
|     multiple_brick_partitioning_flag | ue(v) |
|     partitioning_unit_size | ue(v) |
|     partitioning_type_index | ue(v) |
|   } | |
|   if (brick_tiling_type == 1) { | u(1) |
|     brick_unit_information | ue(v) |
|     brick_density_quantization_step | ue(v) |
|   } | |
|   if(brick_tiling_type == 2) { | u(1) |
|     bounding_box_radius | ue(v) |
|     central_node_xyz | ue(v) |
|     moving_direction_vector | ue(v) |
|     use_identical_bounding_box_information_flag | ue(v) |
|   } | |
|   if (brick_tiling_type == 3) { | u(1) |
|     enable_sorting_flag | ue(v) |
|   } | |
|   if (brick_tiling_type == 4) { | u(1) |
|     sphere_or_oval_flag | ue(v) |
|     center_point_xyz | ue(v) |
|     radius_distance | ue(v) |
|     azimuth_angle | |
|   } | |
|   if (brick_tiling_type == 5) { | u(1) |
|     referenced_attribute_type | ue(v) |
|     referenced_attribute_type_range | ue(v) |
|     referenced_attribute_type_value | |
|   } | |
|   } | |
|   combining_filter_index | ue(v) |
|   duplicated_attribute_index | ue(v) |
|   brick_unit_information | |
| } | |
| sequential_input_slice_configuration_in_tile_flag | u(1) |
| overlapping_slice_compose_flag | u(1) |
| if (overlapping_slice_compose_flag) { | |
|   overlapping_slice_compose_method[] | ue(v) |
| } | |

FIG. 41

| | Descriptor |
|---|---|
| geometry_parameter_set() { | |
| gps_geom_parameter_set_id | ue(v) |
| gps_seq_parameter_set_id | ue(v) |
| gps_box_present_flag | u(1) |
| unique_geometry_points_flag | u(1) |
| neighbour_context_restriction_flag | u(1) |
| inferred_direct_coding_mode_enabled_flag | u(1) |
| bitwise_occupancy_coding_flag | u(1) |
| child_neighbours_enabled_flag | u(1) |
| geom_occupancy_ctx_reduction_factor | ue(v) |
| log2_neighbour_avail_boundary | ue(v) |
| log2_intra_pred_max_node_size | ue(v) |
| log2_trisoup_node_size | ue(v) |
| partitioning_enabling_flag | u(1) |
| if (partitioning_enabling_flag) { | |
| multiple_brick_partitioning_flag | ue(v) |
| partitioning_unit_size | ue(v) |
| partitioning_type_index | ue(v) |
| } | |
| if (brick_tiling_type == 1) { | u(1) |
| brick_unit_information | ue(v) |
| brick_density_quantization_step | ue(v) |
| } | |
| if (brick_tiling_type == 2) { | u(1) |
| bounding_box_radius | ue(v) |
| central_node_xyz | ue(v) |
| moving_direction_vector | ue(v) |
| use_identical_bounding_box_information_flag | ue(v) |
| } | |
| if (brick_tiling_type == 3) { | u(1) |
| enable_sorting_flag | ue(v) |
| } | |
| if (brick_tiling_type == 4) { | u(1) |
| sphere_or_oval_flag | ue(v) |
| center_point_xyz | ue(v) |
| radius_distance | ue(v) |
| azimuth_angle | |
| } | |
| if (brick_tiling_type == 5) { | u(1) |
| referenced_attribute_type | ue(v) |
| referenced_attribute_type_range | ue(v) |
| referenced_attribute_type_value | ue(v) |
| } | |
| combining_filter_index | ue(v) |
| duplicated_attribute_index | ue(v) |
| brick_unit_information | u(1) |
| gps_extension_present_flag | |
| if (gps_extension_present_flag) | |
| while( more_data_in_byte_stream( ) ) | |
| gps_extension_data_flag | u(1) |
| sequential_input_slice_configuration_in_tile_flag | u(1) |
| overlapping_slice_compose_flag | u(1) |
| if (overlapping_slice_compose_flag) { | |
| overlapping_slice_compose_method[] | ue(v) |
| } | |

FIG. 42

| geometry_slice_header() { | Descriptor |
|---|---|
| gsh_geometry_parameter_set_id | ue(v) |
| gsh_tile_id | ue(v) |
| gsh_slice_id | ue(v) |
| if( gps_box_present_flag ) { | |
| gsh_box_log2_scale | ue(v) |
| gsh_box_origin_x | ue(v) |
| gsh_box_origin_y | ue(v) |
| gsh_box_origin_z | ue(v) |
| } | |
| gsh_log2_max_nodesize | ue(v) |
| gsh_points_number | ue(v) |
| partitioning_enabling_flag | u(1) |
| if(partitioning_enabling_flag) { | |
| multiple_brick_partitioning_flag | ue(v) |
| partitioning_unit_size | ue(v) |
| partitioning_type_index | ue(v) |
| if(brick_tiling_type == 1) { | u(1) |
| brick_unit_information | ue(v) |
| use_identical_bounding_box_information_flag | ue(v) |
| brick_density_quantization_step | ue(v) |
| } | |
| if(brick_tiling_type == 2) { | u(1) |
| bounding_box_radius | ue(v) |
| central_node_xyz | ue(v) |
| moving_direction_vector | ue(v) |
| use_identical_bounding_box_information_flag | ue(v) |
| } | |
| if(brick_tiling_type == 3) { | u(1) |
| enable_sorting_flag | ue(v) |
| } | |
| if(brick_tiling_type == 4) { | u(1) |
| sphere_or_oval_flag | ue(v) |
| center_point_xyz | ue(v) |
| radius_distance | ue(v) |
| azimuth_angle | |
| } | |
| if(brick_tiling_type == 5) { | u(1) |
| referenced_attribute_type | ue(v) |
| referenced_attribute_type_range | ue(v) |
| referenced_attribute_type_value | ue(v) |
| } | |
| } | |
| combining_filter_index | ue(v) |
| duplicated_attribute_index | ue(v) |
| brick_unit_information | ue(v) |
| byte_alignment( ) | |
| } | |

FIG. 43

| attribute_slice_header( ) { | Descriptor |
|---|---|
| ash_attr_parameter_set_id | ue(v) |
| ash_attr_sps_attr_idx | ue(v) |
| ash_attr_geom_slice_id | ue(v) |
| partitioning_enabling_flag { | u(1) |
| if (partitioning_enabling_flag) { | |
| multiple_brick_partitioning_flag | ue(v) |
| partitioning_unit_size | ue(v) |
| partitioning_type_index | ue(v) |
| if (brick_tiling_type == 1) { | u(1) |
| brick_unit_information | ue(v) |
| brick_density_quantization_step | ue(v) |
| } | |
| if (brick_tiling_type == 2) { | u(1) |
| bounding_box_radius | ue(v) |
| central_node_xyz | ue(v) |
| moving_direction_vector | ue(v) |
| use_identical_bounding_box_information_flag | ue(v) |
| } | |
| if (brick_tiling_type == 3) { | u(1) |
| enable_sorting_flag | ue(v) |
| } | |
| if (brick_tiling_type == 4) { | u(1) |
| sphere_or_oval_flag | ue(v) |
| center_point_xyz | ue(v) |
| radius_distance | ue(v) |
| azimuth_angle | |
| } | |
| if (brick_tiling_type == 5) { | u(1) |
| referenced_attribute_type | ue(v) |
| referenced_attribute_type_range | ue(v) |
| referenced_attribute_type_value | ue(v) |
| } | |
| } | |
| combining_filter_index | ue(v) |
| duplicated_attribute_index | ue(v) |
| brick_unit_information | |
| byte_alignment( ) | |
| } | |

APPARATUS FOR TRANSMITTING POINT CLOUD DATA, A METHOD FOR TRANSMITTING POINT CLOUD DATA, AN APPARATUS FOR RECEIVING POINT CLOUD DATA AND A METHOD FOR RECEIVING POINT CLOUD DATA

This application claims the benefit of and priority to Korean Application No. 10-2019-0099819 filed on Aug. 14, 2019, U.S. Provisional Application No. 62/958,269 filed on Jan. 7, 2020 and International Application No. PCT/KR2020/010661 filed on Aug. 12, 2020, all of which are hereby incorporated by reference in their entirety for all purposes as if fully set forth herein.

TECHNICAL FIELD

Embodiments provide a method for providing point cloud contents to provide a user with various services such as virtual reality (VR), augmented reality (AR), mixed reality (MR), and self-driving services.

BACKGROUND ART

Point cloud data is a set of points in a three-dimensional (3D) space. It is difficult to generate point cloud data because the number of points in the 3D space is large.

A point cloud frame or point cloud data may be divided into tiles or slices to meet the demand for transmission, encoding, decoding, and rendering processing that is to be performed with low latency in real time.

DISCLOSURE

Technical Problem

An object of the embodiments is to provide a point cloud data transmission device, a point cloud data transmission method, a point cloud data reception device, and a point cloud data reception method for efficiently transmitting and receiving a point cloud.

Another object of the embodiments is to provide a point cloud data transmission device, a point cloud data transmission method, a point cloud data reception device, and a point cloud data reception method for addressing latency and encoding/decoding complexity.

Another object of the embodiments is to provide a method of splitting point cloud data for encoding and decoding point cloud data.

Another object of the embodiments is to improve encoding of attribute information of geometry-point cloud compression (G-PCC) to improve performance of point cloud compression.

The technical scope of the embodiments is not limited to the aforementioned technical objects, and other objects may be inferred by those skilled in the art based on the entire contents of this document.

Technical Solution

To achieve these objects and other advantages and in accordance with the purpose of the disclosure, as embodied and broadly described herein, a method for transmitting point cloud data may include encoding the point cloud data, and/or transmitting a bitstream containing the point cloud data and signaling information about the point cloud data.

According to embodiments, the encoding may include encoding geometry data of points of the point cloud data, and encoding attribute data of the points of the point cloud data.

Further, according to embodiments, the point cloud data transmission method may further include partitioning the point cloud data into one or more slices, wherein the encoding may include encoding the point cloud data on a slice-by-slice basis.

Further, according to embodiments, the partitioning may include partitioning the point cloud data based on a maximum number of points included in the slice.

Further, according to embodiments, the signaling information may include information indicating whether the partitioning is performed and information indicating a partitioning method when the partitioning is performed, wherein the partitioning may include partitioning the point cloud data into a plurality of slices including a first slice and a second slice, wherein the first slice and the second slice may include an overlapped region in a three-dimensional space including the point cloud data.

Further, according to embodiments, the partitioning method may be at least one of a partitioning method based on an octree of the point cloud data or a partitioning method based on lengths of axes of a three-dimensional space including the point cloud data.

Further, in the point cloud data transmission method according to embodiments, when the number of points of the point cloud data is less than or equal to maximum number information, partitioning the point cloud data into one or more slices may be skipped.

In another aspect of the present disclosure, a method for receiving point cloud data may include receiving a bitstream containing geometry data of the point cloud data and attribute data of the point cloud data, and decoding the point cloud data in the bitstream.

According to embodiments, the decoding may include decoding the geometry data of the point cloud data, and/or decoding the attribute data of the point cloud data.

According to embodiments, the bitstream may contain information indicating whether the point cloud data is partitioned into one or more slices, wherein, when the received point cloud data includes a plurality of slices, the decoding may include decoding the received point cloud data on a slice-by-slice basis, wherein the number of points included in the slice may be determined based on information on a maximum number of points.

According to embodiments, the bitstream may include information indicating a partitioning method for the slices. According to embodiments, the slices may include a first slice and a second slice, wherein the first slice and the second slice may include an overlapped region in a three-dimensional space including the point cloud data.

Further, according to the embodiments, the partitioning method may be at least one of a partitioning method based on an octree of the point cloud data or a partitioning method based on lengths of axes of a three-dimensional space including the point cloud data.

According to embodiments, the partitioning method may be at least one of a partitioning method based on an octree of the point cloud data or a partitioning method based on lengths of axes of a three-dimensional space including the point cloud data.

Advantageous Effects

A point cloud data transmission method, a point cloud data transmission device, a point cloud data reception method, and a point cloud data reception device according to embodiments may provide a good-quality point cloud service.

A point cloud data transmission method, a point cloud data transmission device, a point cloud data reception method, and a point cloud data reception device according to embodiments may achieve various video codec methods.

A point cloud data transmission method, a point cloud data transmission device, a point cloud data reception method, and a point cloud data reception device according to embodiments may provide general-purpose point cloud content such as a self-driving service.

A point cloud data transmission method, a point cloud data transmission device, a point cloud data reception method, and a point cloud data reception device according to embodiments may implement a partitioning method for slices and signal data necessary therefor, thereby improving performance of coding of a point cloud.

A point cloud data transmission method, a point cloud data transmission device, a point cloud data reception method, and a point cloud data reception device according to embodiments may perform spatial adaptive partitioning for independent encoding and decoding of point cloud data, thereby improving parallel processing and providing scalability.

With a point cloud data transmission method, a point cloud data transmission device, a point cloud data reception method, re-partitioning of spatially close points may be performed in performing independent data partitioning.

A point cloud data transmission method, a point cloud data transmission device, a point cloud data reception method, and a point cloud data reception device according to embodiments may partition the point cloud data into tiles, slices and/or bricks, as illustrated in FIGS. 18 and 19, thereby enabling random access and parallel coding in a three-dimensional space occupied by the point cloud data.

With a point cloud data transmission method, a point cloud data transmission device, a point cloud data reception method, and a point cloud data reception device according to embodiments, encoding and decoding may be independently performed on a slice-by-slice basis. Accordingly, error may be prevented from being accumulated in the encoding and decoding.

DESCRIPTION OF DRAWINGS

The accompanying drawings, which are included to provide a further understanding of the disclosure and are incorporated in and constitute a part of this application, illustrate embodiment(s) of the disclosure and together with the description serve to explain the principle of the disclosure. For a better understanding of various embodiments described below, reference should be made to the description of the following embodiments in connection with the accompanying drawings. The same reference numbers will be used throughout the drawings to refer to the same or like parts. In the drawings:

FIG. 6 shows an example of an octree and occupancy code according to embodiments;

FIG. 7 shows an example of a neighbor node pattern according to embodiments;

FIG. 39 illustrates a sequence parameter set (SPS) in a bitstream according to embodiments;

FIG. 40 illustrates a tile parameter set (TPS) of a bitstream according to embodiments;

FIG. 41 illustrates a geometry parameter set (GPS) of a bitstream according to embodiments;

FIG. 42 illustrates a geometry slice header (GSH) of a bitstream according to embodiments;

FIG. 43 illustrates an attribute slice header (ASH) of a bitstream according to embodiments;

BEST MODE

Reference will now be made in detail to the preferred embodiments of the present disclosure, examples of which are illustrated in the accompanying drawings. The detailed description, which will be given below with reference to the accompanying drawings, is intended to explain exemplary embodiments of the present disclosure, rather than to show the only embodiments that may be implemented according to the present disclosure. The following detailed description includes specific details in order to provide a thorough understanding of the present disclosure. However, it will be apparent to those skilled in the art that the present disclosure may be practiced without such specific details.

Although most terms used in the present disclosure have been selected from general ones widely used in the art, some terms have been arbitrarily selected by the applicant and their meanings are explained in detail in the following description as needed. Thus, the present disclosure should be understood based upon the intended meanings of the terms rather than their simple names or meanings.

Figure 1:
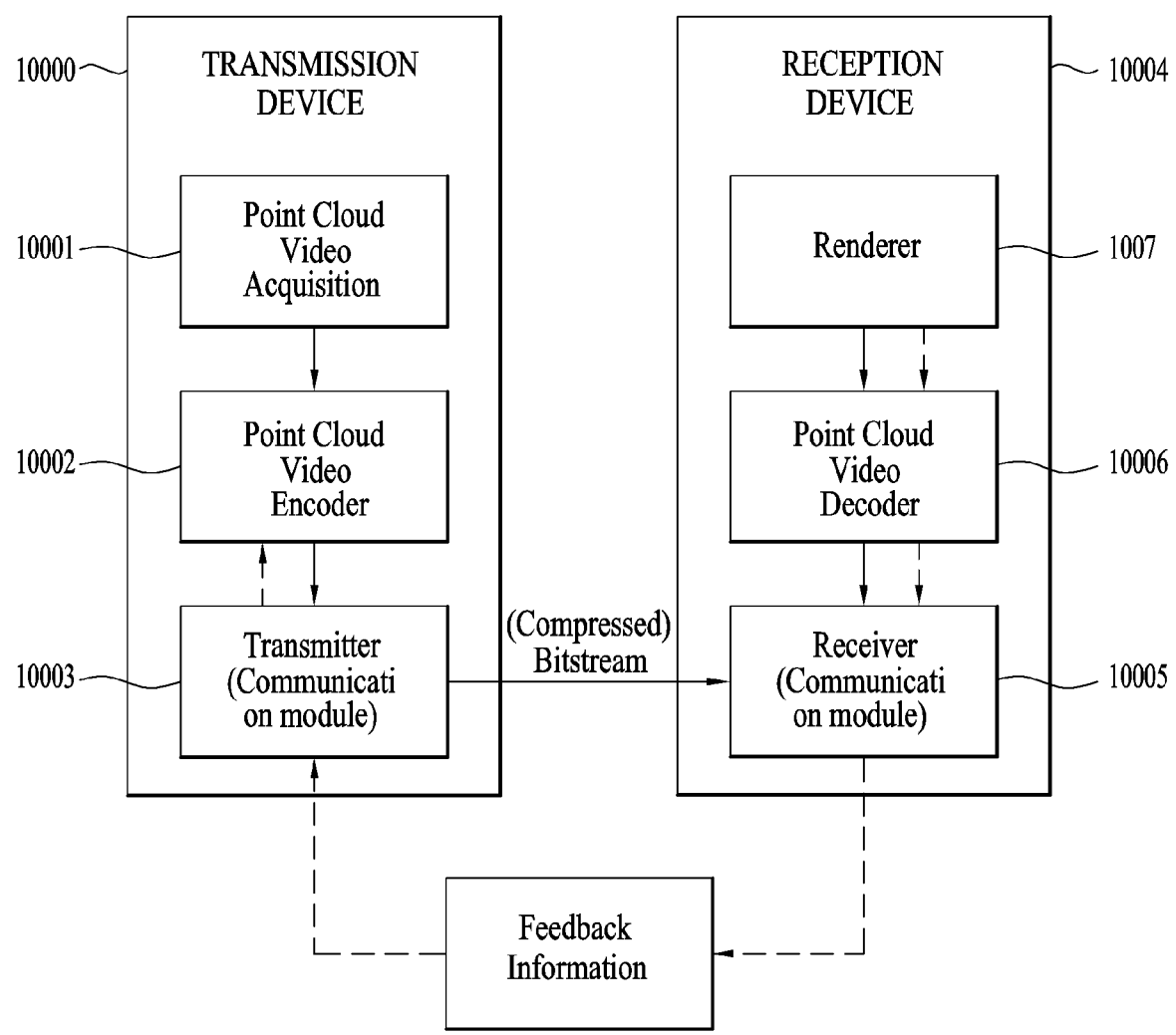
FIG. 1 shows an exemplary point cloud content providing system according to embodiments.

FIG. 1 shows an exemplary point cloud content providing system according to embodiments.

The point cloud content providing system illustrated in FIG. 1 may include a transmission device 10000 and a reception device 10004. The transmission device 10000 and the reception device 10004 are capable of wired or wireless communication to transmit and receive point cloud data.

The point cloud data transmission device 10000 according to the embodiments may secure and process point cloud video (or point cloud content) and transmit the same. According to embodiments, the transmission device 10000 may include a fixed station, a base transceiver system (BTS), a network, an artificial intelligence (AI) device and/or system, a robot, an AR/VR/XR device and/or server. According to embodiments, the transmission device 10000 may include a device, a robot, a vehicle, an AR/VR/XR device, a portable device, a home appliance, an Internet of Thing (IoT) device, and an AI device/server which are configured to perform communication with a base station and/or other wireless devices using a radio access technology (e.g., 5G New RAT (NR), Long Term Evolution (LTE)).

The transmission device 10000 according to the embodiments includes a point cloud video acquirer 10001, a point cloud video encoder 10002, and/or a transmitter (or communication module) 10003.

The point cloud video acquirer 10001 according to the embodiments acquires a point cloud video through a processing process such as capture, synthesis, or generation. The point cloud video is point cloud content represented by a point cloud, which is a set of points positioned in a 3D space, and may be referred to as point cloud video data. The point cloud video according to the embodiments may include one or more frames. One frame represents a still image/picture. Therefore, the point cloud video may include a point cloud image/frame/picture, and may be referred to as a point cloud image, frame, or picture.

The point cloud video encoder 10002 according to the embodiments encodes the acquired point cloud video data. The point cloud video encoder 10002 may encode the point cloud video data based on point cloud compression coding. The point cloud compression coding according to the embodiments may include geometry-based point cloud compression (G-PCC) coding and/or video-based point cloud compression (V-PCC) coding or next-generation coding. The point cloud compression coding according to the embodiments is not limited to the above-described embodiment. The point cloud video encoder 10002 may output a bitstream containing the encoded point cloud video data. The bitstream may contain not only the encoded point cloud video data, but also signaling information related to encoding of the point cloud video data.

The transmitter 10003 according to the embodiments transmits the bitstream containing the encoded point cloud video data. The bitstream according to the embodiments is encapsulated in a file or segment (for example, a streaming segment), and is transmitted over various networks such as a broadcasting network and/or a broadband network. Although not shown in the figure, the transmission device 10000 may include an encapsulator (or an encapsulation module) configured to perform an encapsulation operation. According to embodiments, the encapsulator may be included in the transmitter 10003. According to embodiments, the file or segment may be transmitted to the reception device 10004 over a network, or stored in a digital storage medium (e.g., USB, SD, CD, DVD, Blu-ray, HDD, SSD, etc.). The transmitter 10003 according to the embodiments is capable of wired/wireless communication with the reception device 10004 (or the receiver 10005) over a network of 4G, 5G, 6G, etc. In addition, the transmitter may perform a necessary data processing operation according to the network system (e.g., a 4G, 5G or 6G communication network system). The transmission device 10000 may transmit the encapsulated data in an on-demand manner.

The reception device 10004 according to the embodiments includes a receiver 10005, a point cloud video decoder 10006, and/or a renderer 10007. According to embodiments, the reception device 10004 may include a device, a robot, a vehicle, an AR/VR/XR device, a portable device, a home appliance, an Internet of Things (IoT) device, and an AI device/server which are configured to perform communication with a base station and/or other wireless devices using a radio access technology (e.g., 5G New RAT (NR), Long Term Evolution (LTE)).

The receiver 10005 according to the embodiments receives the bitstream containing the point cloud video data or the file/segment in which the bitstream is encapsulated from the network or storage medium. The receiver 10005 may perform necessary data processing according to the network system (for example, a communication network system of 4G, 5G, 6G, etc.). The receiver 10005 according to the embodiments may decapsulate the received file/segment and output a bitstream. According to embodiments, the receiver 10005 may include a decapsulator (or a decapsulation module) configured to perform a decapsulation operation. The decapsulator may be implemented as an element (or component) separate from the receiver 10005.

The point cloud video decoder 10006 decodes the bitstream containing the point cloud video data. The point cloud video decoder 10006 may decode the point cloud video data according to the method by which the point cloud video data is encoded (for example, in a reverse process of the operation of the point cloud video encoder 10002). Accordingly, the point cloud video decoder 10006 may decode the point cloud video data by performing point cloud decompression coding, which is the inverse process of the point cloud compression. The point cloud decompression coding includes G-PCC coding.

The renderer 10007 renders the decoded point cloud video data. The renderer 10007 may output point cloud content by rendering not only the point cloud video data but also audio data. According to embodiments, the renderer 10007 may include a display configured to display the point cloud content. According to embodiments, the display may be implemented as a separate device or component rather than being included in the renderer 10007.

The arrows indicated by dotted lines in the drawing represent a transmission path of feedback information acquired by the reception device 10004. The feedback information is information for reflecting interactivity with a user who consumes the point cloud content, and includes information about the user (e.g., head orientation information, viewport information, and the like). In particular, when the point cloud content is content for a service (e.g., self-driving service, etc.) that requires interaction with the user, the feedback information may be provided to the content transmitting side (e.g., the transmission device 10000) and/or the service provider. According to embodiments, the feedback information may be used in the reception device 10004 as well as the transmission device 10000, or may not be provided.

The head orientation information according to embodiments is information about the user's head position, orientation, angle, motion, and the like. The reception device 10004 according to the embodiments may calculate the viewport information based on the head orientation information. The viewport information may be information about a region of a point cloud video that the user is viewing. A viewpoint is a point through which the user is viewing the point cloud video, and may refer to a center point of the viewport region. That is, the viewport is a region centered on the viewpoint, and the size and shape of the region may be determined by a field of view (FOV). Accordingly, the reception device 10004 may extract the viewport information based on a vertical or horizontal FOV supported by the device in addition to the head orientation information. Also, the reception device 10004 performs gaze analysis or the like to check the way the user consumes a point cloud, a region that the user gazes at in the point cloud video, a gaze time, and the like. According to embodiments, the reception device 10004 may transmit feedback information including the result of the gaze analysis to the transmission device 10000. The feedback information according to the embodiments may be acquired in the rendering and/or display process. The feedback information according to the embodiments may be secured by one or more sensors included in the reception device 10004. According to embodiments, the feedback information may be secured by the renderer 10007 or a separate external element (or device, component, or the like). The dotted lines in FIG. 1 represent a process of transmitting the feedback information secured by the renderer 10007. The point cloud content providing system may process (encode/decode) point cloud data based on the feedback information. Accordingly, the point cloud video data decoder 10006 may perform a decoding operation based on the feedback information. The reception device 10004 may transmit the feedback information to the transmission device 10000. The transmission device 10000 (or the point cloud video data encoder 10002) may perform an encoding operation based on the feedback information. Accordingly, the point cloud content providing system may efficiently process necessary data (e.g., point cloud data corresponding to the user's head position) based on the feedback information rather than processing (encoding/decoding) the entire point cloud data, and provide point cloud content to the user.

According to embodiments, the transmission device 10000 may be called an encoder, a transmitting device, a transmitter, or the like, and the reception device 10004 may be called a decoder, a receiving device, a receiver, or the like.

The point cloud data processed in the point cloud content providing system of FIG. 1 according to embodiments (through a series of processes of acquisition/encoding/transmission/decoding/rendering) may be referred to as point cloud content data or point cloud video data. According to embodiments, the point cloud content data may be used as a concept covering metadata or signaling information related to the point cloud data.

The elements of the point cloud content providing system illustrated in FIG. 1 may be implemented by hardware, software, a processor, and/or a combination thereof.

Figure 2:
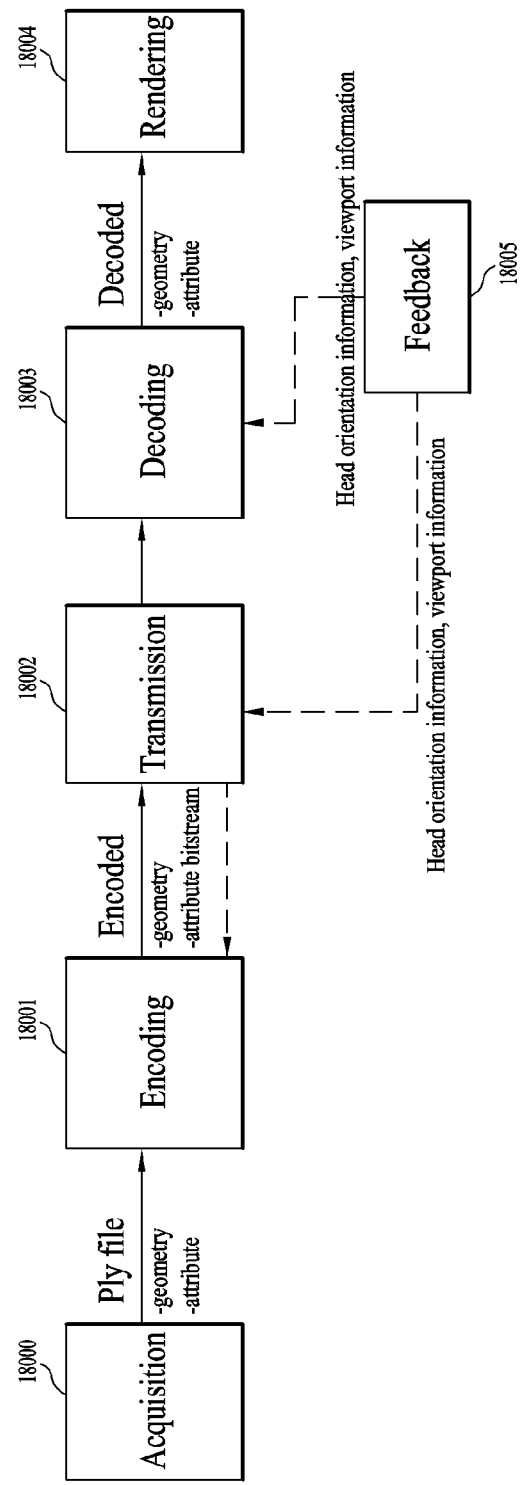
FIG. 2 is a block diagram illustrating a point cloud content providing operation according to embodiments.

FIG. 2 is a block diagram illustrating a point cloud content providing operation according to embodiments.

The block diagram of FIG. 2 shows the operation of the point cloud content providing system described in FIG. 1. As described above, the point cloud content providing system may process point cloud data based on point cloud compression coding (e.g., G-PCC).

The point cloud content providing system according to the embodiments (for example, the point cloud transmission device 10000 or the point cloud video acquirer 10001) may acquire a point cloud video (20000). The point cloud video is represented by a point cloud belonging to a coordinate system for expressing a 3D space. The point cloud video according to the embodiments may include a Ply (Polygon File format or the Stanford Triangle format) file. When the point cloud video has one or more frames, the acquired point cloud video may include one or more Ply files. The Ply files contain point cloud data, such as point geometry and/or attributes. The geometry includes positions of points. The position of each point may be represented by parameters (for example, values of the X, Y, and Z axes) representing a three-dimensional coordinate system (e.g., a coordinate system composed of X, Y and Z axes). The attributes include attributes of points (e.g., information about texture, color (in YCbCr or RGB), reflectance r, transparency, etc. of each point). A point has one or more attributes. For example, a point may have an attribute that is a color, or two attributes that are color and reflectance. According to embodiments, the geometry may be called positions, geometry information, geometry data, or the like, and the attribute may be called attributes, attribute information, attribute data, or the like. The point cloud content providing system (for example, the point cloud transmission device 10000 or the point cloud video acquirer 10001) may secure point cloud data from information (e.g., depth information, color information, etc.) related to the acquisition process of the point cloud video.

The point cloud content providing system (for example, the transmission device 10000 or the point cloud video encoder 10002) according to the embodiments may encode the point cloud data (20001). The point cloud content providing system may encode the point cloud data based on point cloud compression coding. As described above, the point cloud data may include the geometry and attributes of a point. Accordingly, the point cloud content providing system may perform geometry encoding of encoding the geometry and output a geometry bitstream. The point cloud content providing system may perform attribute encoding of encoding attributes and output an attribute bitstream. According to embodiments, the point cloud content providing system may perform the attribute encoding based on the geometry encoding. The geometry bitstream and the attribute bitstream according to the embodiments may be multiplexed and output as one bitstream. The bitstream according to the embodiments may further contain signaling information related to the geometry encoding and attribute encoding.

The point cloud content providing system (for example, the transmission device 10000 or the transmitter 10003) according to the embodiments may transmit the encoded point cloud data (20002). As illustrated in FIG. 1, the encoded point cloud data may be represented by a geometry bitstream and an attribute bitstream. In addition, the encoded point cloud data may be transmitted in the form of a bitstream together with signaling information related to encoding of the point cloud data (for example, signaling information related to the geometry encoding and the attribute encoding). The point cloud content providing system may encapsulate a bitstream that carries the encoded point cloud data and transmit the same in the form of a file or segment.

The point cloud content providing system (for example, the reception device 10004 or the receiver 10005) according to the embodiments may receive the bitstream containing the encoded point cloud data. In addition, the point cloud content providing system (for example, the reception device 10004 or the receiver 10005) may demultiplex the bitstream.

The point cloud content providing system (e.g., the reception device 10004 or the point cloud video decoder 10005) may decode the encoded point cloud data (e.g., the geometry bitstream, the attribute bitstream) transmitted in the bitstream. The point cloud content providing system (for example, the reception device 10004 or the point cloud video decoder 10005) may decode the point cloud video data based on the signaling information related to encoding of the point cloud video data contained in the bitstream. The point cloud content providing system (for example, the reception device 10004 or the point cloud video decoder 10005) may decode the geometry bitstream to reconstruct the positions (geometry) of points. The point cloud content providing system may reconstruct the attributes of the points by decoding the attribute bitstream based on the reconstructed geometry. The point cloud content providing system (for example, the reception device 10004 or the point cloud video decoder 10005) may reconstruct the point cloud video based on the positions according to the reconstructed geometry and the decoded attributes.

The point cloud content providing system according to the embodiments (for example, the reception device 10004 or the renderer 10007) may render the decoded point cloud data (20004). The point cloud content providing system (for example, the reception device 10004 or the renderer 10007) may render the geometry and attributes decoded through the decoding process, using various rendering methods. Points in the point cloud content may be rendered to a vertex having a certain thickness, a cube having a specific minimum size centered on the corresponding vertex position, or a circle centered on the corresponding vertex position. All or part of the rendered point cloud content is provided to the user through a display (e.g., a VR/AR display, a general display, etc.).

The point cloud content providing system (for example, the reception device 10004) according to the embodiments may secure feedback information (20005). The point cloud content providing system may encode and/or decode point cloud data based on the feedback information. The feedback information and the operation of the point cloud content providing system according to the embodiments are the same as the feedback information and the operation described with reference to FIG. 1, and thus detailed description thereof is omitted.

Figure 3:
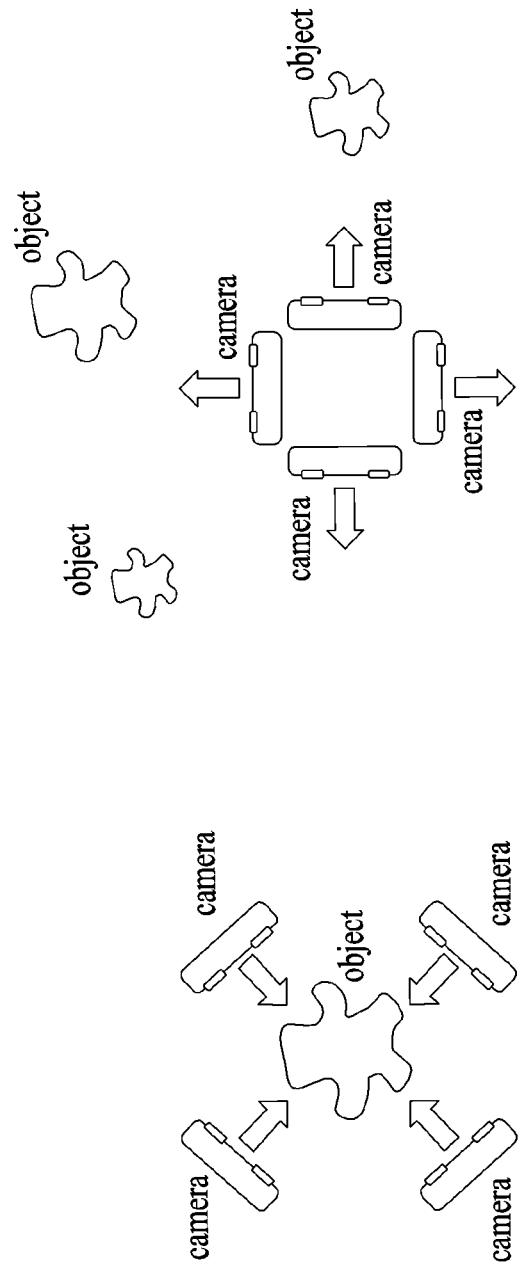
FIG. 3 illustrates an exemplary process of capturing a point cloud video according to embodiments.

FIG. 3 illustrates an exemplary process of capturing a point cloud video according to embodiments.

FIG. 3 illustrates an exemplary point cloud video capture process of the point cloud content providing system described with reference to FIGS. 1 to 2.

Point cloud content includes a point cloud video (images and/or videos) representing an object and/or environment located in various 3D spaces (e.g., a 3D space representing a real environment, a 3D space representing a virtual environment, etc.). Accordingly, the point cloud content providing system according to the embodiments may capture a point cloud video using one or more cameras (e.g., an infrared camera capable of securing depth information, an RGB camera capable of extracting color information corresponding to the depth information, etc.), a projector (e.g., an infrared pattern projector to secure depth information), a LiDAR, or the like. The point cloud content providing system according to the embodiments may extract the shape of geometry composed of points in a 3D space from the depth information and extract the attributes of each point from the color information to secure point cloud data. An image and/or video according to the embodiments may be captured based on at least one of the inward-facing technique and the outward-facing technique.

The left part of FIG. 3 illustrates the inward-facing technique. The inward-facing technique refers to a technique of capturing images a central object with one or more cameras (or camera sensors) positioned around the central object. The inward-facing technique may be used to generate point cloud content providing a 360-degree image of a key object to the user (e.g., VR/AR content providing a 360-degree image of an object (e.g., a key object such as a character, player, object, or actor) to the user).

The right part of FIG. 3 illustrates the outward-facing technique. The outward-facing technique refers to a technique of capturing images an environment of a central object rather than the central object with one or more cameras (or camera sensors) positioned around the central object. The outward-facing technique may be used to generate point cloud content for providing a surrounding environment that appears from the user's point of view (e.g., content representing an external environment that may be provided to a user of a self-driving vehicle).

As shown in the figure, the point cloud content may be generated based on the capturing operation of one or more cameras. In this case, the coordinate system may differ among the cameras, and accordingly the point cloud content providing system may calibrate one or more cameras to set a global coordinate system before the capturing operation. In addition, the point cloud content providing system may generate point cloud content by synthesizing an arbitrary image and/or video with an image and/or video captured by the above-described capture technique. The point cloud content providing system may not perform the capturing operation described in FIG. 3 when it generates point cloud content representing a virtual space. The point cloud content providing system according to the embodiments may perform post-processing on the captured image and/or video. In other words, the point cloud content providing system may remove an unwanted area (for example, a background), recognize a space to which the captured images and/or videos are connected, and, when there is a spatial hole, perform an operation of filling the spatial hole.

The point cloud content providing system may generate one piece of point cloud content by performing coordinate transformation on points of the point cloud video secured from each camera. The point cloud content providing system may perform coordinate transformation on the points based on the coordinates of the position of each camera. Accordingly, the point cloud content providing system may generate content representing one wide range, or may generate point cloud content having a high density of points.

Figure 4:
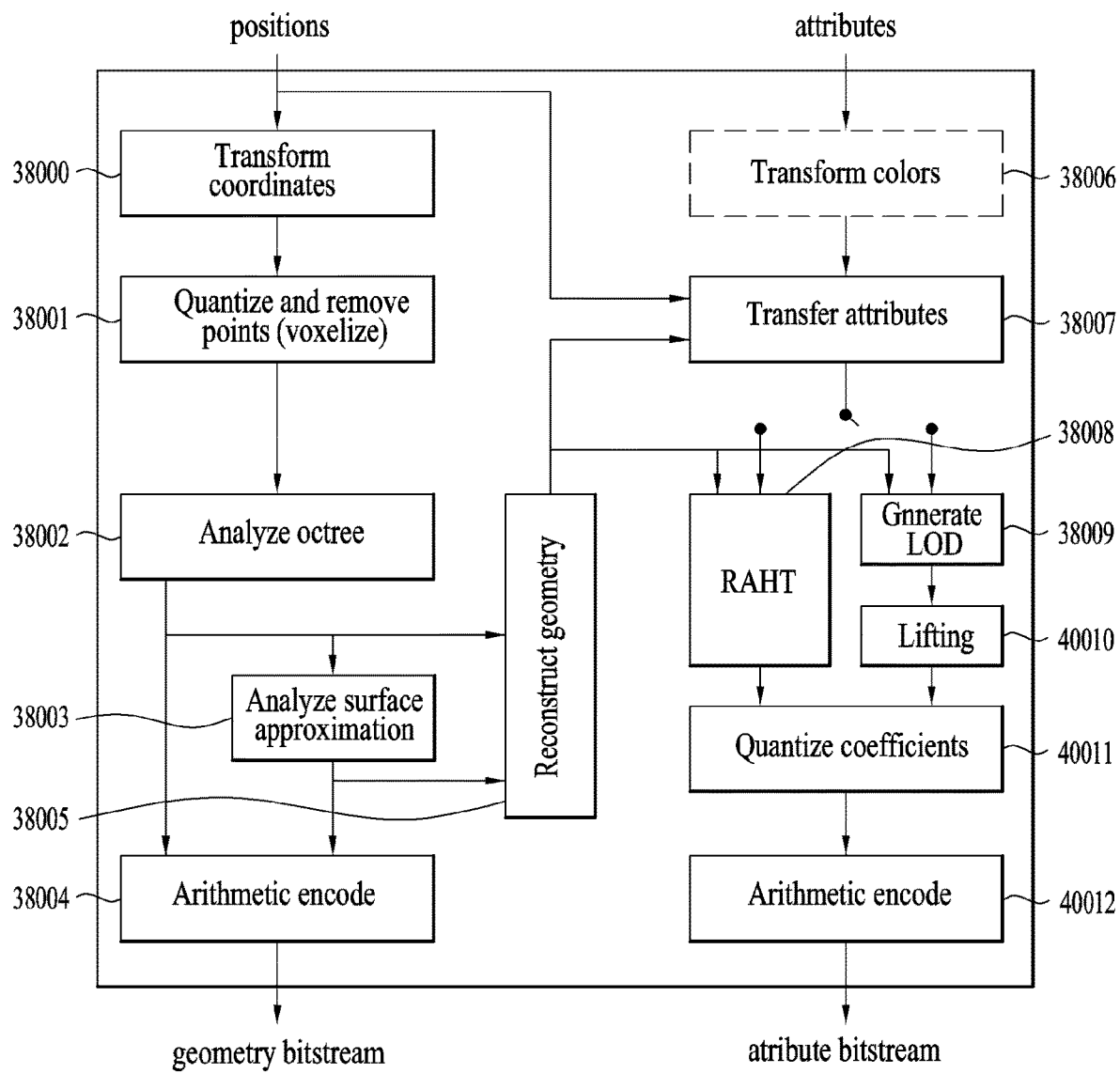
FIG. 4 illustrates an exemplary point cloud encoder according to embodiments.

FIG. 4 illustrates an exemplary point cloud encoder according to embodiments.

FIG. 4 shows an example of the point cloud video encoder 10002 of FIG. 1. The point cloud encoder reconstructs and encodes point cloud data (e.g., positions and/or attributes of the points) to adjust the quality of the point cloud content (to, for example, lossless, lossy, or near-lossless) according to the network condition or applications. When the overall size of the point cloud content is large (e.g., point cloud content of 60 Gbps is given for 30 fps), the point cloud content providing system may fail to stream the content in real time. Accordingly, the point cloud content providing system may reconstruct the point cloud content based on the maximum target bitrate to provide the same in accordance with the network environment or the like.

As described with reference to FIGS. 1 to 2, the point cloud encoder may perform geometry encoding and attribute encoding. The geometry encoding is performed before the attribute encoding.

The point cloud encoder according to the embodiments includes a coordinate transformer (Transform coordinates) 40000, a quantizer (Quantize and remove points (voxelize)) 40001, an octree analyzer (Analyze octree) 40002, and a surface approximation analyzer (Analyze surface approximation) 40003, an arithmetic encoder (Arithmetic encode) 40004, a geometric reconstructor (Reconstruct geometry) 40005, a color transformer (Transform colors) 40006, an attribute transformer (Transform attributes) 40007, a RAHT transformer (RAHT) 40008, an LOD generator (Generate LOD) 40009, a lifting transformer (Lifting) 40010, a coefficient quantizer (Quantize coefficients) 40011, and/or an arithmetic encoder (Arithmetic encode) 40012.

The coordinate transformer 40000, the quantizer 40001, the octree analyzer 40002, the surface approximation analyzer 40003, the arithmetic encoder 40004, and the geometry reconstructor 40005 may perform geometry encoding. The geometry encoding according to the embodiments may include octree geometry coding, direct coding, trisoup geometry encoding, and entropy encoding. The direct coding and trisoup geometry encoding are applied selectively or in combination. The geometry encoding is not limited to the above-described example.

As shown in the figure, the coordinate transformer 40000 according to the embodiments receives positions and transforms the same into coordinates. For example, the positions may be transformed into position information in a three-dimensional space (for example, a three-dimensional space represented by an XYZ coordinate system). The position information in the three-dimensional space according to the embodiments may be referred to as geometry information.

The quantizer 40001 according to the embodiments quantizes the geometry. For example, the quantizer 40001 may quantize the points based on a minimum position value of all points (for example, a minimum value on each of the X, Y, and Z axes). The quantizer 40001 performs a quantization operation of multiplying the difference between the minimum position value and the position value of each point by a preset quantization scale value and then finding the nearest integer value by rounding the value obtained through the multiplication. Thus, one or more points may have the same quantized position (or position value). The quantizer 40001 according to the embodiments performs voxelization based on the quantized positions to reconstruct quantized points. As in the case of a pixel, which is the minimum unit containing 2D image/video information, points of point cloud content (or 3D point cloud video) according to the embodiments may be included in one or more voxels. The term voxel, which is a compound of volume and pixel, refers to a 3D cubic space generated when a 3D space is divided into units (unit=1.0) based on the axes representing the 3D space (e.g., X-axis, Y-axis, and Z-axis). The quantizer 40001 may match groups of points in the 3D space with voxels. According to embodiments, one voxel may include only one point. According to embodiments, one voxel may include one or more points. In order to express one voxel as one point, the position of the center of a voxel may be set based on the positions of one or more points included in the voxel. In this case, attributes of all positions included in one voxel may be combined and assigned to the voxel.

The octree analyzer 40002 according to the embodiments performs octree geometry coding (or octree coding) to present voxels in an octree structure. The octree structure represents points matched with voxels, based on the octal tree structure.

The surface approximation analyzer 40003 according to the embodiments may analyze and approximate the octree. The octree analysis and approximation according to the embodiments is a process of analyzing a region containing a plurality of points to efficiently provide octree and voxelization.

The arithmetic encoder 40004 according to the embodiments performs entropy encoding on the octree and/or the approximated octree. For example, the encoding scheme includes arithmetic encoding. As a result of the encoding, a geometry bitstream is generated.

The color transformer 40006, the attribute transformer 40007, the RAHT transformer 40008, the LOD generator 40009, the lifting transformer 40010, the coefficient quantizer 40011, and/or the arithmetic encoder 40012 perform attribute encoding. As described above, one point may have one or more attributes. The attribute encoding according to the embodiments is equally applied to the attributes that one point has. However, when an attribute (e.g., color) includes one or more elements, attribute encoding is independently applied to each element. The attribute encoding according to the embodiments includes color transform coding, attribute transform coding, region adaptive hierarchical transform (RAHT) coding, interpolation-based hierarchical nearest-neighbor prediction (prediction transform) coding, and interpolation-based hierarchical nearest-neighbor prediction with an update/lifting step (lifting transform) coding. Depending on the point cloud content, the RAHT coding, the prediction transform coding and the lifting transform coding described above may be selectively used, or a combination of one or more of the coding schemes may be used. The attribute encoding according to the embodiments is not limited to the above-described example.

The color transformer 40006 according to the embodiments performs color transform coding of transforming color values (or textures) included in the attributes. For example, the color transformer 40006 may transform the format of color information (for example, from RGB to YCbCr). The operation of the color transformer 40006 according to embodiments may be optionally applied according to the color values included in the attributes.

The geometry reconstructor 40005 according to the embodiments reconstructs (decompresses) the octree and/or the approximated octree. The geometry reconstructor 40005 reconstructs the octree/voxels based on the result of analyzing the distribution of points. The reconstructed octree/voxels may be referred to as reconstructed geometry (restored geometry).

The attribute transformer 40007 according to the embodiments performs attribute transformation to transform the attributes based on the reconstructed geometry and/or the positions on which geometry encoding is not performed. As described above, since the attributes are dependent on the geometry, the attribute transformer 40007 may transform the attributes based on the reconstructed geometry information. For example, based on the position value of a point included in a voxel, the attribute transformer 40007 may transform the attribute of the point at the position. As described above, when the position of the center of a voxel is set based on the positions of one or more points included in the voxel, the attribute transformer 40007 transforms the attributes of the one or more points. When the trisoup geometry encoding is performed, the attribute transformer 40007 may transform the attributes based on the trisoup geometry encoding.

The attribute transformer 40007 may perform the attribute transformation by calculating the average of attributes or attribute values of neighboring points (e.g., color or reflectance of each point) within a specific position/radius from the position (or position value) of the center of each voxel. The attribute transformer 40007 may apply a weight according to the distance from the center to each point in calculating the average. Accordingly, each voxel has a position and a calculated attribute (or attribute value).

The attribute transformer 40007 may search for neighboring points present within a specific position/radius from the position of the center of each voxel based on the K-D tree or the Morton code. The K-D tree is a binary search tree and supports a data structure capable of managing points based on the positions such that nearest neighbor search (NNS) can be performed quickly. The Morton code is generated by presenting coordinates (e.g., (x, y, z)) representing 3D positions of all points as bit values and mixing the bits. For example, when the coordinates representing the position of a point are (5, 9, 1), the bit values for the coordinates are (0101, 1001, 0001). Mixing the bit values according to the bit index in order of z, y, and x yields 010001000111. This value is expressed as a decimal number of 1095. That is, the Morton code value of the point having coordinates (5, 9, 1) is 1095. The attribute transformer 40007 may order the points based on the Morton code values and perform NNS through a depth-first traversal process. After the attribute transformation operation, the K-D tree or the Morton code is used when the NNS is needed in another transformation process for attribute coding.

As shown in the figure, the transformed attributes are input to the RAHT transformer 40008 and/or the LOD generator 40009.

The RAHT transformer 40008 according to the embodiments performs RAHT coding for predicting attribute information based on the reconstructed geometry information. For example, the RAHT transformer 40008 may predict attribute information of a node at a higher level in the octree based on the attribute information associated with a node at a lower level in the octree.

The LOD generator 40009 according to the embodiments generates a level of detail (LOD) to perform prediction transform coding. The LOD according to the embodiments is a degree of detail of point cloud content. As the LOD value decrease, it indicates that the detail of the point cloud content is degraded. As the LOD value increases, it indicates that the detail of the point cloud content is enhanced. Points may be classified by the LOD.

The lifting transformer 40010 according to the embodiments performs lifting transform coding of transforming the attributes a point cloud based on weights. As described above, lifting transform coding may be optionally applied.

The coefficient quantizer 40011 according to the embodiments quantizes the attribute-coded attributes based on coefficients.

The arithmetic encoder 40012 according to the embodiments encodes the quantized attributes based on arithmetic coding.

Although not shown in the figure, the elements of the point cloud encoder of FIG. 4 may be implemented by hardware including one or more processors or integrated circuits configured to communicate with one or more memories included in the point cloud providing apparatus, software, firmware, or a combination thereof. The one or more processors may perform at least one of the operations and/or functions of the elements of the point cloud encoder of FIG. 4 described above. Additionally, the one or more processors may operate or execute a set of software programs and/or instructions for performing the operations and/or functions of the elements of the point cloud encoder of FIG. 4. The one or more memories according to the embodiments may include a high speed random access memory, or include a non-volatile memory (e.g., one or more magnetic disk storage devices, flash memory devices, or other non-volatile solid-state memory devices).

Figure 5:
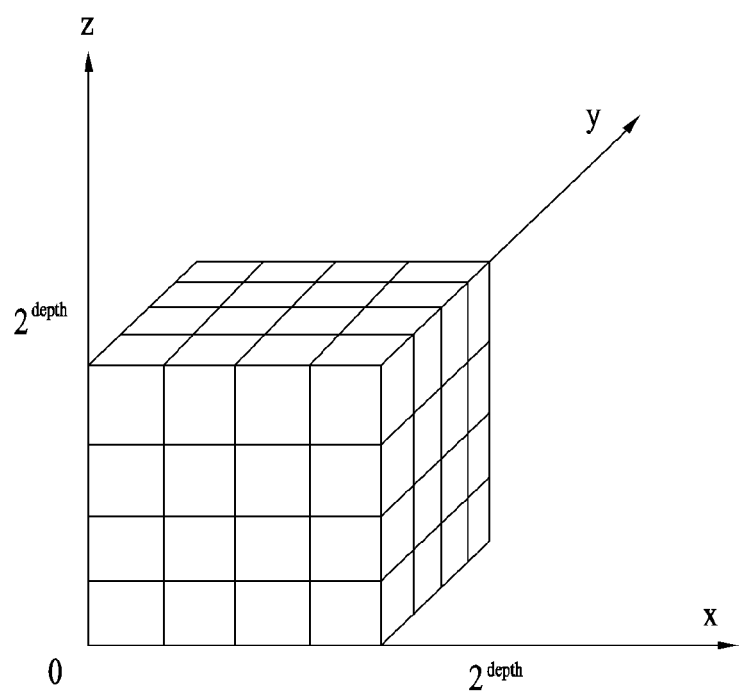
FIG. 5 shows an example of voxels according to embodiments.

FIG. 5 shows an example of voxels according to embodiments.

FIG. 5 shows voxels positioned in a 3D space represented by a coordinate system composed of three axes, which are the X-axis, the Y-axis, and the Z-axis. As described with reference to FIG. 4, the point cloud encoder (e.g., the quantizer 40001) may perform voxelization. Voxel refers to a 3D cubic space generated when a 3D space is divided into units (unit=1.0) based on the axes representing the 3D space (e.g., X-axis, Y-axis, and Z-axis). FIG. 5 shows an example of voxels generated through an octree structure in which a cubical axis-aligned bounding box defined by two poles (0, 0, 0) and (2d, 2d, 2d) is recursively subdivided. One voxel includes at least one point. The spatial coordinates of a voxel may be estimated from the positional relationship with a voxel group. As described above, a voxel has an attribute (such as color or reflectance) like pixels of a 2D image/ video. The details of the voxel are the same as those described with reference to FIG. 4, and therefore a description thereof is omitted.

FIG. 6 shows an example of an octree and occupancy code according to embodiments.

As described with reference to FIGS. 1 to 4, the point cloud content providing system (point cloud video encoder 10002) or the point cloud encoder (for example, the octree analyzer 40002) performs octree geometry coding (or octree coding) based on an octree structure to efficiently manage the region and/or position of the voxel.

The upper part of FIG. 6 shows an octree structure. The 3D space of the point cloud content according to the embodiments is represented by axes (e.g., X-axis, Y-axis, and Z-axis) of the coordinate system. The octree structure is created by recursive subdividing of a cubical axis-aligned bounding box defined by two poles (0, 0, 0) and ($2^d$, $2^d$, $2^d$). Here, $2^d$ may be set to a value constituting the smallest bounding box surrounding all points of the point cloud content (or point cloud video). Here, d denotes the depth of the octree. The value of d is determined in the following equation. In the following equation, ($x^{int}_n$, $y^{int}_n$, $z^{int}_n$) denotes the positions (or position values) of quantized points.

$$d = \text{Ceil}(\text{Log } 2(\text{Max}(x^{int}_n, y^{int}_n, t^{int}_n, n=1, \ldots, N)+1))$$

As shown in the middle of the upper part of FIG. 6, the entire 3D space may be divided into eight spaces according to partition. Each divided space is represented by a cube with six faces. As shown in the upper right of FIG. 6, each of the eight spaces is divided again based on the axes of the coordinate system (e.g., X-axis, Y-axis, and Z-axis). Accordingly, each space is divided into eight smaller spaces. The divided smaller space is also represented by a cube with six faces. This partitioning scheme is applied until the leaf node of the octree becomes a voxel.

The lower part of FIG. 6 shows an octree occupancy code. The occupancy code of the octree is generated to indicate whether each of the eight divided spaces generated by dividing one space contains at least one point. Accordingly, a single occupancy code is represented by eight child nodes. Each child node represents the occupancy of a divided space, and the child node has a value in 1 bit. Accordingly, the occupancy code is represented as an 8-bit code. That is, when at least one point is contained in the space corresponding to a child node, the node is assigned a value of 1. When no point is contained in the space corresponding to the child node (the space is empty), the node is assigned a value of 0. Since the occupancy code shown in FIG. 6 is 00100001, it indicates that the spaces corresponding to the third child node and the eighth child node among the eight child nodes each contain at least one point. As shown in the figure, each of the third child node and the eighth child node has eight child nodes, and the child nodes are represented by an 8-bit occupancy code. The figure shows that the occupancy code of the third child node is 10000111, and the occupancy code of the eighth child node is 01001111. The point cloud encoder (for example, the arithmetic encoder 40004) according to the embodiments may perform entropy encoding on the occupancy codes. In order to increase the compression efficiency, the point cloud encoder may perform intra/inter-coding on the occupancy codes. The reception device (for example, the reception device 10004 or the point cloud video decoder 10006) according to the embodiments reconstructs the octree based on the occupancy codes.

The point cloud encoder (for example, the point cloud encoder of FIG. 4 or the octree analyzer 40002) according to the embodiments may perform voxelization and octree coding to store the positions of points. However, points are not always evenly distributed in the 3D space, and accordingly there may be a specific region in which fewer points are present. Accordingly, it is inefficient to perform voxelization for the entire 3D space. For example, when a specific region contains few points, voxelization does not need to be performed in the specific region.

Accordingly, for the above-described specific region (or a node other than the leaf node of the octree), the point cloud encoder according to the embodiments may skip voxelization and perform direct coding to directly code the positions of points included in the specific region. The coordinates of a direct coding point according to the embodiments are referred to as direct coding mode (DCM). The point cloud encoder according to the embodiments may also perform trisoup geometry encoding, which is to reconstruct the positions of the points in the specific region (or node) based on voxels, based on a surface model. The trisoup geometry encoding is geometry encoding that represents an object as a series of triangular meshes. Accordingly, the point cloud decoder may generate a point cloud from the mesh surface. The direct coding and trisoup geometry encoding according to the embodiments may be selectively performed. In addition, the direct coding and trisoup geometry encoding according to the embodiments may be performed in combination with octree geometry coding (or octree coding).

To perform direct coding, the option to use the direct mode for applying direct coding should be activated. A node to which direct coding is to be applied is not a leaf node, and points less than a threshold should be present within a specific node. In addition, the total number of points to which direct coding is to be applied should not exceed a preset threshold. When the conditions above are satisfied, the point cloud encoder (or the arithmetic encoder 40004) according to the embodiments may perform entropy coding on the positions (or position values) of the points.

The point cloud encoder (for example, the surface approximation analyzer 40003) according to the embodiments may determine a specific level of the octree (a level less than the depth d of the octree), and the surface model may be used staring with that level to perform trisoup geometry encoding to reconstruct the positions of points in the region of the node based on voxels (Trisoup mode). The point cloud encoder according to the embodiments may specify a level at which trisoup geometry encoding is to be applied. For example, when the specific level is equal to the depth of the octree, the point cloud encoder does not operate in the trisoup mode. In other words, the point cloud encoder according to the embodiments may operate in the trisoup mode only when the specified level is less than the value of depth of the octree. The 3D cube region of the nodes at the specified level according to the embodiments is called a block. One block may include one or more voxels. The block or voxel may correspond to a brick. Geometry is represented as a surface within each block. The surface according to embodiments may intersect with each edge of a block at most once.

One block has 12 edges, and accordingly there are at least 12 intersections in one block. Each intersection is called a vertex (or apex). A vertex present along an edge is detected when there is at least one occupied voxel adjacent to the edge among all blocks sharing the edge. The occupied voxel according to the embodiments refers to a voxel containing a point. The position of the vertex detected along the edge is the average position along the edge of all voxels adjacent to the edge among all blocks sharing the edge.

Once the vertex is detected, the point cloud encoder according to the embodiments may perform entropy encoding on the starting point (x, y, z) of the edge, the direction vector (Δx, Δy, Δz) of the edge, and the vertex position value (relative position value within the edge). When the trisoup geometry encoding is applied, the point cloud encoder according to the embodiments (for example, the geometry reconstructor 40005) may generate restored geometry (reconstructed geometry) by performing the triangle reconstruction, up-sampling, and voxelization processes.

The vertices positioned at the edge of the block determine a surface that passes through the block. The surface according to the embodiments is a non-planar polygon. In the triangle reconstruction process, a surface represented by a triangle is reconstructed based on the starting point of the edge, the direction vector of the edge, and the position values of the vertices. The triangle reconstruction process is performed by: i) calculating the centroid value of each vertex, ii) subtracting the center value from each vertex value, and iii) estimating the sum of the squares of the values obtained by the subtraction.

i) $\begin{bmatrix} \mu_x \\ \mu_y \\ \mu_z \end{bmatrix} = \frac{1}{n} \sum_{i=1}^{n} \begin{bmatrix} x_i \\ y_i \\ z_i \end{bmatrix}$ ii) $\begin{bmatrix} \bar{x}_i \\ \bar{y}_i \\ \bar{z}_i \end{bmatrix} = \begin{bmatrix} x_i \\ y_i \\ z_i \end{bmatrix} - \begin{bmatrix} \mu_x \\ \mu_y \\ \mu_z \end{bmatrix}$ iii) $\begin{bmatrix} \sigma_x^2 \\ \sigma_y^2 \\ \sigma_z^2 \end{bmatrix} = \sum_{i=1}^{n} \begin{bmatrix} \bar{x}_i^2 \\ \bar{y}_i^2 \\ \bar{z}_i^2 \end{bmatrix}$ The minimum value of the sum is estimated, and the projection process is performed according to the axis with the minimum value. For example, when the element x is the minimum, each vertex is projected on the x-axis with respect to the center of the block, and projected on the (y, z) plane. When the values obtained through projection on the (y, z) plane are (ai, bi), the value of θ is estimated through a tan2(bi, ai), and the vertices are ordered based on the value of θ. The table below shows a combination of vertices for creating a triangle according to the number of the vertices. The vertices are ordered from 1 to n. The table below shows that for four vertices, two triangles may be constructed according to combinations of vertices. The first triangle may consist of vertices 1, 2, and 3 among the ordered vertices, and the second triangle may consist of vertices 3, 4, and 1 among the ordered vertices.

TABLE 2-1

Triangles formed from vertices ordered 1, . . . , n

| n | triangles |
|---|---|
| 3 | (1, 2, 3) |
| 4 | (1, 2, 3), (3, 4, 1) |
| 5 | (1, 2, 3), (3, 4, 5), (5, 1, 3) |
| 6 | (1, 2, 3), (3, 4, 5), (5, 6, 1), (1, 3, 5) |
| 7 | (1, 2, 3), (3, 4, 5), (5, 6, 7), (7, 1, 3), (3, 5, 7) |
| 8 | (1, 2, 3), (3, 4, 5), (5, 6, 7), (7, 8, 1), (1, 3, 5), (5, 7, 1) |
| 9 | (1, 2, 3), (3, 4, 5), (5, 6, 7), (7, 8, 9), (9, 1, 3), (3, 5, 7), (7, 9, 3) |
| 10 | (1, 2, 3), (3, 4, 5), (5, 6, 7), (7, 8, 9), (9, 10, 1), (1, 3, 5), (5, 7, 9), (9, 1, 5) |
| 11 | (1, 2, 3), (3, 4, 5), (5, 6, 7), (7, 8, 9), (9, 10, 11), (11, 1, 3), (3, 5, 7), (7, 9, 11), (11, 3, 7) |
| 12 | (1, 2, 3), (3, 4, 5), (5, 6, 7), (7, 8, 9), (9, 10, 11), (11, 12, 1), (1, 3, 5), (5, 7, 9), (9, 11, 1), (1, 5, 9) |

The upsampling process is performed to add points in the middle along the edge of the triangle and perform voxelization. The added points are generated based on the upsampling factor and the width of the block. The added points are called refined vertices. The point cloud encoder according to the embodiments may voxelize the refined vertices. In addition, the point cloud encoder may perform attribute encoding based on the voxelized positions (or position values).

FIG. 7 shows an example of a neighbor node pattern according to embodiments.

In order to increase the compression efficiency of the point cloud video, the point cloud encoder according to the embodiments may perform entropy coding based on context adaptive arithmetic coding.

As described with reference to FIGS. 1 to 6, the point cloud content providing system or the point cloud encoder (for example, the point cloud video encoder 10002, the point cloud encoder or arithmetic encoder 40004 of FIG. 4) may perform entropy coding on the occupancy code immediately. In addition, the point cloud content providing system or the point cloud encoder may perform entropy encoding (intra encoding) based on the occupancy code of the current node and the occupancy of neighboring nodes, or perform entropy encoding (inter encoding) based on the occupancy code of the previous frame. A frame according to embodiments represents a set of point cloud videos generated at the same time. The compression efficiency of intra encoding/inter encoding according to the embodiments may depend on the number of neighboring nodes that are referenced. When the bits increase, the operation becomes complicated, but the encoding may be biased to one side, which may increase the compression efficiency. For example, when a 3-bit context is given, coding needs to be performed using $2^3=8$ methods. The part divided for coding affects the complexity of implementation. Accordingly, it is necessary to meet an appropriate level of compression efficiency and complexity.

FIG. 7 illustrates a process of obtaining an occupancy pattern based on the occupancy of neighbor nodes. The point cloud encoder according to the embodiments determines occupancy of neighbor nodes of each node of the octree and obtains a value of a neighbor pattern. The neighbor node pattern is used to infer the occupancy pattern of the node. The left part of FIG. 7 shows a cube corresponding to a node (a cube positioned in the middle) and six cubes (neighbor nodes) sharing at least one face with the cube. The nodes shown in the figure are nodes of the same depth. The numbers shown in the figure represent weights (1, 2, 4, 8, 16, and 32) associated with the six nodes, respectively. The weights are assigned sequentially according to the positions of neighboring nodes.

The right part of FIG. 7 shows neighbor node pattern values. A neighbor node pattern value is the sum of values multiplied by the weight of an occupied neighbor node (a neighbor node having a point). Accordingly, the neighbor node pattern values are 0 to 63. When the neighbor node pattern value is 0, it indicates that there is no node having a point (no occupied node) among the neighbor nodes of the node. When the neighbor node pattern value is 63, it indicates that all neighbor nodes are occupied nodes. As shown in the figure, since neighbor nodes to which weights 1, 2, 4, and 8 are assigned are occupied nodes, the neighbor node pattern value is 15, the sum of 1, 2, 4, and 8. The point cloud encoder may perform coding according to the neighbor node pattern value (for example, when the neighbor node pattern value is 63, 64 kinds of coding may be performed). According to embodiments, the point cloud encoder may reduce coding complexity by changing a neighbor node pattern value (for example, based on a table by which 64 is changed to 10 or 6).

Figure 8:
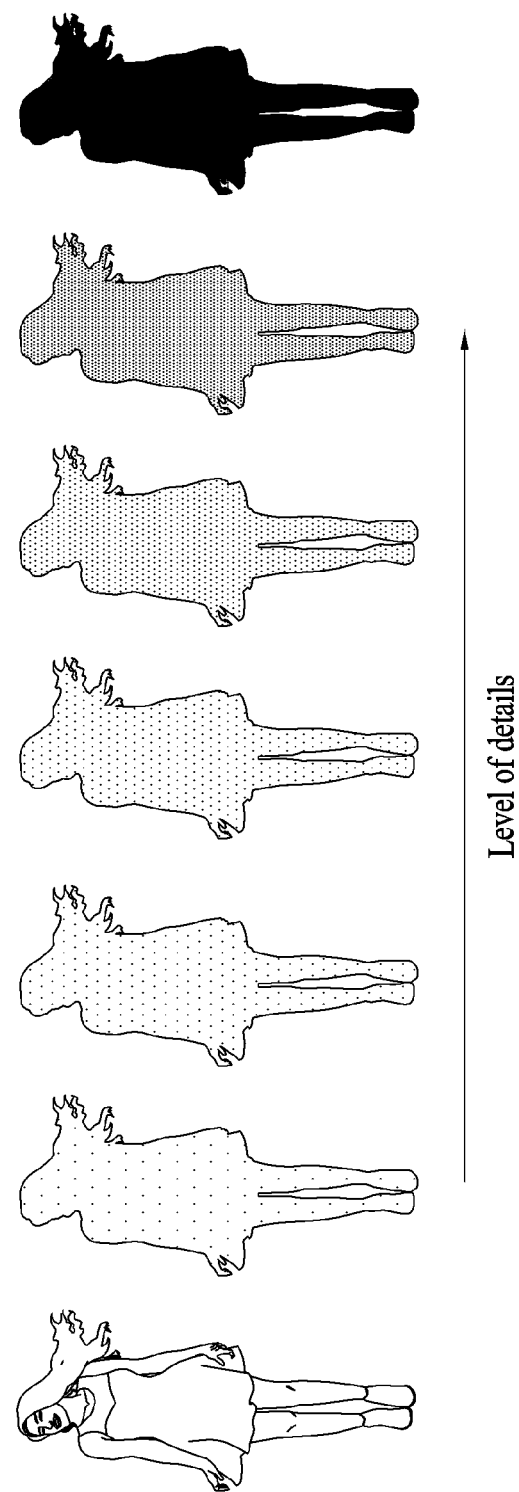
FIG. 8 illustrates an example of point configuration in each LOD according to embodiments.

FIG. 8 illustrates an example of point configuration in each LOD according to embodiments.

As described with reference to FIGS. 1 to 7, encoded geometry is reconstructed (decompressed) before attribute encoding is performed. When direct coding is applied, the geometry reconstruction operation may include changing the placement of direct coded points (e.g., placing the direct coded points in front of the point cloud data). When trisoup geometry encoding is applied, the geometry reconstruction process is performed through triangle reconstruction, up-sampling, and voxelization. Since the attribute depends on the geometry, attribute encoding is performed based on the reconstructed geometry.

The point cloud encoder (for example, the LOD generator 40009) may classify (reorganize) points by LOD. The figure shows the point cloud content corresponding to LODs. The leftmost picture in the figure represents original point cloud content. The second picture from the left of the figure represents distribution of the points in the lowest LOD, and the rightmost picture in the figure represents distribution of the points in the highest LOD. That is, the points in the lowest LOD are sparsely distributed, and the points in the highest LOD are densely distributed. That is, as the LOD rises in the direction pointed by the arrow indicated at the bottom of the figure, the space (or distance) between points is narrowed.

Figure 9:
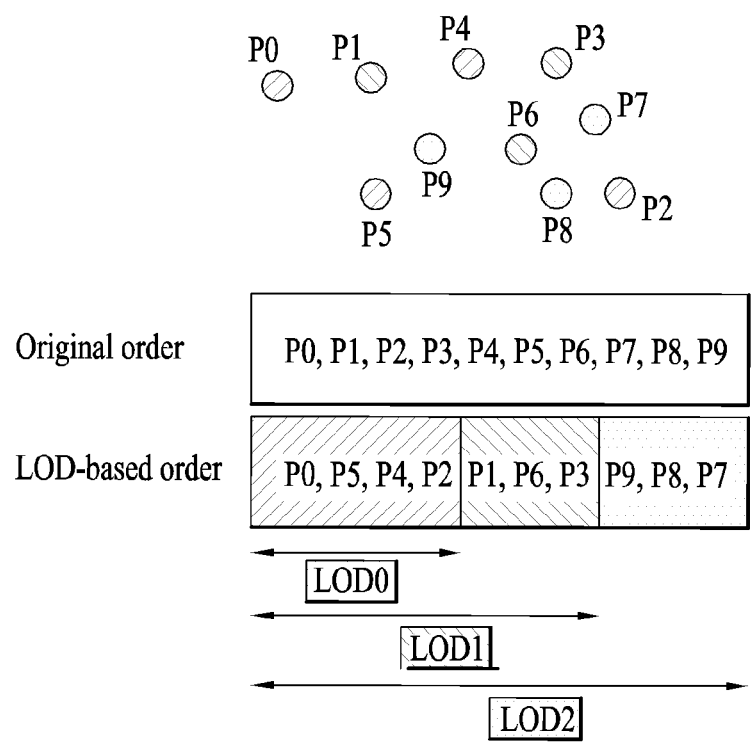
FIG. 9 illustrates an example of point configuration in each LOD according to embodiments.

FIG. 9 illustrates an example of point configuration for each LOD according to embodiments.

As described with reference to FIGS. 1 to 8, the point cloud content providing system, or the point cloud encoder (for example, the point cloud video encoder 10002, the point cloud encoder of FIG. 4, or the LOD generator 40009) may generates an LOD. The LOD is generated by reorganizing the points into a set of refinement levels according to a set LOD distance value (or a set of Euclidean distances). The LOD generation process is performed not only by the point cloud encoder, but also by the point cloud decoder.

The upper part of FIG. 9 shows examples (P0 to P9) of points of the point cloud content distributed in a 3D space. In FIG. 9, the original order represents the order of points P0 to P9 before LOD generation. In FIG. 9, the LOD based order represents the order of points according to the LOD generation. Points are reorganized by LOD. Also, a high LOD contains the points belonging to lower LODs. As shown in FIG. 9, LOD0 contains P0, P5, P4 and P2. LOD1 contains the points of LOD0, P1, P6 and P3. LOD2 contains the points of LOD0, the points of LOD1, P9, P8 and P7.

As described with reference to FIG. 4, the point cloud encoder according to the embodiments may perform prediction transform coding, lifting transform coding, and RAHT transform coding selectively or in combination.

The point cloud encoder according to the embodiments may generate a predictor for points to perform prediction transform coding for setting a predicted attribute (or predicted attribute value) of each point. That is, N predictors may be generated for N points. The predictor according to the embodiments may calculate a weight (=1/distance) based on the LOD value of each point, indexing information about neighboring points present within a set distance for each LOD, and a distance to the neighboring points.

The predicted attribute (or attribute value) according to the embodiments is set to the average of values obtained by multiplying the attributes (or attribute values) (e.g., color, reflectance, etc.) of neighbor points set in the predictor of each point by a weight (or weight value) calculated based on the distance to each neighbor point. The point cloud encoder according to the embodiments (for example, the coefficient quantizer 40011) may quantize and inversely quantize the residuals (which may be called residual attributes, residual attribute values, or attribute prediction residuals) obtained by subtracting a predicted attribute (attribute value) from the attribute (attribute value) of each point. The quantization process is configured as shown in the following table.

TABLE

Attribute prediction residuals quantization pseudo code

```
int PCCQuantization(int value, int quantStep) {
   if( value >=0) {
       return floor(value / quantStep + 1.0 / 3.0);
   } else {
       return -floor(-value / quantStep + 1.0 / 3.0);
   }
}
```

TABLE

Attribute prediction residuals inverse quantization pseudo code

```
int PCCInverseQuantization(int value, int quantStep) {
   if( quantStep ==0) {
       return value;
   } else {
       return value * quantStep;
   }
}
```

When the predictor of each point has neighbor points, the point cloud encoder (e.g., the arithmetic encoder 40012) according to the embodiments may perform entropy coding on the quantized and inversely quantized residual values as described above. When the predictor of each point has no neighbor point, the point cloud encoder according to the embodiments (for example, the arithmetic encoder 40012) may perform entropy coding on the attributes of the corresponding point without performing the above-described operation.

The point cloud encoder according to the embodiments (for example, the lifting transformer 40010) may generate a predictor of each point, set the calculated LOD and register neighbor points in the predictor, and set weights according to the distances to neighbor points to perform lifting transform coding. The lifting transform coding according to the embodiments is similar to the above-described prediction transform coding, but differs therefrom in that weights are cumulatively applied to attribute values. The process of cumulatively applying weights to the attribute values according to embodiments is configured as follows.

1) Create an array Quantization Weight (QW) for storing the weight value of each point. The initial value of all elements of QW is 1.0. Multiply the QW values of the predictor indexes of the neighbor nodes registered in the predictor by the weight of the predictor of the current point, and add the values obtained by the multiplication.

2) Lift prediction process: Subtract the value obtained by multiplying the attribute value of the point by the weight from the present attribute value to calculate a predicted attribute value.

3) Create temporary arrays called updateweight and update and initialize the temporary arrays to zero.

4) Cumulatively add the weights calculated by multiplying the weights calculated for all predictors by a weight stored in the QW corresponding to a predictor index to the updateweight array as indexes of neighbor nodes. Cumulatively add, to the update array, a value obtained by multiplying the attribute value of the index of a neighbor node by the calculated weight.

5) Lift update process: Divide the attribute values of the update array for all predictors by the weight value of the updateweight array of the predictor index, and add the present attribute value to the values obtained by the division.

6) Calculate predicted attributes by multiplying the attribute values updated through the lift update process by the weight updated through the lift prediction process (stored in the QW) for all predictors. The point cloud encoder (e.g., coefficient quantizer 40011) according to the embodiments quantizes the predicted attribute values. In addition, the point cloud encoder (e.g., the arithmetic encoder 40012) performs entropy coding on the quantized attribute values.

The point cloud encoder (for example, the RAHT transformer 40008) according to the embodiments may perform RAHT transform coding in which attributes of nodes of a higher level are predicted using the attributes associated with nodes of a lower level in the octree. RAHT transform coding is an example of attribute intra coding through an octree backward scan. The point cloud encoder according to the embodiments scans the entire region from the voxel and repeats the merging process of merging the voxels into a larger block at each step until the root node is reached. The merging process according to the embodiments is performed only on the occupied nodes. The merging process is not performed on the empty node. The merging process is performed on an upper node immediately above the empty node.

The equation below represents a RAHT transformation matrix. In the equation, $g_{l_{x,y,z}}$ denotes the average attribute value of voxels at level l. $g_{l_{x,y,z}}$ may be calculated based on $g_{l+1_{2x,y,z}}$ and $g_{l+1_{2x+1,y,z}}$. The weights for $g_{l_{2x,y,z}}$ and $g_{l_{2x+1,y,z}}$ are $w1=w_{l_{2x,y,z}}$ and $w2=w_{l_{2x+1,y,z}}$.

$$\begin{bmatrix} g_{l-1_{x,y,z}} \\ h_{l-1_{x,y,z}} \end{bmatrix} = T_{w1w2} \begin{bmatrix} g_{l_{2x,y,z}} \\ g_{l_{2x+1,y,z}} \end{bmatrix}$$

$$T_{w1w2} = \frac{1}{\sqrt{w1+w2}} \begin{bmatrix} \sqrt{w1} & \sqrt{w2} \\ -\sqrt{w2} & \sqrt{w1} \end{bmatrix}$$

Here, $g_{l-1_{x,y,z}}$ is a low-pass value and is used in the merging process at the next higher level. $h_{l-1_{x,y,z}}$ denotes high-pass coefficients. The high-pass coefficients at each step are quantized and subjected to entropy coding (for example, encoding by the arithmetic encoder 400012). The weights are calculated as $w_{l-1_{x,y,z}} = w_{l_{2x,y,z}} + w_{l_{2x+1,y,z}}$. The root node is created through the as follows.

$$\begin{bmatrix} gDC \\ h_{0_{0,0,0}} \end{bmatrix} = T_{w1000\ w1001} \begin{bmatrix} g_{1_{0,0,0z}} \\ g_{1_{0,0,1}} \end{bmatrix}$$

The value of gDC is also quantized and subjected to entropy coding like the high-pass coefficients.

Figure 10:
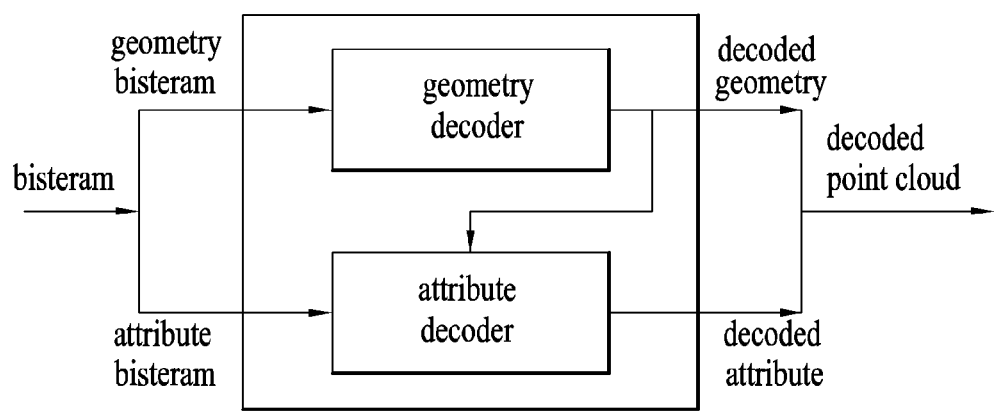
FIG. 10 illustrates a point cloud decoder according to embodiments.

FIG. 10 illustrates a point cloud decoder according to embodiments.

The point cloud decoder illustrated in FIG. 10 is an example of the point cloud video decoder 10006 described in FIG. 1, and may perform the same or similar operations as the operations of the point cloud video decoder 10006 illustrated in FIG. 1. As shown in the figure, the point cloud decoder may receive a geometry bitstream and an attribute bitstream contained in one or more bitstreams. The point cloud decoder includes a geometry decoder and an attribute decoder. The geometry decoder performs geometry decoding on the geometry bitstream and outputs decoded geometry. The attribute decoder performs attribute decoding based on the decoded geometry and the attribute bitstream, and outputs decoded attributes. The decoded geometry and decoded attributes are used to reconstruct point cloud content (a decoded point cloud).

Figure 11:
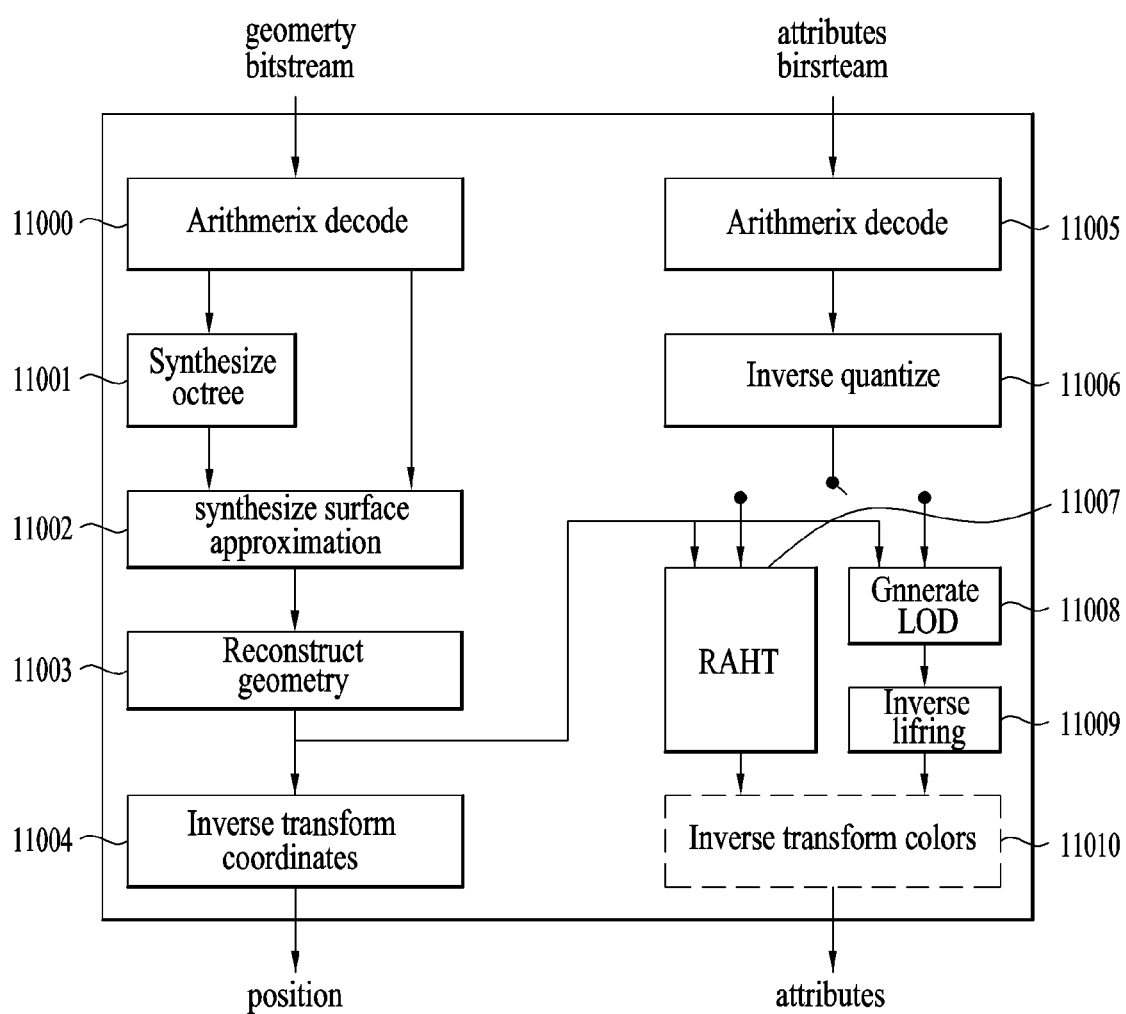
FIG. 11 illustrates a point cloud decoder according to embodiments.

FIG. 11 illustrates a point cloud decoder according to embodiments.

The point cloud decoder illustrated in FIG. 11 is an example of the point cloud decoder illustrated in FIG. 10, and may perform a decoding operation, which is an inverse process of the encoding operation of the point cloud encoder illustrated in FIGS. 1 to 9.

As described with reference to FIGS. 1 and 10, the point cloud decoder may perform geometry decoding and attribute decoding. The geometry decoding is performed before the attribute decoding.

The point cloud decoder according to the embodiments includes an arithmetic decoder (Arithmetic decode) 11000, an octree synthesizer (Synthesize octree) 11001, a surface approximation synthesizer (Synthesize surface approximation) 11002, and a geometry reconstructor (Reconstruct geometry) 11003, a coordinate inverse transformer (Inverse transform coordinates) 11004, an arithmetic decoder (Arithmetic decode) 11005, an inverse quantizer (Inverse quantize) 11006, a RAHT transformer 11007, an LOD generator (Generate LOD) 11008, an inverse lifter (inverse lifting) 11009, and/or a color inverse transformer (Inverse transform colors) 11010.

The arithmetic decoder 11000, the octree synthesizer 11001, the surface approximation synthesizer 11002, and the geometry reconstructor 11003, and the coordinate inverse transformer 11004 may perform geometry decoding. The geometry decoding according to the embodiments may include direct coding and trisoup geometry decoding. The direct coding and trisoup geometry decoding are selectively applied. The geometry decoding is not limited to the above-described example, and is performed as an inverse process of the geometry encoding described with reference to FIGS. 1 to 9.

The arithmetic decoder 11000 according to the embodiments decodes the received geometry bitstream based on the arithmetic coding. The operation of the arithmetic decoder 11000 corresponds to the inverse process of the arithmetic encoder 40004.

The octree synthesizer 11001 according to the embodiments may generate an octree by acquiring an occupancy code from the decoded geometry bitstream (or information on the geometry secured as a result of decoding). The occupancy code is configured as described in detail with reference to FIGS. 1 to 9.

When the trisoup geometry encoding is applied, the surface approximation synthesizer 11002 according to the embodiments may synthesize a surface based on the decoded geometry and/or the generated octree.

The geometry reconstructor 11003 according to the embodiments may regenerate geometry based on the surface and/or the decoded geometry. As described with reference to FIGS. 1 to 9, direct coding and trisoup geometry encoding are selectively applied. Accordingly, the geometry reconstructor 11003 directly imports and adds position information about the points to which direct coding is applied. When the trisoup geometry encoding is applied, the geometry reconstructor 11003 may reconstruct the geometry by performing the reconstruction operations of the geometry reconstructor 40005, for example, triangle reconstruction, up-sampling, and voxelization. Details are the same as those described with reference to FIG. 6, and thus description thereof is omitted. The reconstructed geometry may include a point cloud picture or frame that does not contain attributes.

The coordinate inverse transformer 11004 according to the embodiments may acquire positions of the points by transforming the coordinates based on the reconstructed geometry.

The arithmetic decoder 11005, the inverse quantizer 11006, the RAHT transformer 11007, the LOD generator 11008, the inverse lifter 11009, and/or the color inverse transformer 11010 may perform the attribute decoding described with reference to FIG. 10. The attribute decoding according to the embodiments includes region adaptive hierarchical transform (RAHT) decoding, interpolation-based hierarchical nearest-neighbor prediction (prediction transform) decoding, and interpolation-based hierarchical nearest-neighbor prediction with an update/lifting step (lifting transform) decoding. The three decoding schemes described above may be used selectively, or a combination of one or more decoding schemes may be used. The attribute decoding according to the embodiments is not limited to the above-described example.

The arithmetic decoder 11005 according to the embodiments decodes the attribute bitstream by arithmetic coding.

The inverse quantizer 11006 according to the embodiments inversely quantizes the information about the decoded attribute bitstream or attributes secured as a result of the decoding, and outputs the inversely quantized attributes (or attribute values). The inverse quantization may be selectively applied based on the attribute encoding of the point cloud encoder.

According to embodiments, the RAHT transformer 11007, the LOD generator 11008, and/or the inverse lifter 11009 may process the reconstructed geometry and the inversely quantized attributes. As described above, the RAHT transformer 11007, the LOD generator 11008, and/or the inverse lifter 11009 may selectively perform a decoding operation corresponding to the encoding of the point cloud encoder.

The color inverse transformer 11010 according to the embodiments performs inverse transform coding to inversely transform a color value (or texture) included in the decoded attributes. The operation of the color inverse transformer 11010 may be selectively performed based on the operation of the color transformer 40006 of the point cloud encoder.

Although not shown in the figure, the elements of the point cloud decoder of FIG. 11 may be implemented by hardware including one or more processors or integrated circuits configured to communicate with one or more memories included in the point cloud providing apparatus, software, firmware, or a combination thereof. The one or more processors may perform at least one or more of the operations and/or functions of the elements of the point cloud decoder of FIG. 11 described above. Additionally, the one or more processors may operate or execute a set of software programs and/or instructions for performing the operations and/or functions of the elements of the point cloud decoder of FIG. 11.

Figure 12:
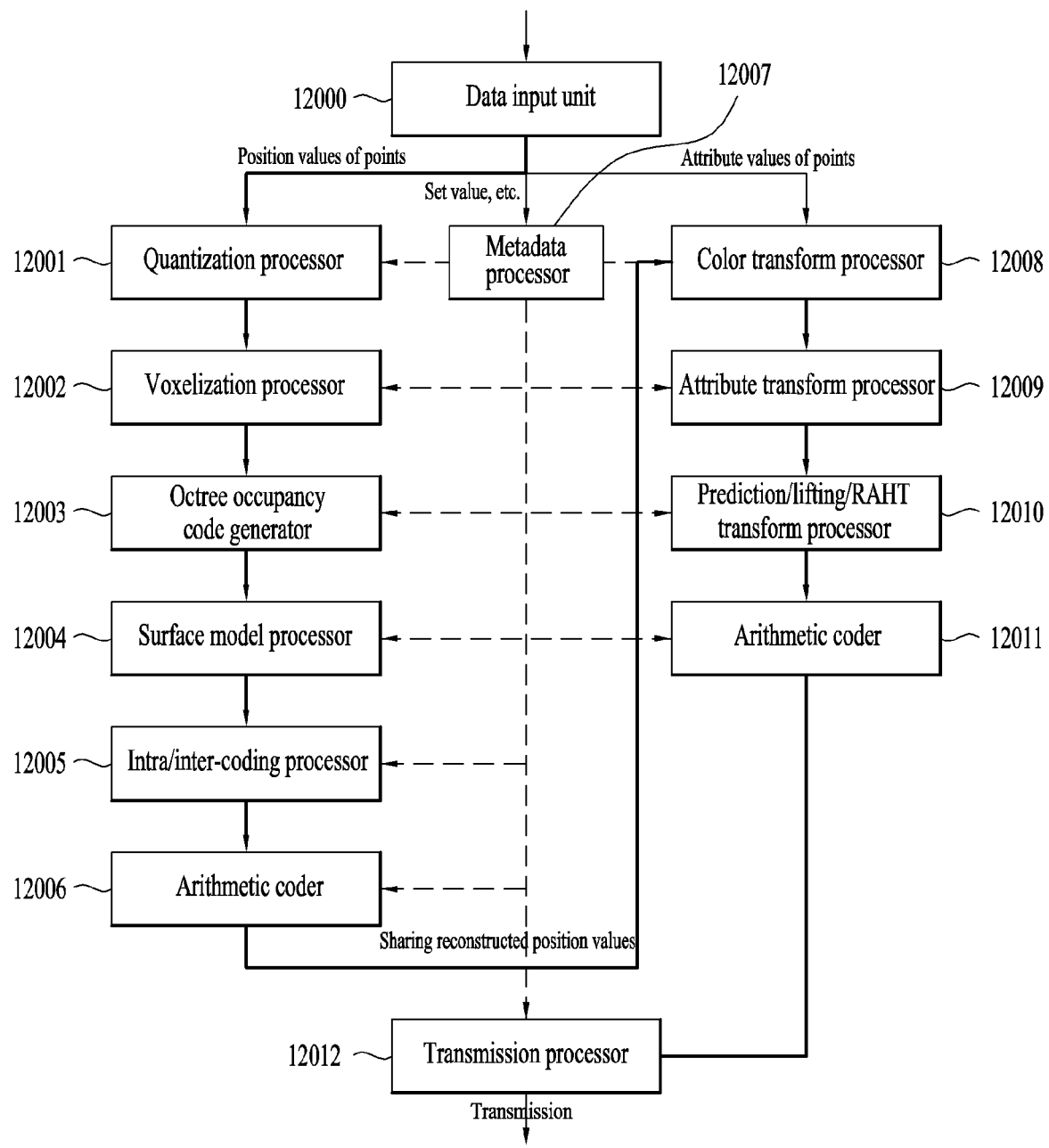
FIG. 12 illustrates a transmission device according to embodiments.

FIG. 12 illustrates a transmission device according to embodiments.

The transmission device shown in FIG. 12 is an example of the transmission device 10000 of FIG. 1 (or the point cloud encoder of FIG. 4). The transmission device illustrated in FIG. 12 may perform one or more of the operations and methods the same as or similar to those of the point cloud encoder described with reference to FIGS. 1 to 9. The transmission device according to the embodiments may include a data input unit 12000, a quantization processor 12001, a voxelization processor 12002, an octree occupancy code generator 12003, a surface model processor 12004, an intra/inter-coding processor 12005, an arithmetic coder 12006, a metadata processor 12007, a color transform processor 12008, an attribute transform processor 12009, a prediction/lifting/RAHT transform processor 12010, an arithmetic coder 12011 and/or a transmission processor 12012.

The data input unit 12000 according to the embodiments receives or acquires point cloud data. The data input unit 12000 may perform an operation and/or acquisition method the same as or similar to the operation and/or acquisition method of the point cloud video acquirer 10001 (or the acquisition process 20000 described with reference to FIG. 2).

The data input unit 12000, the quantization processor 12001, the voxelization processor 12002, the octree occupancy code generator 12003, the surface model processor 12004, the intra/inter-coding processor 12005, and the arithmetic coder 12006 perform geometry encoding. The geometry encoding according to the embodiments is the same as or similar to the geometry encoding described with reference to FIGS. 1 to 9, and thus a detailed description thereof is omitted.

The quantization processor 12001 according to the embodiments quantizes geometry (e.g., position values of points). The operation and/or quantization of the quantization processor 12001 is the same as or similar to the operation and/or quantization of the quantizer 40001 described with reference to FIG. 4. Details are the same as those described with reference to FIGS. 1 to 9.

The voxelization processor 12002 according to the embodiments voxelizes the quantized position values of the points. The voxelization processor 120002 may perform an operation and/or process the same or similar to the operation and/or the voxelization process of the quantizer 40001 described with reference to FIG. 4. Details are the same as those described with reference to FIGS. 1 to 9.

The octree occupancy code generator 12003 according to the embodiments performs octree coding on the voxelized positions of the points based on an octree structure. The octree occupancy code generator 12003 may generate an occupancy code. The octree occupancy code generator 12003 may perform an operation and/or method the same as or similar to the operation and/or method of the point cloud encoder (or the octree analyzer 40002) described with reference to FIGS. 4 and 6. Details are the same as those described with reference to FIGS. 1 to 9.

The surface model processor 12004 according to the embodiments may perform trisoup geometry encoding based on a surface model to reconstruct the positions of points in a specific region (or node) on a voxel basis. The surface model processor 12004 may perform an operation and/or method the same as or similar to the operation and/or method of the point cloud encoder (for example, the surface approximation analyzer 40003) described with reference to FIG. 4. Details are the same as those described with reference to FIGS. 1 to 9.

The intra/inter-coding processor 12005 according to the embodiments may perform intra/inter-coding on point cloud data. The intra/inter-coding processor 12005 may perform coding the same as or similar to the intra/inter-coding described with reference to FIG. 7. Details are the same as those described with reference to FIG. 7. According to embodiments, the intra/inter-coding processor 12005 may be included in the arithmetic coder 12006.

The arithmetic coder 12006 according to the embodiments performs entropy encoding on an octree of the point cloud data and/or an approximated octree. For example, the encoding scheme includes arithmetic encoding. The arithmetic coder 12006 performs an operation and/or method the same as or similar to the operation and/or method of the arithmetic encoder 40004.

The metadata processor 12007 according to the embodiments processes metadata about the point cloud data, for example, a set value, and provides the same to a necessary processing process such as geometry encoding and/or attribute encoding. Also, the metadata processor 12007 according to the embodiments may generate and/or process signaling information related to the geometry encoding and/or the attribute encoding. The signaling information according to the embodiments may be encoded separately from the geometry encoding and/or the attribute encoding. The signaling information according to the embodiments may be interleaved.

The color transform processor 12008, the attribute transform processor 12009, the prediction/lifting/RAHT transform processor 12010, and the arithmetic coder 12011 perform the attribute encoding. The attribute encoding according to the embodiments is the same as or similar to the attribute encoding described with reference to FIGS. 1 to 9, and thus a detailed description thereof is omitted.

The color transform processor 12008 according to the embodiments performs color transform coding to transform color values included in attributes. The color transform processor 12008 may perform color transform coding based on the reconstructed geometry. The reconstructed geometry is the same as described with reference to FIGS. 1 to 9. Also, it performs an operation and/or method the same as or similar to the operation and/or method of the color transformer 40006 described with reference to FIG. 4 is performed. The detailed description thereof is omitted.

The attribute transform processor 12009 according to the embodiments performs attribute transformation to transform the attributes based on the reconstructed geometry and/or the positions on which geometry encoding is not performed. The attribute transform processor 12009 performs an operation and/or method the same as or similar to the operation and/or method of the attribute transformer 40007 described with reference to FIG. 4. The detailed description thereof is omitted. The prediction/lifting/RAHT transform processor 12010 according to the embodiments may code the transformed attributes by any one or a combination of RAHT coding, prediction transform coding, and lifting transform coding. The prediction/lifting/RAHT transform processor 12010 performs at least one of the operations the same as or similar to the operations of the RAHT transformer 40008, the LOD generator 40009, and the lifting transformer 40010 described with reference to FIG. 4. In addition, the prediction transform coding, the lifting transform coding, and the RAHT transform coding are the same as those described with reference to FIGS. 1 to 9, and thus a detailed description thereof is omitted.

The arithmetic coder 12011 according to the embodiments may encode the coded attributes based on the arithmetic coding. The arithmetic coder 12011 performs an operation and/or method the same as or similar to the operation and/or method of the arithmetic encoder 400012.

The transmission processor 12012 according to the embodiments may transmit each bitstream containing encoded geometry and/or encoded attributes and metadata information, or transmit one bitstream configured with the encoded geometry and/or the encoded attributes and the metadata information. When the encoded geometry and/or the encoded attributes and the metadata information according to the embodiments are configured into one bitstream, the bitstream may include one or more sub-bitstreams. The bitstream according to the embodiments may contain signaling information including a sequence parameter set (SPS) for signaling of a sequence level, a geometry parameter set (GPS) for signaling of geometry information coding, an attribute parameter set (APS) for signaling of attribute information coding, and a tile parameter set (TPS) for signaling of a tile level, and slice data. The slice data may include information about one or more slices. One slice according to embodiments may include one geometry bitstream Geom00 and one or more attribute bitstreams Attr00 and Attr10.

A slice refers to a series of syntax elements representing the entirety or part of a coded point cloud frame.

The TPS according to the embodiments may include information about each tile (for example, coordinate information and height/size information about a bounding box) for one or more tiles. The geometry bitstream may contain a header and a payload. The header of the geometry bitstream according to the embodiments may contain a parameter set identifier (geom_parameter_set_id), a tile identifier (geom_tile_id) and a slice identifier (geom_slice_id) included in the GPS, and information about the data contained in the payload. As described above, the metadata processor 12007 according to the embodiments may generate and/or process the signaling information and transmit the same to the transmission processor 12012. According to embodiments, the elements to perform geometry encoding and the elements to perform attribute encoding may share data/information with each other as indicated by dotted lines. The transmission processor 12012 according to the embodiments may perform an operation and/or transmission method the same as or similar to the operation and/or transmission method of the transmitter 10003. Details are the same as those described with reference to FIGS. 1 and 2, and thus a description thereof is omitted.

Figure 13:
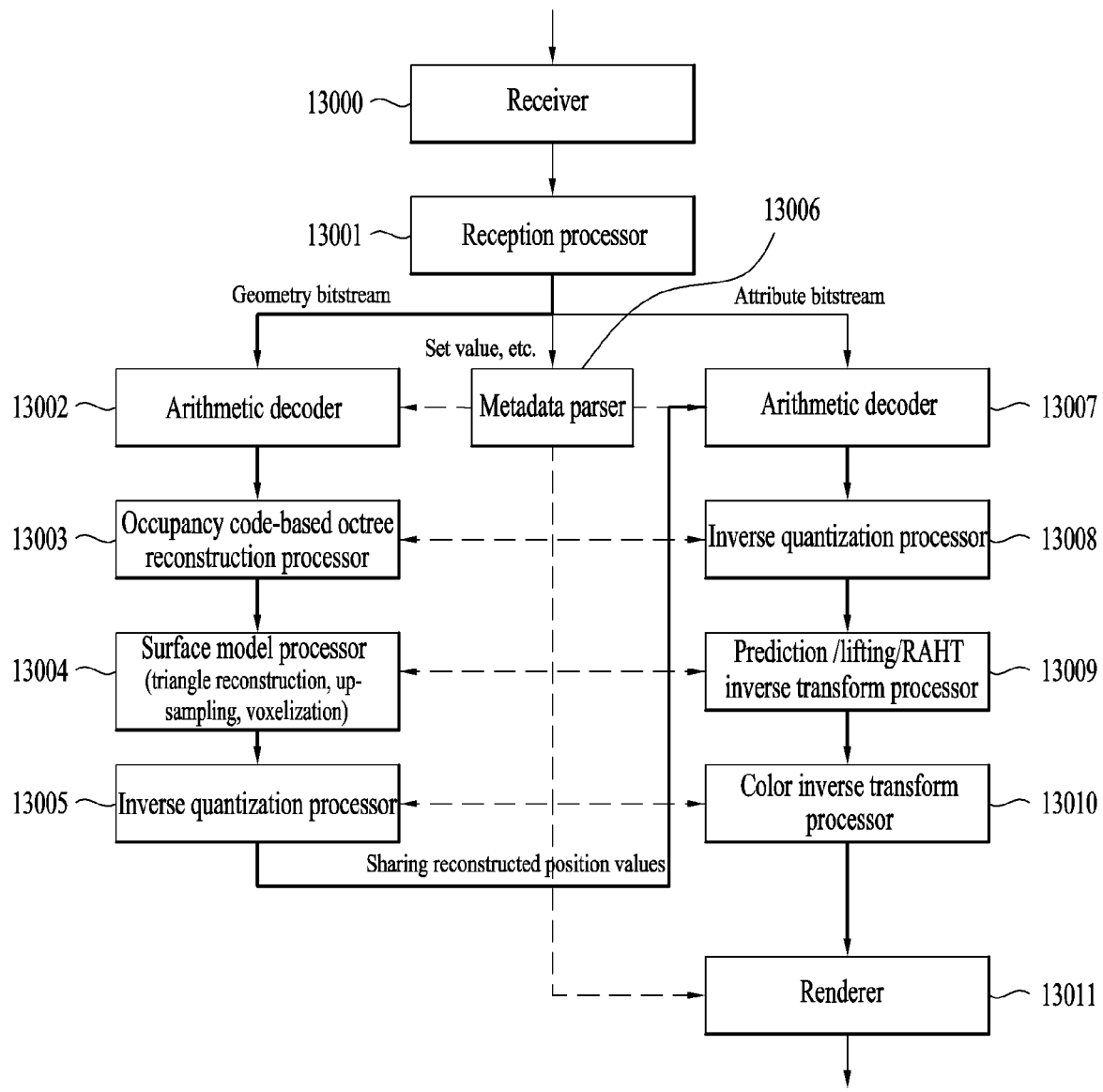
FIG. 13 illustrates a reception device according to embodiments.

FIG. 13 illustrates a reception device according to embodiments.

The reception device illustrated in FIG. 13 is an example of the reception device 10004 of FIG. 1 (or the point cloud decoder of FIGS. 10 and 11). The reception device illustrated in FIG. 13 may perform one or more of the operations and methods the same as or similar to those of the point cloud decoder described with reference to FIGS. 1 to 11.

The reception device according to the embodiment includes a receiver 13000, a reception processor 13001, an arithmetic decoder 13002, an occupancy code-based octree reconstruction processor 13003, a surface model processor (triangle reconstruction, up-sampling, voxelization) 13004, an inverse quantization processor 13005, a metadata parser 13006, an arithmetic decoder 13007, an inverse quantization processor 13008, a prediction/lifting/RAHT inverse transform processor 13009, a color inverse transform processor 13010, and/or a renderer 13011. Each element for decoding according to the embodiments may perform an inverse process of the operation of a corresponding element for encoding according to the embodiments.

The receiver 13000 according to the embodiments receives point cloud data. The receiver 13000 may perform an operation and/or reception method the same as or similar to the operation and/or reception method of the receiver 10005 of FIG. 1. The detailed description thereof is omitted.

The reception processor 13001 according to the embodiments may acquire a geometry bitstream and/or an attribute bitstream from the received data. The reception processor 13001 may be included in the receiver 13000.

The arithmetic decoder 13002, the occupancy code-based octree reconstruction processor 13003, the surface model processor 13004, and the inverse quantization processor 1305 may perform geometry decoding. The geometry decoding according to embodiments is the same as or similar to the geometry decoding described with reference to FIGS. 1 to 10, and thus a detailed description thereof is omitted.

The arithmetic decoder 13002 according to the embodiments may decode the geometry bitstream based on arithmetic coding. The arithmetic decoder 13002 performs an operation and/or coding the same as or similar to the operation and/or coding of the arithmetic decoder 11000.

The occupancy code-based octree reconstruction processor 13003 according to the embodiments may reconstruct an octree by acquiring an occupancy code from the decoded geometry bitstream (or information about the geometry secured as a result of decoding). The occupancy code-based octree reconstruction processor 13003 performs an operation and/or method the same as or similar to the operation and/or octree generation method of the octree synthesizer 11001. When the trisoup geometry encoding is applied, the surface model processor 1302 according to the embodiments may perform trisoup geometry decoding and related geometry reconstruction (for example, triangle reconstruction, up-sampling, voxelization) based on the surface model method. The surface model processor 1302 performs an operation the same as or similar to that of the surface approximation synthesizer 11002 and/or the geometry reconstructor 11003.

The inverse quantization processor 1305 according to the embodiments may inversely quantize the decoded geometry.

The metadata parser 1306 according to the embodiments may parse metadata contained in the received point cloud data, for example, a set value. The metadata parser 1306 may pass the metadata to geometry decoding and/or attribute decoding. The metadata is the same as that described with reference to FIG. 12, and thus a detailed description thereof is omitted.

The arithmetic decoder 13007, the inverse quantization processor 13008, the prediction/lifting/RAHT inverse transform processor 13009 and the color inverse transform processor 13010 perform attribute decoding. The attribute decoding is the same as or similar to the attribute decoding described with reference to FIGS. 1 to 10, and thus a detailed description thereof is omitted.

The arithmetic decoder 13007 according to the embodiments may decode the attribute bitstream by arithmetic coding. The arithmetic decoder 13007 may decode the attribute bitstream based on the reconstructed geometry. The arithmetic decoder 13007 performs an operation and/or coding the same as or similar to the operation and/or coding of the arithmetic decoder 11005.

The inverse quantization processor 13008 according to the embodiments may inversely quantize the decoded attribute bitstream. The inverse quantization processor 13008 performs an operation and/or method the same as or similar to the operation and/or inverse quantization method of the inverse quantizer 11006.

The prediction/lifting/RAHT inverse transformer 13009 according to the embodiments may process the reconstructed geometry and the inversely quantized attributes. The prediction/lifting/RAHT inverse transform processor 1301 performs one or more of operations and/or decoding the same as or similar to the operations and/or decoding of the RAHT transformer 11007, the LOD generator 11008, and/or the inverse lifter 11009. The color inverse transform processor 13010 according to the embodiments performs inverse transform coding to inversely transform color values (or textures) included in the decoded attributes. The color inverse transform processor 13010 performs an operation and/or inverse transform coding the same as or similar to the operation and/or inverse transform coding of the color inverse transformer 11010. The renderer 13011 according to the embodiments may render the point cloud data.

Figure 14:
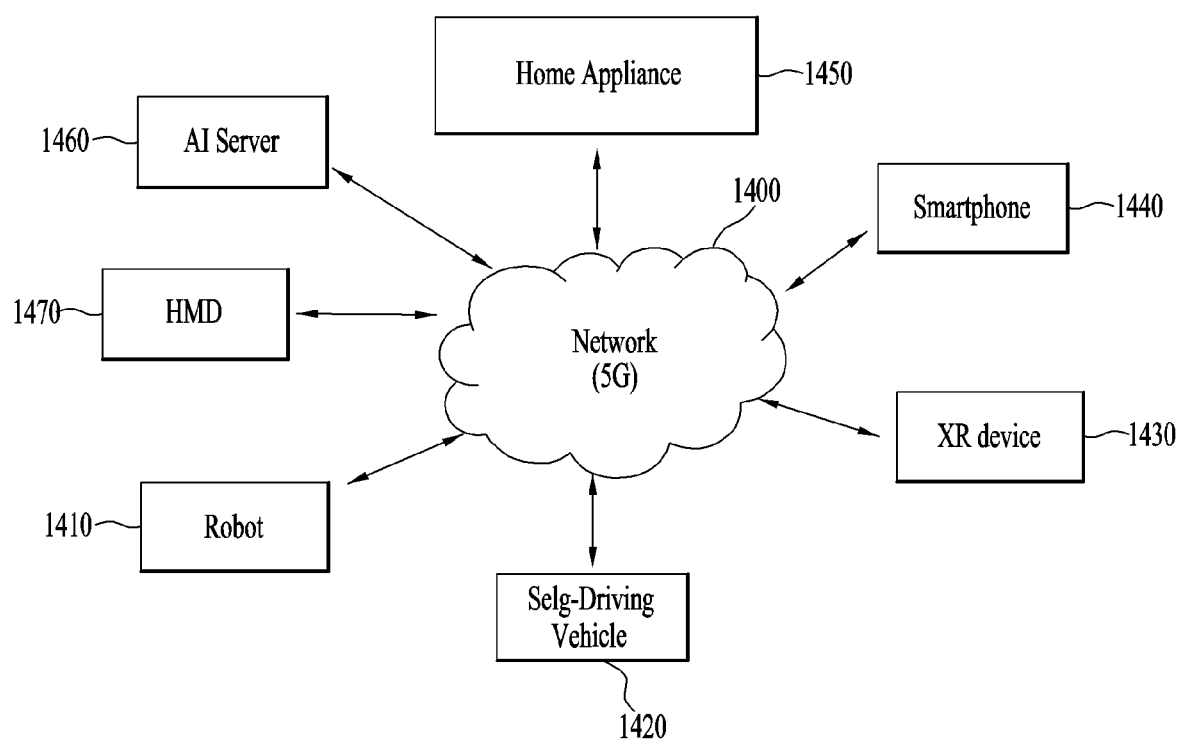
FIG. 14 illustrates an exemplary structure operable in connection with point cloud data transmission/reception methods/devices according to embodiments.

FIG. 14 illustrates an exemplary structure operable in connection with point cloud data transmission/reception methods/devices according to embodiments.

The structure of FIG. 14 represents a configuration in which at least one of a server 1460, a robot 1410, a self-driving vehicle 1420, an XR device 1430, a smartphone 1440, a home appliance 1450, and/or a head-mount display (HMD) 1470 is connected to the cloud network 1400. The robot 1410, the self-driving vehicle 1420, the XR device 1430, the smartphone 1440, or the home appliance 1450 is called a device. Further, the XR device 1430 may correspond to a point cloud data (PCC) device according to embodiments or may be operatively connected to the PCC device.

The cloud network 1400 may represent a network that constitutes part of the cloud computing infrastructure or is present in the cloud computing infrastructure. Here, the cloud network 1400 may be configured using a 3G network, 4G or Long Term Evolution (LTE) network, or a 5G network.

The server 1460 may be connected to at least one of the robot 1410, the self-driving vehicle 1420, the XR device 1430, the smartphone 1440, the home appliance 1450, and/or the HMD 1470 over the cloud network 1400 and may assist in at least a part of the processing of the connected devices 1410 to 1470.

The HMD 1470 represents one of the implementation types of the XR device and/or the PCC device according to the embodiments. The HMD type device according to the embodiments includes a communication unit, a control unit, a memory, an I/O unit, a sensor unit, and a power supply unit.

Hereinafter, various embodiments of the devices 1410 to 1450 to which the above-described technology is applied will be described. The devices 1410 to 1450 illustrated in FIG. 14 may be operatively connected/coupled to a point cloud data transmission device and reception according to the above-described embodiments.

<PCC+XR>

The XR/PCC device 1430 may employ PCC technology and/or XR (AR+VR) technology, and may be implemented as an HMD, a head-up display (HUD) provided in a vehicle, a television, a mobile phone, a smartphone, a computer, a wearable device, a home appliance, a digital signage, a vehicle, a stationary robot, or a mobile robot.

The XR/PCC device 1430 may analyze 3D point cloud data or image data acquired through various sensors or from an external device and generate position data and attribute data about 3D points. Thereby, the XR/PCC device 1430 may acquire information about the surrounding space or a real object, and render and output an XR object. For example, the XR/PCC device 1430 may match an XR object including auxiliary information about a recognized object with the recognized object and output the matched XR object.

<PCC+Self-driving+XR>

The self-driving vehicle 1420 may be implemented as a mobile robot, a vehicle, an unmanned aerial vehicle, or the like by applying the PCC technology and the XR technology.

The self-driving vehicle 1420 to which the XR/PCC technology is applied may represent a self-driving vehicle provided with means for providing an XR image, or a self-driving vehicle that is a target of control/interaction in the XR image. In particular, the self-driving vehicle 1420 which is a target of control/interaction in the XR image may be distinguished from the XR device 1430 and may be operatively connected thereto.

The self-driving vehicle 1420 having means for providing an XR/PCC image may acquire sensor information from sensors including a camera, and output the generated XR/PCC image based on the acquired sensor information. For example, the self-driving vehicle 1420 may have an HUD and output an XR/PCC image thereto, thereby providing an occupant with an XR/PCC object corresponding to a real object or an object present on the screen.

When the XR/PCC object is output to the HUD, at least a part of the XR/PCC object may be output to overlap the real object to which the occupant's eyes are directed. On the other hand, when the XR/PCC object is output on a display provided inside the self-driving vehicle, at least a part of the XR/PCC object may be output to overlap an object on the screen. For example, the self-driving vehicle 1220 may output XR/PCC objects corresponding to objects such as a road, another vehicle, a traffic light, a traffic sign, a two-wheeled vehicle, a pedestrian, and a building.

The virtual reality (VR) technology, the augmented reality (AR) technology, the mixed reality (MR) technology and/or the point cloud compression (PCC) technology according to the embodiments are applicable to various devices.

In other words, the VR technology is a display technology that provides only CG images of real-world objects, backgrounds, and the like. On the other hand, the AR technology refers to a technology that shows a virtually created CG image on the image of a real object. The MR technology is similar to the AR technology described above in that virtual objects to be shown are mixed and combined with the real world. However, the MR technology differs from the AR technology in that the AR technology makes a clear distinction between a real object and a virtual object created as a CG image and uses virtual objects as complementary objects for real objects, whereas the MR technology treats virtual objects as objects having equivalent characteristic as real objects. More specifically, an example of MR technology applications is a hologram service.

Recently, the VR, AR, and MR technologies are sometimes referred to as extended reality (XR) technology rather than being clearly distinguished from each other. Accordingly, embodiments of the present disclosure are applicable to any of the VR, AR, MR, and XR technologies. The encoding/decoding based on PCC, V-PCC, and G-PCC techniques is applicable to such technologies.

The PCC method/device according to the embodiments may be applied to a vehicle that provides a self-driving service.

A vehicle that provides the self-driving service is connected to a PCC device for wired/wireless communication.

When the point cloud data (PCC) transmission/reception device according to the embodiments is connected to a vehicle for wired/wireless communication, the device may receive/process content data related to an AR/VR/PCC service, which may be provided together with the self-driving service, and transmit the same to the vehicle. In the case where the PCC transmission/reception device is mounted on a vehicle, the PCC transmission/reception device may receive/process content data related to the AR/VR/PCC service according to a user input signal input through a user interface device and provide the same to the user. The vehicle or the user interface device according to the embodiments may receive a user input signal. The user input signal according to the embodiments may include a signal indicating the self-driving service.

Figure 15:
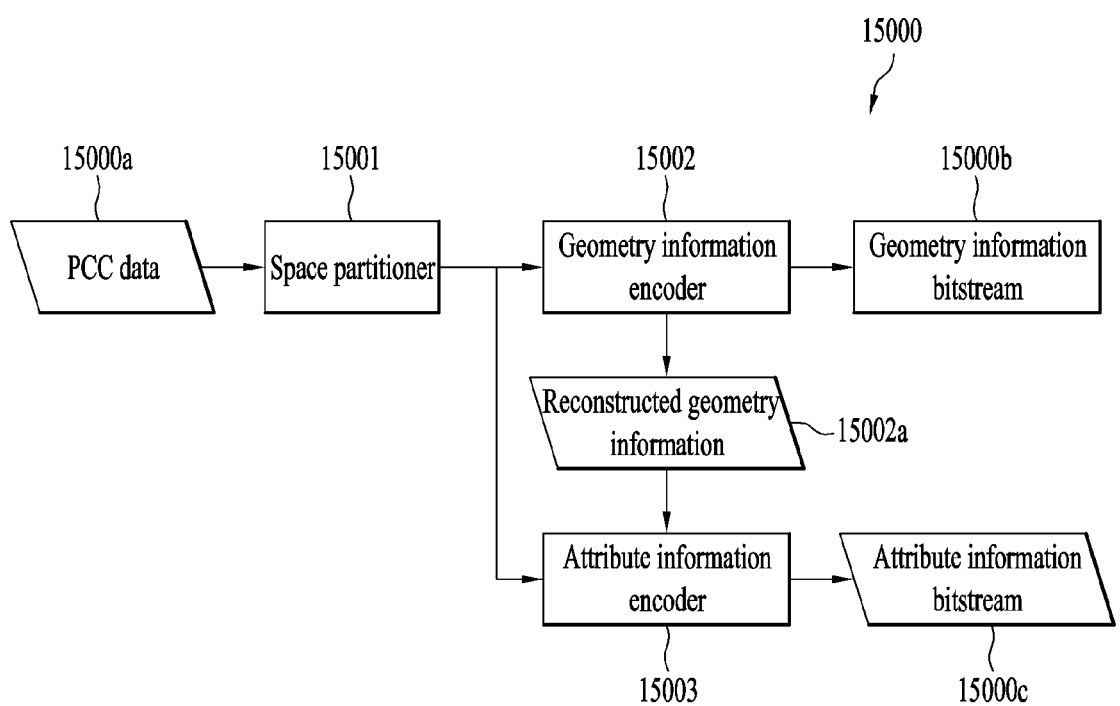
FIG. 15 illustrates a point cloud encoder according to embodiments.

FIG. 15 illustrates a point cloud encoder according to embodiments.

A point cloud encoder 15000 according to the embodiments receives point cloud data (PCC data) 15000*a* and encodes the same. The point cloud encoder according to the embodiments outputs a geometry information bitstream 15000*b* and an attribute information bitstream 15000*c*. The point cloud encoder 15000 according to the embodiments may include a space partitioner 15001, a geometry information encoder 15002 and/or an attribute information encoder 15003.

The point cloud encoder of FIG. 15 may correspond to or be combined the transmission device 1000 of FIG. 1, the point cloud video encoder 10002 of FIG. 1, the encoding 18001 of FIG. 2, the encoder of FIG. 4, the transmission device of FIG. 12, and the XR device 1430 of FIG. 14.

The space partitioner 15001 of the point cloud encoder may receive the point cloud data (PCC data) 15000*a*, and partition the point cloud data into one or more 3D spaces. The space partitioner 15001 may receive point cloud data and spatially partition the point cloud data into 3D blocks. The point cloud data may contain geometry information and/or attribute information about a point (or points). The space partitioner 15001 may spatially partition the point cloud data (PCC data) based on a bounding box and/or a sub-bounding box. The method/device according to the embodiments may perform encoding/decoding based on a partitioned unit (box).

The transmission device (e.g., the space partitioner) according to the embodiments may partition point cloud data in a 3D space into units that can be processed in parallel in order to compress the point cloud data. The space partitioner 15001 according to embodiments may partition the point cloud data into slices in order for the reception device to support scalability and/or region of interest (ROI) functions for the user.

The transmission device according to the embodiments may partition the point cloud data according to the embodiments into slices (which may be referred to as bricks) or tiles to achieve low latency, low complexity, temporal scalability, spatial scalability, ROI-based spatial scalability, quality scalability, parallel encoding, and parallel decoding of the reception device. Accordingly, the transmission device according to the embodiments needs to perform an operation supporting scalability adjustment and quantum value adjustment in units of slices. Accordingly, the point cloud data transmission device according to the embodiments may configure an overlapping slice such that an overlapping region between the slices is included. A method of partitioning the point cloud data into one or more slices (or overlapping slices) by the point cloud data transmission device according to the embodiments will be described in detail below.

A slice may represent a unit (or a minimum unit) for encoding and/or decoding point cloud data by the point cloud data transmission device according to the embodiments, and the point cloud data transmission device and/or the reception device may independently encode and/or decode the point cloud data on a slice-by-slice basis. A slice according to embodiments may also be referred to as a brick, a block, or a macroblock.

The space partitioner 15001 may perform some/all of the point cloud acquisition 10001 of FIG. 1, the acquisition 18000 of FIG. 2, the operations of FIGS. 3 to 5, and the operation of the data input unit 12000 of FIG. 12.

A geometry information encoder 15002 receives geometry information of the point cloud data (PCC data) according to embodiments and encodes the same. The geometry information may represent position information about the points included in the point cloud data. The geometry information encoder 15002 encodes the geometry information and outputs a geometry information bitstream. The geometry information encoder 15002 may reconstruct the position information about the points and output the reconstructed geometry information 15002a. The geometry information encoder 15002 may transmit the reconstructed geometry information to an attribute information encoder 15002.

The geometry information encoder 15002 may perform some/all of the operations of the point cloud video encoder 10002 of FIG. 1, the encoding 20001 of FIG. 2, the coordinate transformer 40000 of FIG. 4, the quantizer 40001, and the octree analyzer 40002, the surface approximation analyzer 40003, the arithmetic encoder 40004, the geometry reconstructor 40005, the quantization processor 12001 of FIG. 12, the voxelization processor 12002 of FIG. 12, the octree occupancy code generator 12003 of FIG. 12, the surface model processor 12004 of FIG. 12, the intra/inter-coding processor 12005 of FIG. 12, and/or the arithmetic coder 12006 of FIG. 12.

An attribute information encoder 15002 may receive attribute information of the point cloud data according to embodiments, and encode the attribute information based on the reconstructed geometry information received from the geometry information encoder 15002. The attribute information encoder 15003 encodes the attribute information and outputs an attribute information bitstream 15000c. The attribute information encoder 15003 may perform, for example, prediction transform, lifting transform, and/or region adaptive hierarchical transform (RAHT) according to embodiments. The attribute information encoder 15003 may perform, for example, prediction lifting transform. The prediction lifting transform may mean a combination of some or all of the detailed operations of the prediction transform and/or the lifting transform according to the embodiments.

The point cloud encoder according to the embodiments may perform some, all and/or a combination of prediction transform, lifting transform, and/or RAHT according to the embodiments.

The attribute information encoder 15003 may perform all/some of the operations of the point cloud video encoder 10002 of FIG. 1, the encoding 20001 of FIG. 2, the color transformer 40006, attribute transformer 40007, RATH transformer 40008, LOD generator 40009, lifting transformer 40010, coefficient quantizer 40011, and/or arithmetic encoder 40012 of FIG. 4, the color transform processor 12008, attribute transform processor 12009, prediction/lifting/RAHT transform processor 12010 and arithmetic coder 12011 of FIG. 12.

Here, the reconstructed geometry information 15002c may represent an octree reconstructed by the geometric reconstructor (Reconstruct geometry) 40005 described with reference to FIG. 4 and/or an approximated octree. The reconstructed geometry information may represent the occupancy code described with reference to FIG. 6 or represent an octree structure. The reconstructed geometry information may represent an octree occupancy code generated by the octree occupancy code generator 12003 described with reference to FIG. 12.

The attribute information encoder 15003 may encode the attribute information of the point cloud data according to embodiments. Here, the encoder 15003 according to the embodiments may encode the attribute information based on the reconstructed geometry information according to the embodiments. The attribute information encoder 15003 may generate a bitstream containing the attribute information by encoding the received data.

The attribute information encoder 15003 according to the embodiments may include the color transformer 40006, the attribute transformer 40007, RAHT transformer 40008, LOD generator 40009, lifting transformer 40010, and coefficient quantizer 40011, and/or arithmetic encoder 40012 of FIG. 4.

Point cloud data according to embodiments may be classified into category 1 and category 3 according to the characteristic of the data. Category 1 data may be static data and be composed of one frame. Category 3 data may be dynamic data and be composed of N frames. A ply file, which is in a file format of point cloud data, may be composed of multiple points according to a data acquisition method.

A point according to embodiments may include attribute information including position information (geometry information), color information, reflectance information, time information, and normal vector information about the point. A point according to embodiments may include various kinds of information depending on the condition to be presented. Category 1 data and Category 3 data composed of points may include a frame including a large quantity of points. However, when the point cloud data transmission device according to the embodiments receives and encodes a frame including points, latency and unnecessary use of resources may be caused.

Accordingly, for the point cloud data transmission device according to the embodiments, the operations of transmitting and encoding point cloud data, the decoding operation of the reception device, and the operation of rendering processing of the reception device may be performed in real time, and the point cloud data may be partitioned into a plurality of regions so as to be processed with low latency. The point cloud data transmission device according to the embodiments may partition a frame of point cloud data into tiles, slices, and/or bricks.

Accordingly, the point cloud data transmission device according to the embodiments may partition the point cloud data according to an independent data partitioning method for improving parallel processing capability and scalability for 3D point cloud data. The independent data partition may include spatial adaptive partition to support re-partition of points spatially close to each other.

As the point cloud data transmission device according to the embodiments partitions the point cloud data and encode the same independently, it may enable random access and parallel encoding in a 3D space occupied by the point cloud data.

Figure 16:
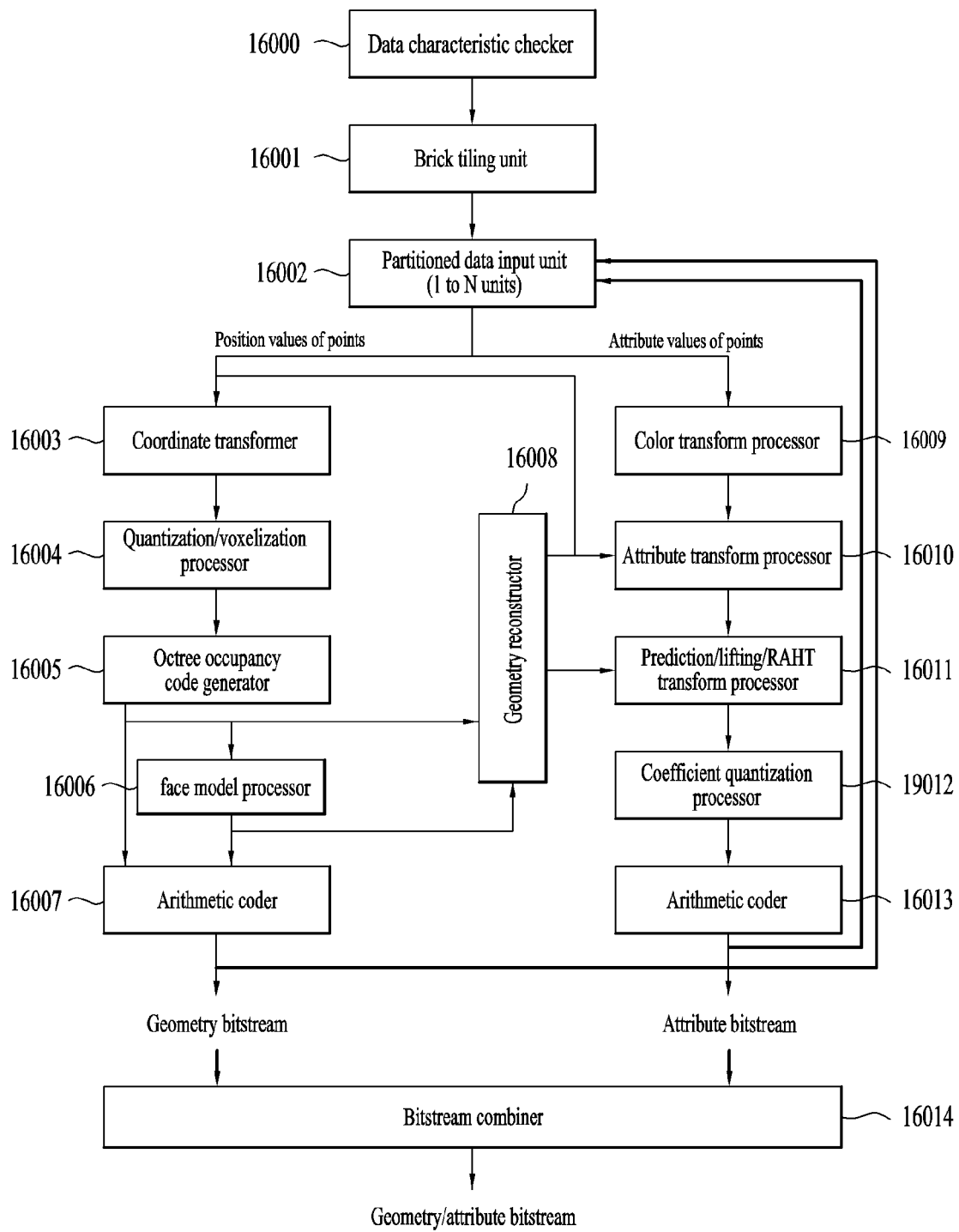
FIG. 16 illustrates a point cloud encoder according to embodiments.

FIG. 16 illustrates a point cloud encoder according to embodiments.

The point cloud encoder according to the embodiments may include a data characteristic checker 16000, a brick tiling unit 16001, a partitioned data input unit 16002, a coordinate transformer 16003, a quantization/voxelization processor 16004, an octree occupancy code generator 16005, a surface model processor 16006, a first arithmetic coder 16007, a geometry reconstructor 16008, a color transform processor 16009, an attribute transform processor 16010, a prediction/lifting/RAHT transform processor 16011, a coefficient quantization processor 16012, a second arithmetic coder 16013, and/or a bitstream combiner 16014.

The point cloud encoder shown in FIG. 16 may correspond to or be combined with the transmission device 1000 of FIG. 1, the point cloud video encoder 10002 of FIG. 1, the encoding 18001 of FIG. 2, the encoder of FIG. 4, the transmission device of FIG. 12, and the XR device of FIG. 1430.

The data characteristic checker 16000, the brick tiling unit 16001, and the partitioned data input unit 16002 of FIG. 16 may be elements included in the point cloud video acquisition 10001 of FIG. 1, the point cloud video encoder 10002 of FIG. 1, and the acquisition 18000 of FIG. 2, the encoding 18001 of FIG. 2, the data input unit 12000 of FIG. 12, and the space partitioner 15001 of FIG. 15.

The coordinate transformer 16003 may be the Transform coordinates 38000 of FIG. 4 and the quantization processor 12001 of FIG. 12. The quantization/voxelization processor 16004 may be the Quantize and remove points (voxelize) 38001 of FIG. 4 or the voxelization processor 12002 of FIG. 12, and perform the operations of FIGS. 5 to 7. The octree occupancy code generator 16005 may be the octree analyzer 38002 of FIG. 4 or the octree occupancy code generator 12003 of FIG. 12, and perform the operations of FIGS. 6 and 7. The surface model processor 16006 may be the surface approximation analyzer 38003 of FIG. 4 or the surface model processor 12004 of FIG. 12. The first arithmetic coder 16007 and the geometry reconstructor 16008 may be the arithmetic encoder 38004 of FIG. 4 and the arithmetic coder 12006 of FIG. 12. The color transform processor 16009 may be the color transformer 38006 of FIG. 4 or the color transform processor 12008 of FIG. 12. The attribute transform processor 16010 may be the attribute transferer 38007 of FIG. 4 or the attribute transform processor 12009 of FIG. 12. The prediction/lifting/RAHT transform processor 16011 may be all or part of the RAHT 38008, the LOD generator 38009, and the lifting transformer 40010 of FIG. 4, and may be the prediction/lifting/RAHT transform processor 12010 of FIG. 12. The coefficient quantization processor 16012 and the second arithmetic coder 16013 may correspond to the coefficient quantizer 40011 of FIG. 4, the arithmetic encoder 40012 of FIG. 4, and the arithmetic coder 12011 of FIG. 12.

In FIG. 16, the coordinate transformer 16003, the quantization/voxelization processor 16004, the octree occupancy code generator 16005, the surface model processor 16006, the first arithmetic coder 16007, and the geometry reconstructor 16008 may be included in the geometry information encoder 15002 of FIG. 15. In FIG. 16, the geometry reconstructor 16008, the color transform processor 16009, the attribute transform processor 16010, the prediction/lifting/RAHT transform processor 16011, the coefficient quantization processor 16012, the second arithmetic coder 16013 may be included in the attribute information encoder 15003 of FIG. 15.

The point cloud data encoder according to the embodiments represents an example of the point cloud data encoder 15000 of FIG. 15 according to the embodiments. According to the embodiments, the encoder may be referred to as an encoding device, and the decoder may be referred to as a decoding device.

The data characteristic checker 16000 receives point cloud data according to embodiments and checks the characteristic of the received point cloud data. For example, the data characteristic checker 16000 may check whether points of the point cloud data are densely distributed in a specific region or sparsely distributed in the specific region. The data characteristic checker 16000 may check whether the point cloud data is composed of a point cloud sequence including a plurality of frames, just as LiDAR data or data for self-driving. The data characteristic checker 16000 may check whether point cloud data within one frame are gathered in a specific region (for example, whether attribute information values consecutive to the left, right, top, bottom, front or back are gathered). The data characteristic checker 16000 may check whether objects represented by the point cloud data are spaced apart from each other. The data characteristic checker 16000 may check whether the 3D space occupied by the point cloud data is extended in one direction (e.g., a specific axis is excessively longer than the other axes).

The tiling unit 16001 receives point cloud data according to embodiments, and generates one or more tiles, one or more slices, or one or more bricks of the received point cloud data. That is, the brick tiling unit 16001 may partition the point cloud data into tiles, slices, or bricks. The brick tiling unit 16001 outputs the point cloud data partitioned into tiles, slices, or bricks.

A tile may mean a partial region of a 3D space occupied by point cloud data according to embodiments. According to embodiments, a tile may include one or more slices. As the tile according to the embodiments may be partitioned into one or more slices, the point cloud data encoder may encode the point cloud data in parallel. The point cloud data encoder may perform quantization and/or transformation differently on each of the one or more slices of a tile according to the characteristic of data.

A slice may mean a unit of data that the point cloud data transmission device and reception device according to the embodiments performs encode and decode. A slice may mean a set of data in a 3D space occupied by point cloud data, or may mean a set of some data among the point cloud data. A slice may represent a region or set of points included in a tile according to embodiments. A tile according to embodiments may be partitioned into one or more slices based on the number of points included in one tile. For example, one tile may mean a set of points divided by the number of points. A tile according to embodiments may be partitioned into slices based on the number of points, and some data may be split or merged during the partition process.

A block may mean a unit in which point cloud data included in a slice is partitioned for each point. For example, a block may mean a partial region of a 3D space occupied by cloud data in one slice, and represent a detailed unit in which the point cloud data transmission device and reception device according to the embodiments may perform encoding and decoding.

A brick may mean a block or slice according to embodiments. That is, a brick may a slice or mean a set or region of points for partitioning point cloud data. According to embodiments, a brick may be referred to as a region.

Brick tiling according to the embodiments means an operation of the point cloud data transmission device partitioning the point cloud data into one or more bricks (slices). Brick tiling may be referred to as slice partitioning.

The brick tiling unit 16001 according to the embodiments may perform slice partitioning based on various partitioning methods such as point density-based brick tiling (slice partitioning), circular sector brick tiling (slice partitioning), layer brick tiling (slice partitioning), spherical/oval region tiling (slice partitioning), attribute-based brick tiling (slice partitioning), and axis-based adaptive partitioning according to characteristic of data. A method of performing the partitioning will be described later with reference to FIGS. 19 to 31.

According to embodiments, the point density-based brick tiling may be referred to as point density-based slice partitioning, the circular sector brick tiling may be referred to as circular sector slice partitioning, the layer brick tiling may be referred to as layer slice partitioning, and the spherical/oval region tiling may be referred to as spherical/oval slice partitioning, and the attribute-based brick tiling may be referred to as attribute-based slice partitioning.

For example, when it is determined by the data characteristic checker 16000 that the points of the point cloud data are densely distributed in a specific region and sparsely distributed in a specific region, the brick tiling unit 16001 may perform partitioning based on the point density-based brick tiling (slice partitioning) according to the determination.

For example, when it is determined by the data characteristic checker 16000 that the point cloud data is composed of a point cloud sequence including a plurality of frames, just as LiDAR data or data for self-driving, the brick tiling unit 16001 may perform partitioning based on the circular sector brick tiling (slice partitioning). When it is determined by the data characteristic checker 16000 that the point cloud data within one frame are gathered in a specific region, the brick tiling unit 16001 may perform the partitioning based on the layer brick tiling (slice partitioning). When it is determined by the data characteristic checker 16000 that the objects represented by the point cloud data are spaced apart from each other, the brick tiling unit 16001 may perform partitioning based on the spherical/oval region tiling. When the 3D space occupied by the point cloud data is extended in one direction, the data characteristic checker 16000 may perform partitioning based on the axis-based adaptive partitioning.

According to embodiments, the point cloud data may be partitioned into a plurality of slices. There may be several methods of partitioning point cloud data into a plurality of slices. Point cloud data included in a slice according to embodiments may be independently encoded. The point cloud data transmission device and reception device according to the embodiments may prevent errors from being accumulated in the encoding and decoding process by independently performing encoding and decoding on a slice-by-slice basis.

A slice may mean a unit in which a point cloud frame in the point cloud data is partitioned for encoding. The point cloud data may be partitioned into a plurality of slices according to a slice-partitioning scheme.

According to embodiments of a method of partitioning point cloud data into a plurality of slices, partitioning may be performed based on variance information of color information in order to ensure color continuity. For example, when variance information of color information in a region of a specific point cloud or point cloud data is greater than the first threshold, the data or region may be regarded as a non-smooth block. When the proportion of the non-smooth block to the entire point cloud data is greater than a second threshold, blocks corresponding to the non-smooth block (or some points included in the non-smooth block) may be extracted and separated into a first slice, and the remaining unseparated cloud data may be separated into a second slice. According to embodiments, the variance information of the color information may be calculated to separate the first slice and the second slice. A kd tree may be used for variance information of the color information.

The k-d tree (kd tree) according to the embodiments is a type of binary tree and represents a hierarchy for partitioning a k-dimensional space. The kd-tree scheme refers to a method of geometry-adaptively performing partitioning point cloud data into slices.

According to embodiments, a slice may be referred to in various terms such as a brick, a block, a macroblock, and/or a tile. In addition, the brick tiling according to the embodiments may be referred to as slice partitioning.

The partitioned data input unit 16002 receives the partitioned point cloud data output by the brick tiling unit 16001. The partitioned data input unit 16002 outputs position information (geometry information) and attribute information about points in each of the bricks (or slices or tiles). The partitioned data input unit 16002 transfers the position information about the points to the coordinate transformer 16003 on a brick-by-brick (or slice-by-slice or tile-by-tile) basis, and transfers the attribute information about the points to the color transform processor 16009.

The data characteristic checker 16000, the brick tiling unit 16001, and/or the partitioned data input unit 16002 according to the embodiments may be included in the space partitioner 15001 of FIG. 15.

The coordinate transformer 16003 may receive the position information (geometry information) about the points according to the embodiments and may transform the coordinate information thereabout. The coordinate transformer 16003 may transfer the transformed coordinate information to the quantization/voxelization processor 16004. The coordinate transformer 16003 may perform the operation of the coordinate transformer 40000 of FIG. 4.

The quantization/voxelization processor 16004 may perform quantization and/or voxelization on the position information about the points from the coordinate transformer 16003. The quantization/voxelization processor 16004 may transmit the quantized and/or voxelized position information (geometry information) about the points to the octree occupancy code generator 16005. The quantization/voxelization processor 16004 may perform the operations of the quantization/voxelization processor 40001 of FIG. 4 and the voxelization processor 12002 of FIG. 12.

The octree occupancy code generator 16005 may receive the quantized and/or voxelized geometry information and generate an octree occupancy code based on the quantized and/or voxelized geometry information. The octree occupancy code may include a data structure representing the position information about the points according to embodiments. The octree occupancy code generator 16005 may transfer the octree occupancy code to the first arithmetic coder 16007, the surface model processor 16006, and/or the geometry reconstructor 16008. The octree occupancy code generator 16005 may perform the operations of the octree analyzer 40002 of FIG. 4 and the octree occupancy code generator 12003 of FIG. 12.

The surface model processor 16006 may receive the octree occupancy code according to the embodiments and process the surface model. The surface model processor 16006 may output the surface model-processed geometry information and transmit the same to the first arithmetic coder 16007. The surface model processor 16006 may perform the operations of the surface approximation analyzer 40003 of FIG. 4 and the surface model processor 12004 of FIG. 12.

The first arithmetic coder 16007 may receive an octree occupancy code according to embodiments and/or an octree occupancy code on which surface model processing has been performed, and encode the same. The first arithmetic coder 16007 may output a geometry bitstream. The first arithmetic coder 16007 may transmit the geometry bitstream to the bitstream combiner. The first arithmetic coder 16007 may perform the operations of the arithmetic encoding 40004 of FIG. 4 and the arithmetic coder 12006 of FIG. 12.

The first arithmetic coder 16007 may transmit information related to whether to perform encoding of the geometry information for a corresponding brick (or slice or tile) to the partitioned data input unit 16002.

The geometry reconstructor 16008 receives the octree occupancy code and/or the octree occupancy code on which surface model processing has been performed to according to the embodiments, and reconstructs the geometry information based thereon. The geometry reconstructor 16008 may generate Morton codes according to embodiments and may reconstruct geometry information based thereon. The geometry reconstructor 16008 may perform the operation of the geometry reconstructor 40005 of FIG. 4.

The color transform processor 16009 may receive the attribute information about the points according to embodiments and may transform the color information of the attribute information. The color transform processor may output the transformed attribute information and transmit the same to the attribute transform processor 16010. The color transform processor 16009 may perform the operations of the color transformer 40006 of FIG. 4 and the color transform processor 12008 of FIG. 12.

The attribute transform processor 16010 may map the position information about the points according to the embodiments, the attribute information color-transformed by the color transform processor 16009 according to the embodiments, and/or the geometry information reconstructed by the geometry reconstructor 16008, and perform attribute transform processing. The attribute transform processor 16010 may perform the operations of the attribute transformer 40007 of FIG. 4 and the attribute transform processor 12009 of 12.

The prediction/lifting/RAHT transform processor 16011 may transform the attribute information transformed by the attribute transform processor 16010 according to the prediction, lifting, and/or RAHT technique. The prediction/lifting/RAHT transform processor 16011 may output attribute information transformed according to the prediction, lifting, and/or RAHT technique, and may transmit the same to the coefficient quantization processor 16012. The prediction/lifting/RAHT transform processor 16011 performs the operations of the RAHT 40008, LOD generator 40009 and/or lifting 40010 of FIG. 4, and the prediction/lifting/RAHT transform processor 12010 of FIG. 12

The coefficient quantization processor 16012 may receive the attribute information transformed by the prediction/lifting/RAHT transform processor 16011 and quantize the same. The coefficient quantization processor 16012 may transmit the quantized attribute information to the second arithmetic coder 16013. The coefficient quantization processor 16012 may perform the operation of the coefficient quantizer 40011 of FIG. 4.

The second arithmetic coder 16013 may receive the attribute information quantized by the coefficient quantization processor 16012 and encode the same. The second arithmetic coder 16013 may output an attribute bitstream containing the encoded attribute information. The second arithmetic coder 16013 may output attribute bitstreams and transmit the same to the bitstream combiner 16014.

The second arithmetic coder 16013 may transmit, to the partitioned data input unit 16002, information related to whether to perform encoding of the attribute information on a corresponding brick (or slice or tile). The second arithmetic coder 16013 may perform the operations of the arithmetic encoder 40012 of FIG. 4 and the arithmetic coder 12011 of FIG. 12.

The bitstream combiner 16014 may combine the geometry bitstream and/or the attribute information bitstream according to embodiments. The bitstream combiner 16014 may combine the geometry bitstream and the attribute bitstream on a brick-by-brick (or slice-by-slice or tile-by-tile) basis according to embodiments.

The point cloud data transmission device according to the embodiments may include the data characteristic checker 16000, the brick tiling unit 16001, the partitioned data input unit 16002, and the bitstream combiner 1601. The point cloud data transmission device according to the embodiments may partition the point cloud data into one or more bricks in the brick tiling unit in response to, for example, brick_tiling_filter information. The point cloud data according to the embodiments is partitioned into N regions by the brick tiling unit 16001 and input to the partitioned data input unit 16002. Point cloud data in each of each of the N partitioned bricks (slices) is divided into position information about points and attribute information about the points to be encoded. When the encoding process is performed for each of the N bricks, the position information about the points and the attribute information about the points encoded by the bitstream combiner 16014 according to the embodiments may be combined into one bitstream.

The point cloud data transmission device according to the embodiments may partition the point cloud data into one or more bricks using the brick tiling unit 16001, and encode each region by performing encoding each of the partitioned bricks. In this case, data of a region necessary for the point cloud data reception device according to the embodiments may be distinguished from a region that is less important, and thus encoding may be efficiently performed. Accordingly, the point cloud data transmission device may increase encoding efficiency by the above-described configuration.

The point cloud data encoder according to the embodiments may partition the point cloud data into one or more tiles, slices, blocks, and/or bricks, and quantization may be differently set for the partitioned units. By partitioning the point cloud data in this way, the point cloud data encoder may differentially encode the points of different importances. In addition, the point cloud data reception device may efficiently decode the differentially encoded data and provide important information to a user quickly.

The point cloud data transmission device may provide an encoding method optimized for characteristic of the data by partitioning the point cloud data into one or more bricks and performing encoding on the brick-by-brick basis. For example, in the case of point cloud data containing points densely distributed in a specific region, an error that may occur during encoding may be reduced by partitioning and encoding the region of the densely distributed points. In addition, for example, in a data sequence composed of a plurality of frames, such as LiDAR data or self-driving data, the encoding error for each frame may be reduced by partitioning and encoding the point cloud data using the technique of circular sector brick tiling, which will be described later.

The point cloud data transmission device and reception device according to the embodiments may prevent errors from being accumulated in the encoding and decoding process by independently performing encoding and decoding on a slice-by-slice basis.

The point cloud data transmission device according to the embodiments may perform the partitioning operation based on a partitioning method that is adaptively performed according to requirements that may be given in various processing situations such as point cloud data transmission, encoding/decoding, and rendering, thereby providing point cloud content to enable real-time processing, low latency, and parallel processing.

Figure 17:
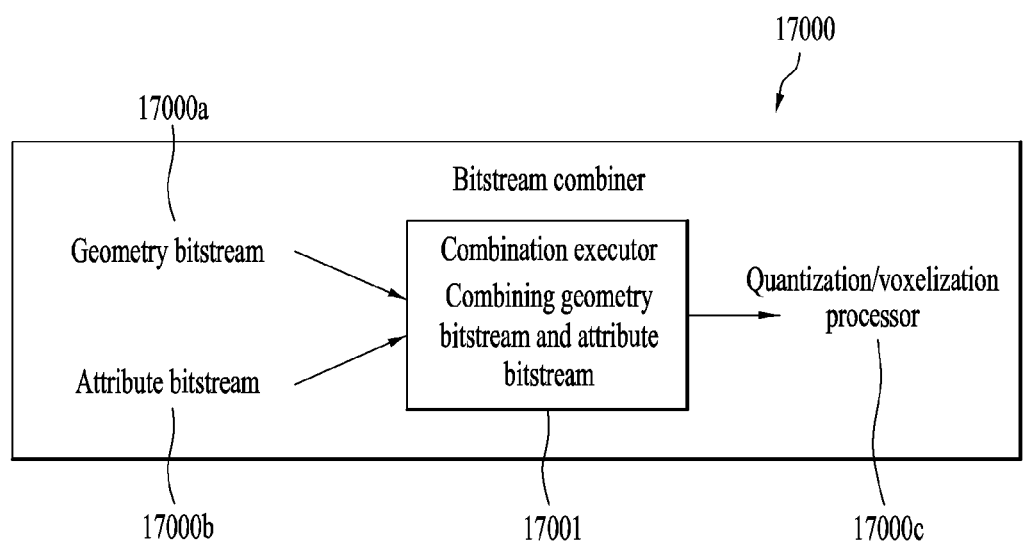
FIG. 17 illustrates a bitstream combiner of a point cloud data transmission device according to embodiments.

FIG. 17 illustrates a bitstream combiner of a point cloud data transmission device according to embodiments.

A bitstream combiner 17000 shown in FIG. 17 may correspond to or be combined with the transmission device 1000 of FIG. 1, the transmitter 10003 of FIG. 1, the point cloud video encoder 10002 of FIG. 1, the encoding 18001 of FIG. 2, and the transmitter 18002 of FIG. 2, the encoder of FIG. 4, the transmission device of FIG. 12, the XR device 1430 of FIG. 14, and the like.

The bitstream combiner 17000 of FIG. 17 may be the bitstream combiner 16014 of FIG. 16, may be included in the transmission processor 12012 of FIG. 12, the transmitter 10003 of FIG. 1, and the transmitter 18002 of FIG. 2. That is, a geometry bitstream 17000a and an attribute bitstream 17000b of FIG. 17 may correspond to the geometry bitstream and the attribute bitstream received by the bitstream combiner 16014 of FIG. 16, and may be the geometry information bitstream 15000b and attribute information bitstream 15000c of FIG. 15, the geometry bitstream output from the arithmetic encoder 38004 of FIG. 4 and the attribute bitstream output from the arithmetic encoder 40012 of FIG. 4, or the bitstream output from the arithmetic coder 12006 of FIG. 12 and the bitstream output from the arithmetic coder 12011 of FIG. 12.

The bitstream combiner 17000 will be described below. The bitstream combiner 17000 receives the geometry bitstream 17000a and/or the attribute bitstream 17000b. The bitstream combiner 17000 may output a bitstream 17000c by combining the received geometry bitstream 17000a and the received attribute bitstream 17000b.

The bitstream combiner 17000 may receive the geometry bitstream 17000a encoded on a region-by-region basis and the attribute bitstream 17000b encoded on a region-by-region basis and combine the same. The bitstream combiner 17000 may output a bitstream 17000c in units of regions. According to embodiments, the bitstream combiner 17000 may receive and combine the bitstreams 17000a and 17000b into which the point cloud data corresponding to one or more regions partitioned in FIGS. 19 to 25 are encoded. Accordingly, the bitstream combiner 17000 may output the bitstream 17000c in units of regions according to FIGS. 19 to 25.

Figure 18:
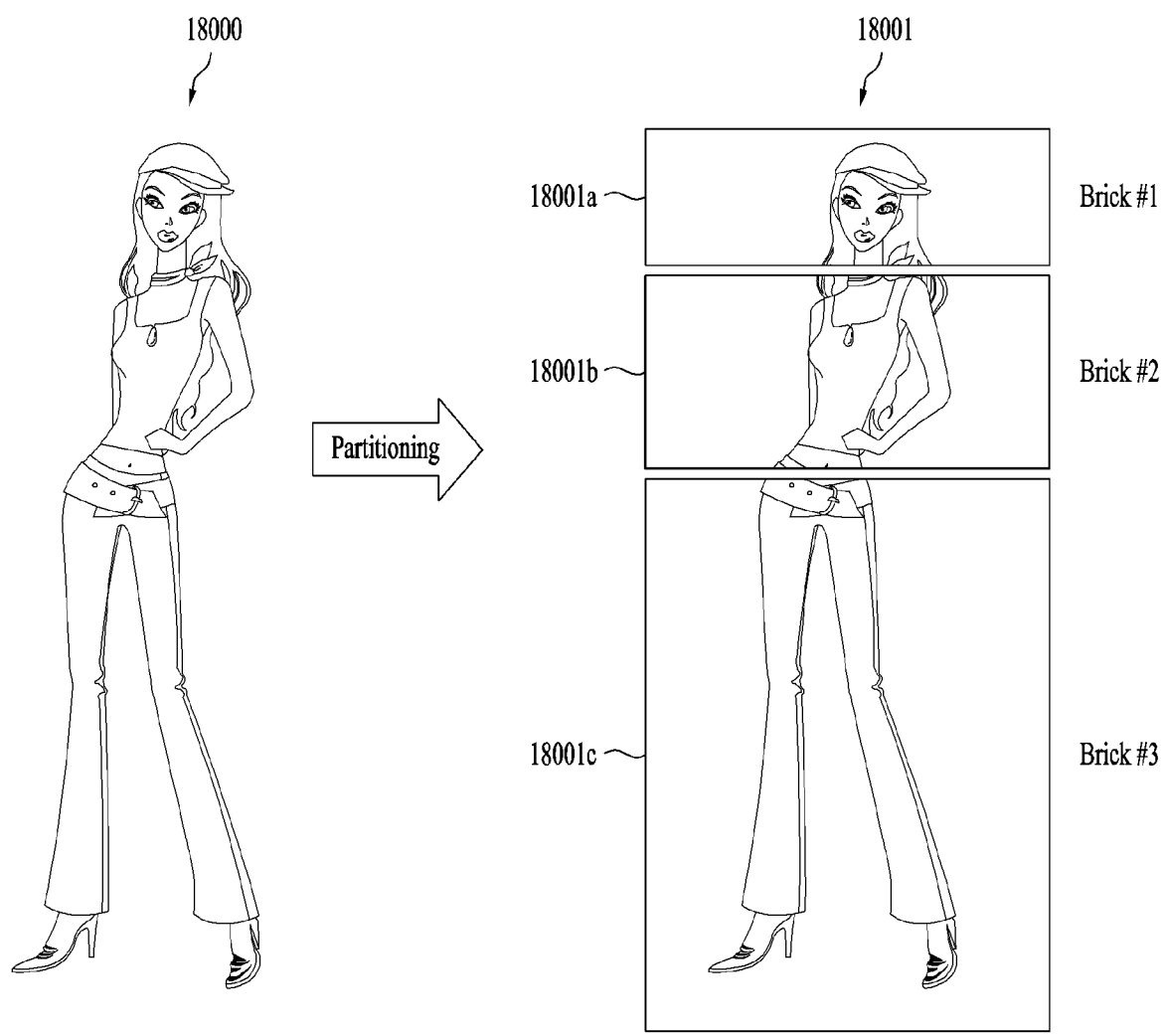
FIG. 18 illustrates a method of partitioning point cloud data into one or more regions by a point cloud data encoder according to embodiments.
Figure 19:
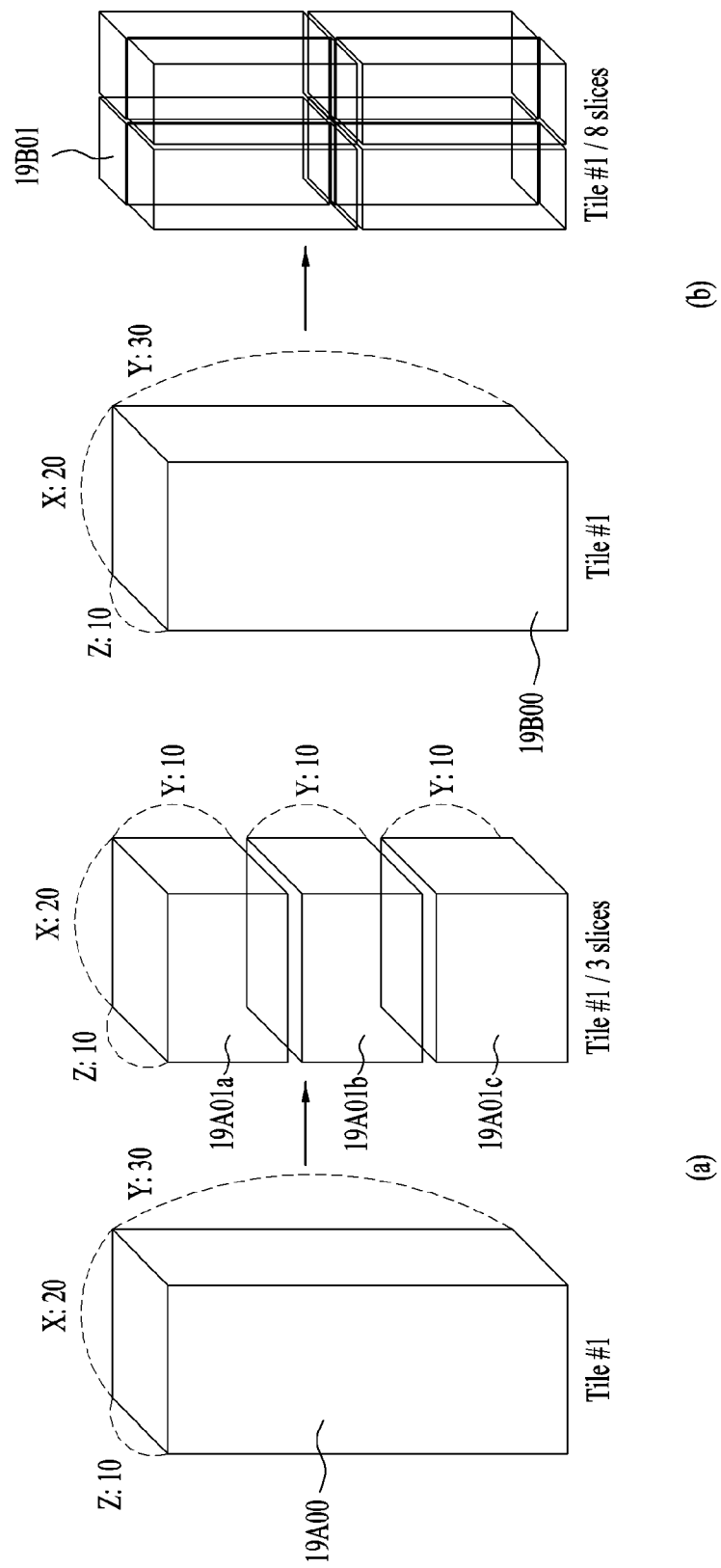
FIG. 19 illustrates a method of partitioning point cloud data into one or more regions by a point cloud data transmission device according to embodiments.

The bitstream combiner 17000 may refer to a bitstream combiner 19014 of FIG. 19. The geometry bitstream 17000a and the attribute bitstream 17000b may refer to a geometry bitstream and an attribute bitstream of FIG. 19. The geometry bitstream 17000a and the attribute bitstream 17000b may refer to a geometry bitstream 1800b and an attribute information bitstream 18000c of FIG. 18.

The bitstream combiner 17000 may include a combination executor 17001 configured to combine the geometry bitstream 17000a and the attribute bitstream 17000b according to the embodiments. The combination executor 17001 may receive the geometry bitstream 17000a and the attribute bitstream 17000b described above, combine the same for each region, and output the bitstream 17000c.

The bitstream combiner 17000 may determine an order of combining the geometry bitstream 17000a and the attribute bitstream 17000b and a method of performing the combining. The method of performing the combining may be at least one of methods such as multiplexing, MVC bit string combination, sequential combination, and importance-based combination. The method of performing the combining according to the embodiments may be determined or selected according to the characteristic of the received geometry bitstream 17000a and/or the attribute bitstream 17000b (e.g., various attribute bitstreams, presence/absence of an attribute bitstream, the degree of quantization of the geometry and attribute bitstreams, the length of the bitstream, tiling, etc.). The point cloud data encoder may generate information (combining_filter_index) on a combination method used by the encoder to transmit the combined geometry bitstream and attribute bitstream, and transmit the same in the form of a bitstream. According to embodiments, a specific combination method may be fixedly used according to the transmission characteristic of the bitstream.

By configuring the bitstream combiner 17000, the point cloud data transmission device according to the embodiments may transmit the bitstream generated by encoding the partitioned regions according to FIGS. 19 to 25. Accordingly, the point cloud data reception device according to the embodiments may efficiently decode the point cloud data received for each region together with the signaling information.

FIG. 18 illustrates a method of partitioning point cloud data into one or more regions by a point cloud data transmission device according to embodiments.

Bricks according to embodiments may correspond to slices. In this document, a brick may be referred to as a slice.

The operation illustrated in FIG. 18 may be performed by a combination of the transmission device 1000 of FIG. 1, the transmitter 10003 of FIG. 1, the point cloud video encoder 10002 of FIG. 1, the encoding 18001 of FIG. 2, the transmitter 18002, the encoder of FIG. 4, and the transmission device of FIG. 12, the XR device 1430 of FIG. 14, and the like.

The operation according to embodiments may include acquiring point cloud data and partitioning the acquired point cloud data into one or more slices.

The operation illustrated in FIG. 18 may be performed by, for example, the space partitioner 15001 of FIG. 15, the data characteristic checker 16000 of FIG. 16, the brick tiling unit 16001 of FIG. 16, and the data input unit 12000 of FIG. 12.

The left image 18000 of FIG. 18 shows point cloud data according to embodiments. The point cloud data may be partitioned into a plurality of types of point cloud data (e.g., LiDAR data, etc.). The types of point cloud data may be classified according to whether the points of the point cloud data are densely distributed or sparsely distributed.

The right image 18001 of FIG. 18 shows an operation of partitioning the point cloud data of the left image 18000 of FIG. 18 into three slices. The operation of partitioning the point cloud data into three slices according to the embodiments may be performed by the space partitioner 15001 of FIG. 15 and the brick tiling unit 16001 of FIG. 16.

Referring to the right image 18001 of FIG. 18, the brick tiling unit 16001 according to the exemplary embodiments may partition the point cloud data of the left image 18000 of FIG. 18 into a first slice 18001*a*, a second slice 18001*b*, and a third slice 18001*c*. A brick tiling unit 19001 according to embodiments may partition the point cloud data based on the type of the point cloud data. Slices according to embodiments may be called by other names (e.g., brick) within the scope of equivalent meaning.

The point cloud data transmission device according to the embodiments may partition the point cloud data into tiles, slices, and/or bricks, as described with reference to FIGS. 18 and 19, thereby enabling random access and parallel coding in the 3D space occupied by the point cloud data.

FIG. 19 illustrates a method of partitioning point cloud data into one or more regions by a point cloud data transmission device according to embodiments.

The operation according to the partitioning method illustrated in FIG. 19 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of the FIG. 4, the transmission device of FIG. 12, the XR device 1430 of FIG. 14, and the like. In addition, the bricks illustrated in this figure may correspond to slices, and vice versa. In this document, a brick may be referred to as a slice.

The operation according to the embodiments may include acquiring point cloud data, and partitioning the acquired point cloud data into one or more slices as illustrated in FIG. 19. The operation illustrated in FIG. 19 may be performed by, for example, the space partitioner 15001 of FIG. 15, the data characteristic checker 16000 of FIG. 16, the brick tiling unit 16001, and the data input unit 12000 of FIG. 12.

FIG. 19(A) shows that a 3D space 19A00 occupied by the point cloud data is partitioned based on the lengths of the axes of the 3D space 19A00. The point cloud data transmission device according to the embodiments may encode the point cloud data. The point cloud data transmission device according to the embodiments may partition the points or 3D space 19A00 according to the embodiments into one or more partitioned regions 19A01*a* to 19A01*c*, and independently encode the points included in the partitioned regions.

The 3D space 19A00 occupied by point cloud data includes point cloud data according to embodiments. The 3D space 19A00 includes a plurality of points representing point cloud data. The plurality of points may be a unit constituting point cloud data according to embodiments. The point cloud data transmission device according to embodiments may encode position information and attribute information of each of a plurality of points.

The partitioned regions 19A01*a* to 19A01*c* may include some of the points 19A00 of the point cloud data according to the embodiments. The point cloud data transmission device according to the embodiments may partition the point cloud data into one or more partitioned regions 19A01*a* to 19A01*c* based on the characteristic of the point cloud data. The partitioned regions 19A01*a* to 19A01*c* according to the embodiments may correspond to or be referred to as tiles, slices, bricks, or blocks.

The point cloud data transmission device according to the embodiments may partition the 3D space 19A00 including points based on the lengths of the axes of the 3D space. The 3D space 19A00 including points may be a bounding box or a tile. The 3D space (for example, a bounding box or tile) according to embodiments may be represented by an x-axis, a y-axis, and a z-axis.

For example, for the point cloud data according to the embodiments, one of the x-axis, y-axis, and z-axis may be shorter than the other two axes. For example, there may be point cloud data that expresses a terrain that is widely distributed along two axes except one axis. If the point cloud data transmission device performs encoding on the points in the bounding box regardless of the lengths of the axes, encoding efficiency may be degraded. Accordingly, the point cloud data transmission device needs to partition the data into one or more regions in adaptation to the lengths of the axes of the 3D space. Therefore, the point cloud data transmission device according to the embodiments may calculate the relative lengths of the x-axis, y-axis, and z-axis, and partition the point cloud data into one or more regions based on the calculated relative lengths.

Accordingly, the point cloud data transmission device according to the embodiments may determine the length of the shortest axis and the length of the longest axis among the x-axis, y-axis, and z-axis, and partition the longest axis into units of the length of the shortest axis. For example, in FIG. 19(A), the longest axis of the bounding box is the y-axis (length: 30), and the shortest axis is the z-axis (length: 10). Accordingly, the point cloud data transmission device according to the embodiments may divide the Y-axis into units of length 10, which is the length of the Z-axis, and partition the point cloud data into three slices 19A01*a* to 19A01*c*.

The point cloud data transmission device according to the embodiments may partition the partitioned slices again. For example, it may partition one partitioned slice 19A01*a* into units of the length of the shortest axis. In this case, two slices having a length of 10 along the X-axis, Y-axis, and Z-axis may be generated.

As shown in FIG. 19(A), the point cloud data transmission device according to the embodiments may partition the point cloud data based on a slice partition scheme of uniform-geometry partition along the longest edge. The uniform-geometry partition along the longest edge refers to a method of partitioning performed in the following manner.

1) Assume the longest edge and the shortest edge as maxEdge and minEdge, slice number as sliceNum, slice size as sliceSize. The default value of sliceNum may be set as maxEdge/minEdge and sliceSize may be set as minEdge.

2) Partition the point cloud data by sliceNum according to the uniform-geometry partition scheme according to the embodiments.

FIG. 19(B) shows that a 3D space 19B00 occupied by the point cloud data is partitioned based on octree information about the points included in the 3D space 19B00.

The octree information according to the embodiments refers to an octree structure for indicating geometry information about points according to the embodiments. The point cloud data transmission device according to the embodiments may partition a slice such that the 3D space corresponds to one or more spaces represented by an octree.

That is, the point cloud data transmission device according to the embodiments may perform uniform-geometry partitioning using octree. The uniform-geometry partitioning using octree is performed as follows.

1) Set the depth of octree partition depOctree to 1 by default. The depth of octree partition may represent a level of the octree structure.

2) Partition the point cloud data in 8^depOctree slices according to the octree partition scheme.

For example, when depOctree is 1, the point cloud data transmission device according to the embodiments may partition the point cloud data into eight slices including points for eight spaces.

By partitioning the bounding box in this manner, the point cloud data transmission device according to the embodiments may encode slices that do not overlap individually. Similarly, the reception device may decode the point cloud data for each individual slice.

The point cloud data transmission device according to the embodiments may partition a 3D space into one or more slices based on color information or reflectance information, which is attribute data about points in a tile. For example, the point cloud data transmission device according to the embodiments may sort the attribute data in an ascending order, and then partition the slice into points sorted by the attribute data values.

When the points are partitioned by the point cloud data transmission device according to the embodiments as described above, slices of the bounding box may overlap each other, and sharing by multiple slices within one space may be possible because the partitioning is performed based on the sorting in an ascending order. Accordingly, the point cloud data transmission device according to the embodiments may support spatial scalability, which is a requirement for point cloud compression, and ROI-based spatial scalability.

Figure 20:
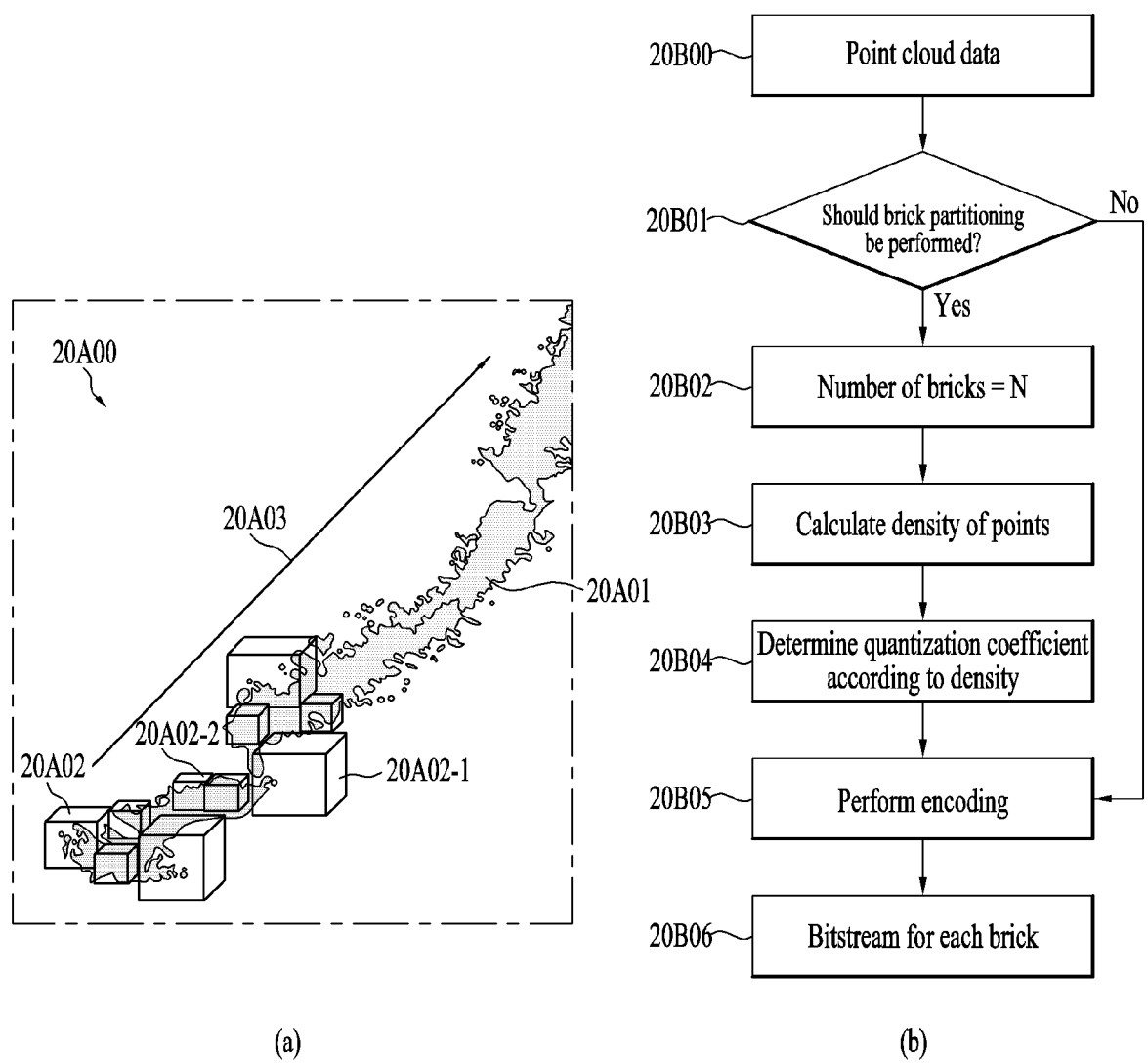
FIG. 20 illustrates a method of partitioning point cloud data into one or more regions by a point cloud data transmission device according to embodiments.

FIG. 20 illustrates a method of partitioning point cloud data into one or more regions by a point cloud data transmission device according to embodiments.

The operation according to the partitioning scheme illustrated in FIG. 20 may be performed by a combination of the transmission device 1000 of FIG. 1, the transmitter 10003 of FIG. 1, the point cloud video encoder 10002 of FIG. 1, the encoding 18001 of FIG. 2, the transmission unit 18002 of FIG. 2, the encoder FIG. 4, the transmission device of FIG. 12, the XR device 1430 of FIG. 14, and the like. In addition, the bricks described in this figure may correspond to slices, and vice versa. In this document, a brick may be referred to as a slice.

The operation illustrated in FIG. 20 may be performed by, for example, the space partitioner 15001 of FIG. 15, the data characteristic checker 16000 of FIG. 16, the brick tiling unit 16001, and the data input unit 12000 of FIG. 12.

FIG. 20(A) shows a 3D space 20A00 occupied by point cloud data. The point cloud data transmission device according to the embodiments may encode the point cloud data. The point cloud data transmission device according to the embodiments may partition the points 20A01 or the 3D space 20A00 into one or more partitioned regions 20A02, and independently perform encoding on points included in the partitioned regions.

The 3D space 20A00 occupied by point cloud data includes the point cloud data according to the embodiments. The 3D space 20A00 includes a plurality of points 20A01 representing the point cloud data.

The plurality of points 20A01 may be a unit constituting point cloud data according to embodiments. The point cloud data transmission device according to the embodiments may encode position information and attribute information about each of the plurality of points 20A01.

The partitioned regions 20A02 may contain some of the points 20A01 of the point cloud data according to the embodiments. The point cloud data transmission device according to the embodiments may partition the point cloud data into one or more partitioned regions 20A02 based on the characteristic of the point cloud data. The partitioned regions 20A02 according to the embodiments may correspond to or be referred to as tiles, slices, bricks, or blocks.

The characteristic of the point cloud data may be related to the density of the points 20A01. For example, the point cloud data according to the embodiments may be data having points densely distributed in the direction of an arrow 20A03. Accordingly, the point cloud data transmission device according to the embodiments may partition the point cloud data into one or more partitioned regions 20A02 based on the density of the points.

For example, the point cloud data transmission device according to the embodiments may partition the point cloud data into partitioned regions 20A02 including a first brick 20A02-1 and a second brick 20A02-2. The first brick 20A02-1 may be a region containing relatively sparsely distributed points among a plurality of points. The second brick 20A02-2 may be a region containing points relatively densely distributed among the plurality of points. According to embodiments, the second brick 20A02-2 in which the points are densely distributed may be larger than the first brick 20A02-1 in which the points are sparsely distributed.

FIG. 20(B) illustrates a method of partitioning a 3D space 20A00 occupied by point cloud data into one or more regions and a process of performing encoding on each brick. Specifically, FIG. 20(B) illustrates partitioning the point cloud data into one or more bricks based on the density of the points of the point cloud data. This method of partitioning point cloud data may be referred to as point density-based brick tiling.

The point density-based brick tiling according to the embodiments means partitioning the point cloud data of the embodiments into one or more bricks according to the density of points or the distance of the points according to embodiments. According to embodiments, a partitioned brick may be composed of one 3D block or a bundle of two or more 3D blocks.

The operation of FIG. 20B may be performed by the space partitioner 15001 of FIG. 15 and the brick tiling unit 16001 of FIG. 16. The process illustrated in FIG. 20(B) may include receiving point cloud data (20B00), determining whether to perform brick partitioning (20B01), determining the number of bricks (20B02), and calculating a density of points (20B03), determining a quantization coefficient according to the density of points for each of the brick (20B04), performing encoding on each brick (20B05) and/or outputting a bitstream for each brick (20B06).

In operation 20B00 of receiving point cloud data, point cloud data according to embodiments may be received.

Determining whether to perform brick partitioning (20B01) may be an operation of determining whether to partition the received point cloud data into one or more bricks (or slices or tiles).

Determining whether to perform brick partitioning (20B01) may be an operation of determining whether to perform brick partitioning based on x coordinate values, y coordinate values, and/or z coordinate values of the points in the received point cloud data.

In determining whether to perform brick partitioning (20B01), whether to perform brick partitioning may be determined based on the type of received point cloud data. Determining whether to perform brick partitioning (20B01) may be an operation of generating brick_tiling_filter information indicating whether to perform brick partitioning.

When it is determined to perform the brick partitioning in the operation of determining whether to perform the brick partitioning, the number of bricks into which the point cloud data is to be partitioned is determined in the operation of determining the number of bricks (20B02). In determining the number of bricks (20B02), the number of bricks to be partitioned may be determined based on the type of the received point cloud data.

Calculating the density of the points (20B03) may be an operation of calculating the density of the points and partitioning the point cloud data into one or more bricks based on the calculated density. According to embodiments, the density of points may be defined based on the number of points per volume occupied by the points or an average of distances between points. According to embodiments, the density of points per brick may be variably determined.

In determining a quantization coefficient according to the density of points for each brick (20B04), the point cloud data transmission device according to the embodiments may determine a quantization coefficient according to the density in order to variably perform decoding according to the density of the points.

The operation of performing encoding on each brick (20B05) refers to an operation in which the point cloud data transmission device according to the embodiments encodes the point cloud data for each brick. According to embodiments, each of the partitioned bricks may be flexibly changed according to the setting of the point cloud data transmission device. The point cloud data transmission device may generate information such as information for indicating partitioning information (e.g., brick_unit_information, brick_density_quantization_step).

The operation of outputting a bitstream for each brick (20B06) refers to an operation in which the point cloud data transmission device outputs an output bitstream after encoding the point cloud data on a brick-by-brick basis.

The point cloud data transmission device according to the embodiments may perform point density-based tiling according to the embodiments, thereby effectively encoding a sequence in which the density of points varies among the regions within one frame.

The point cloud data transmission device according to the embodiments may lower a scaling factor for a brick having a low density according to the density of points by performing point density-based tiling according to the embodiments, thereby increasing the compression rate of geometry information. In addition, for a brick containing points of a high density, an increased scaling factor may be given. Thereby, position information may be accurately presented.

Figure 21:
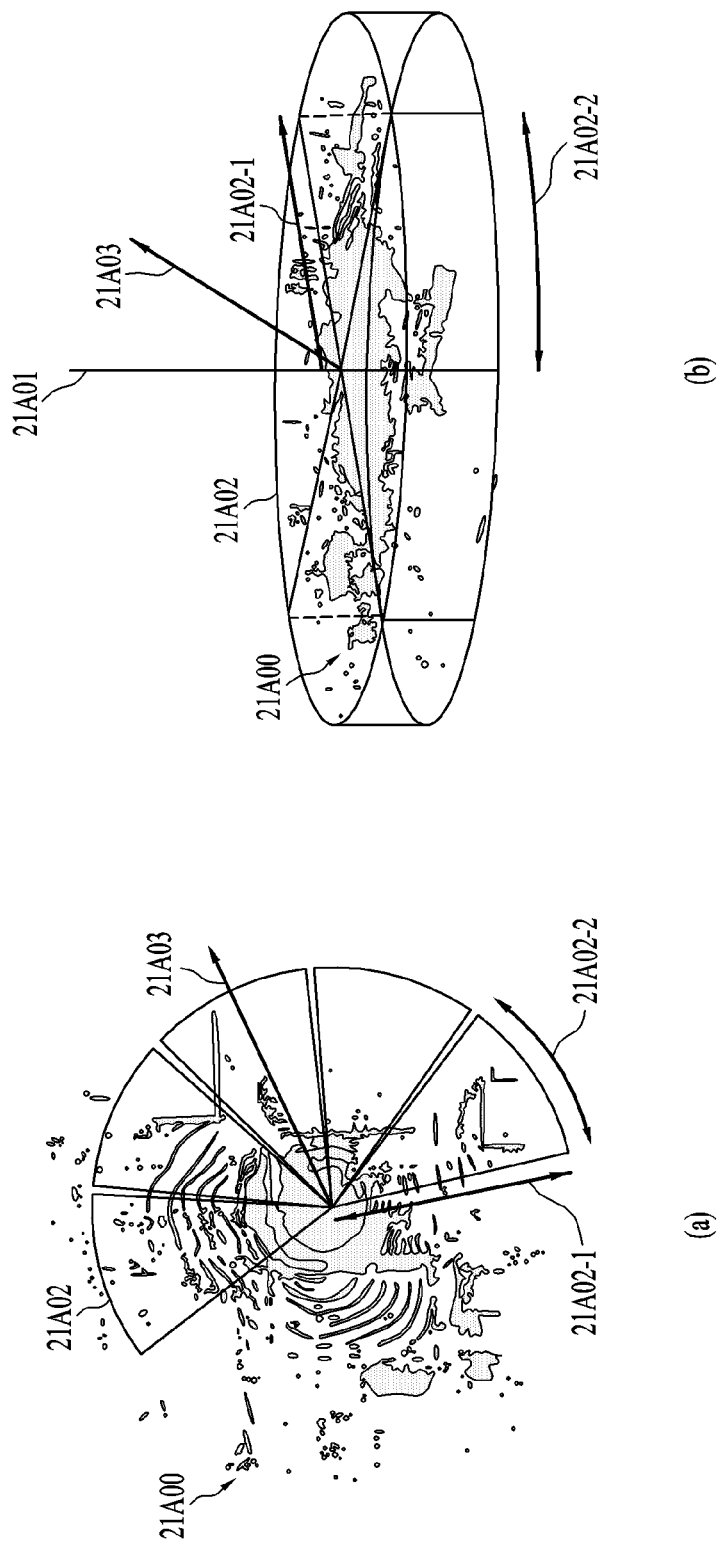
FIG. 21 illustrates a method of partitioning point cloud data into one or more regions by a point cloud data transmission device according to embodiments.

FIG. 21 illustrates a method of partitioning point cloud data into one or more regions by a point cloud data transmission device according to embodiments.

The operation according to the partitioning method illustrated in FIG. 21 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of FIG. 12, the XR device 1430 of FIG. 14, and the like. The bricks described in this figure may correspond to slices, and vice versa. In this document, a brick may be referred to as a slice.

The operation illustrated in FIG. 21 may be performed by, for example, the space partitioner 15001 of FIG. 15, the data characteristic checker 16000 of FIG. 16, the brick tiling unit 16001 of FIG. 16, and the data input unit 12000 of FIG. 12.

FIG. 21 shows that the point cloud data transmission device partitions a 3D space occupied by point cloud data or the point cloud data 21A00 into one or more circular sectors 21A02. The point cloud data transmission device according to the embodiments may encode the point cloud data for each partitioned circular sector 21A02. The operation of partitioning the point cloud data illustrated in FIG. 21 may be performed by the space partitioner 15001 of FIG. 15 and the brick tiling unit 16001 of FIG. 16.

The sector 21A02 according to the embodiments may correspond to or be referred to as a tile, a slice, a brick, or a block according to the embodiments.

The point cloud data transmission device according to the embodiments may partition the point cloud data 21A00 into one or more circular sectors 21A02 based on a reference axis 21A01. The operation of partitioning the point cloud data into one or more circular sector-shaped bricks may be referred to as circular sector brick tiling.

The point cloud data 21A00 represents point cloud data acquired by the point cloud data transmission device. The point cloud data 21A00 contains a plurality of points.

The reference axis 21A01 refers to an axis serving as a reference for partitioning the point cloud data into one or more circular sectors 21A02. The reference axis 21A01 may represent the center of a 3D space (e.g., a bounding box) occupied by the point cloud data. For example, the reference axis may be an axis that extends through the center of the x-axis and y-axis of the 3D space and is perpendicular to the x-y plane. For example, the reference axis may be an axis that extends through the center of the y-axis and z-axis of the 3D space and is perpendicular to the y-z plane. For example, the reference axis may be an axis that extends through the center of the x-axis and z-axis of the 3D space and is perpendicular to the x-z plane.

According to embodiments, the point cloud data may be partitioned into one or more circular sectors based on the reference axis 21A01 including the origin of the circular sectors. According to embodiments, when one or more circular sectors are determined, each unit may include points including position information or attribute information.

The reference axis 21A01 according to the embodiments may be determined based on information representing the center point information. The center point information according to embodiments may be, for example, central_node_xyz. The reference axis 21A01 according to the embodiments may be determined as the shortest axis that passes through the center point information among the x-axis, y-axis, and z-axis of the 3D space.

The circular sector 21A02 means a brick for partitioning point cloud data according to embodiments. The circular sector 21A02 contains points. The circular sector 21A00 may represent an arc-shaped region radiating about the reference axis by the central angle 21A02-1.

According to embodiments, each of the partitioned circular sectors 21A02 may have the same or different radii 21A02-1. The radius 21A02-1 of the circular sector 21A02 may be determined based on the density of the point cloud data. The radius 21A02-1 according to embodiments may be indicated by bounding_box_radius.

The point cloud data transmission device according to the embodiments may partition the point cloud data into circular sectors 21A02 having various central angles 21A02-2. The point cloud data transmission device according to the embodiments may determine the central angle of each circular sector. The central angle of the circular sectors may be determined based on the density of the point cloud data.

When the point cloud data is composed of a plurality of frames, the point cloud data transmission device according to the embodiments may determine the shape of the partitioned regions based on the movement direction 21A03 of an object contained in the point cloud data. When the point cloud data is composed of a plurality of frames, the movement direction of the object contained in the point cloud data (e.g., the direction pointed by a blue arrow) may be defined. The movement direction of the object according to the embodiments may be indicated by moving_direction_vector.

Information about a bounding box (a 3D space occupied by the point cloud data) according to embodiments may be defined for each frame, or may be determined by coordinate information (e.g., x, y, z information) about each frame. According to embodiments, when information about the identical bounding box is applied to all frames, use_identical_bounding_box_information_flag may be transmitted.

According to embodiments, the point cloud data transmission device may differently perform encoding on each frame using a different quantization coefficient, a different geometry compression technique, a different attribute compression technique, and single/multiple attributes.

The point cloud data transmission device according to the embodiments may effectively encode a data sequence including a plurality of frames, such as LiDAR data or data for self-driving, by performing circular sector brick tiling.

The point cloud data transmission device according to the embodiments may signal a brick with only radius information and angle information about the brick by performing circular sector brick tiling, thereby reducing complexity of the reception device. In addition, by performing circular sector brick tiling, encoding through position information prediction may be improved when the same distribution of points is given in the same circular sector.

Figure 22:
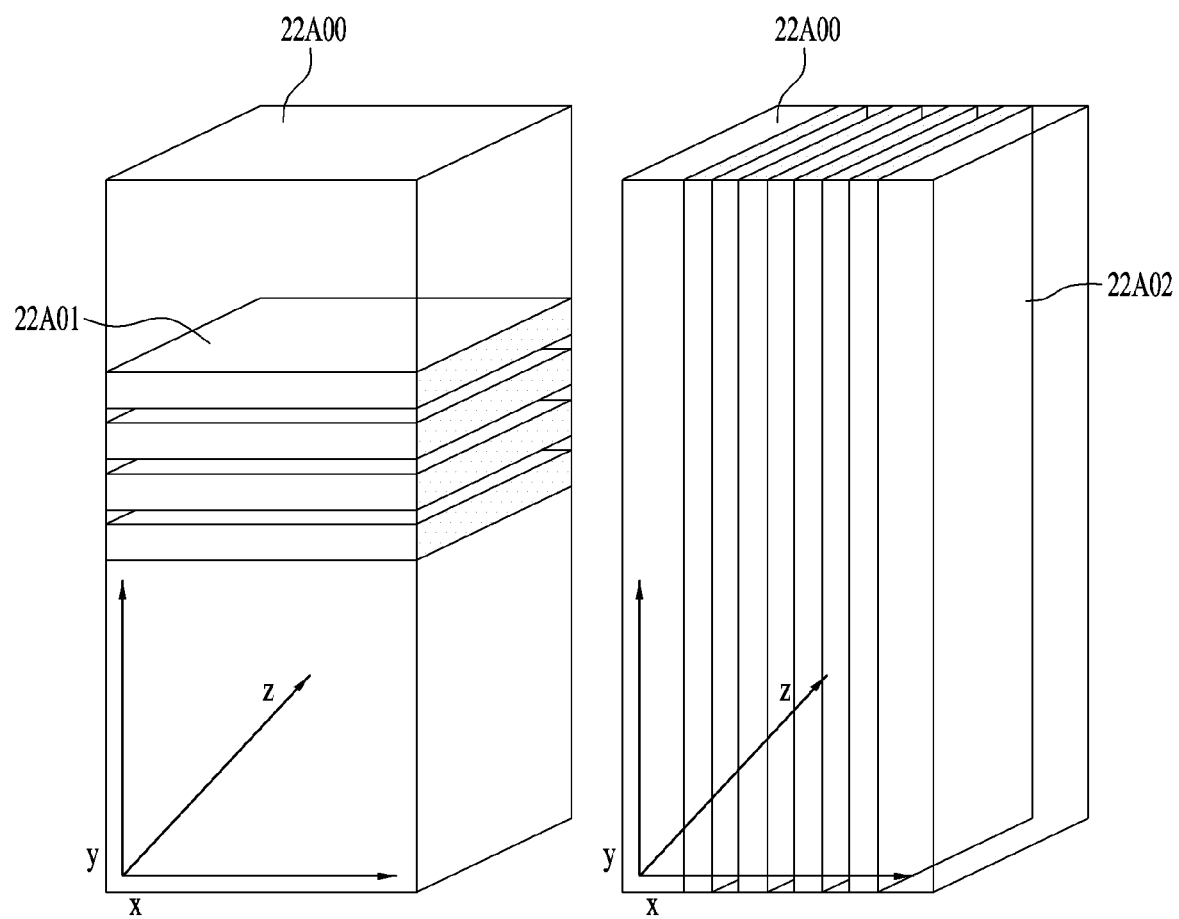
FIG. 22 illustrates a method of partitioning point cloud data into one or more regions by a point cloud data transmission device according to embodiments.

FIG. 22 illustrates a method of partitioning point cloud data into one or more regions by a point cloud data transmission device according to embodiments.

FIG. 22 shows that the point cloud data transmission device partitions a 3D space occupied by the point cloud data or the point cloud data 22A00 into one or more layers 22A01 or 22A02. The point cloud data transmission device according to the embodiments may encode the point cloud data for each partitioned layer 22A02.

The operation according to the partitioning method illustrated in FIG. 22 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of FIG. 12, the XR device 1430 of FIG. 14, and the like. In addition, the bricks described in this figure may correspond to slices, and vice versa. In this document, a brick may be referred to as a slice.

The operation illustrated in FIG. 22 may be performed by, for example, the space partitioner 15001 of FIG. 15, the data characteristic checker 16000 of FIG. 16, the brick tiling unit 16001 of FIG. 16, and the data input unit 12000 of FIG. 12.

The point cloud data transmission device according to the embodiments may partition the point cloud data 22A00 into one or more layers 22A01. The method of partitioning the point cloud data into one or more layers 22A01 according to the embodiments may be referred to as layer brick tiling.

The layer 22A01 according to the embodiments may correspond to or be referred to as a tile, a slice, a brick, or a block according to the embodiments.

The point cloud data transmission device according to the embodiments may sort the point cloud data before partitioning the point cloud data into one or more layers. The point cloud data transmission device may sort the point cloud data in an ascending order, a descending order, or a Morton code order. The operation of sorting the point cloud data according to the embodiments may be performed by the space partitioner 15001 of FIG. 15, the brick tiling unit 16001 of FIG. 16, or the data characteristic checker 16000 of FIG. 16. The point cloud data transmission device according to the embodiments may generate information (e.g., enable_sorting_flag) indicating a method of sorting the point cloud data according to the embodiments, and transmit the information in the form of a bitstream.

The layer 22A01, 22A02 may represent a set of point cloud data included in a predetermined range of the x-axis, y-axis, or z-axis of the 3D space occupied by the point cloud data. That is, the layer 22A01, 22A02 may be composed of a set of points.

The layer 22A01 shown on the left in FIG. 22 may represent a set of points of all point cloud data having y-coordinate information in a specific range. Accordingly, according to embodiments, the point cloud data may be composed of a plurality of layers in a range of y-coordinate information about the points. The layers shown on the left in FIG. 22 may be referred to as x-z layers (or y-direction layers).

The layer 22A02 shown on the right in FIG. 22 may represent a set of points of all point cloud data having x-coordinate information in a specific range. Accordingly, according to embodiments, the point cloud data may be composed of a plurality of layers in a range of x-coordinate information about the points. The layers shown on the right in FIG. 22 may be referred to as y-z layers (or x-direction layers).

Similarly, the point cloud data may be composed of a plurality of layers in a range of z-coordinate information about points. The layers shown on the left in FIG. 22 may be referred to as x-y layers (or z-direction layers). According to embodiments, the point cloud data may be partitioned into one or more x-direction layers, y-direction layers, or z-direction layers.

Point cloud data according to embodiments may be composed of a plurality of layers formed based on the temporal movement of the points.

The point cloud data transmission device according to the embodiments may perform progressive coding on one or more layers. The progressive coding according to the embodiments may mean progressively performing encoding on each sorted layer.

The point cloud data transmission device according to the embodiments may partition the point cloud data into one or more layers. Thus, when point cloud data in one frame are gathered in a specific region (e.g., attribute information values consecutively leftward, rightward, upward, downward, forward, or backward), compression may be effectively applied of the data characteristic.

By partitioning the point cloud data into one or more layers, the point cloud data transmission device according to the embodiments may improve the degree of association of position information within a brick, thereby increasing encoding efficiency.

Figure 23:
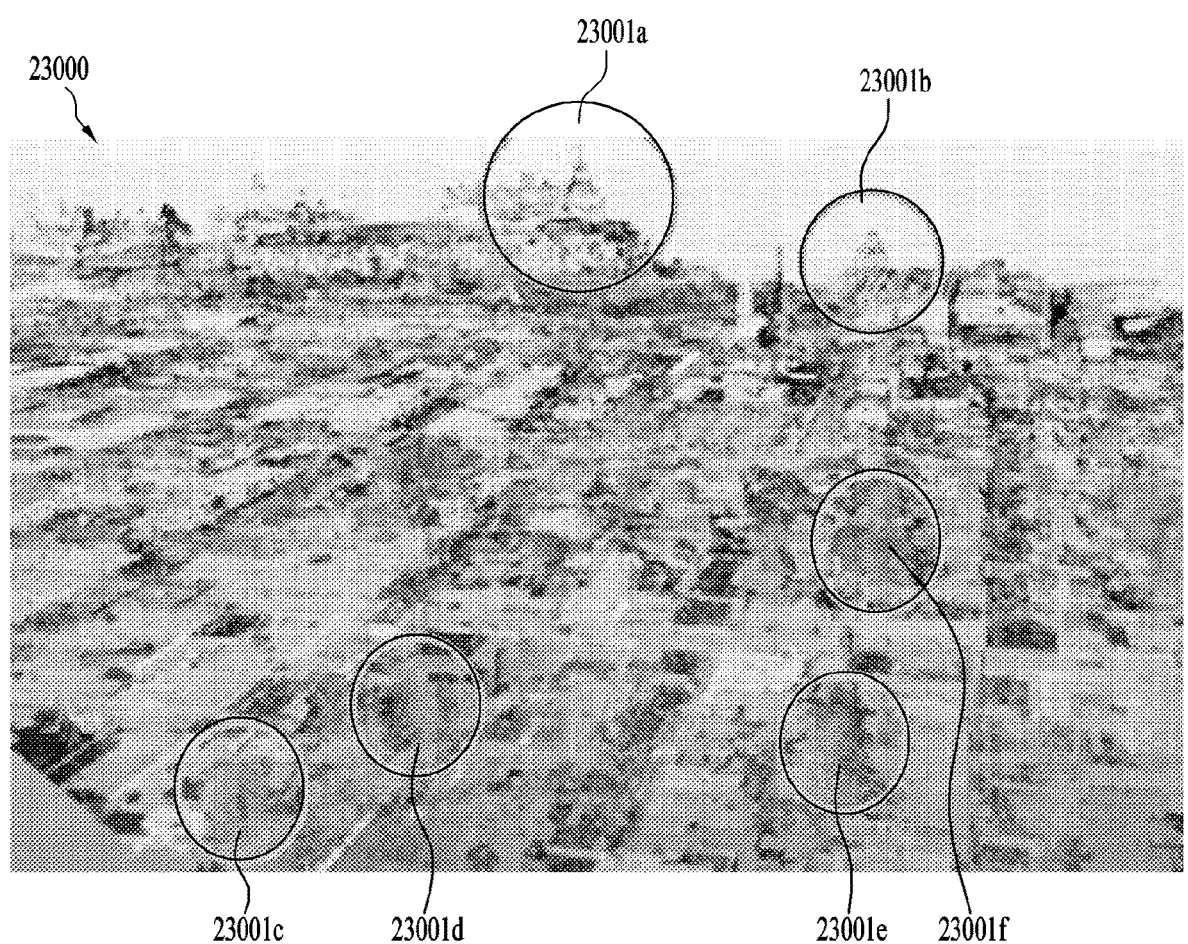
FIG. 23 illustrates a method of partitioning point cloud data into one or more regions by a point cloud data transmission device according to embodiments.

FIG. 23 illustrates a method of partitioning point cloud data into one or more regions by a point cloud data transmission device according to embodiments.

FIG. 23 shows that the point cloud data transmission device partitions a 3D space occupied by point cloud data or the point cloud data into one or more spherical/oval regions 23001a to 23001f. The point cloud data transmission device according to the embodiments may encode the point cloud data for each of the one or more spherical/oval regions 23001a to 23001f. The operation of partitioning the point cloud data illustrated in FIG. 23 may be performed by the space partitioner 15001 of FIG. 15 and the brick tiling unit 16001 of FIG. 16. The operation illustrated in FIG. 23 may be performed by, for example, the data input unit 12000 of FIG. 12.

The operation according to the partitioning method illustrated in FIG. 23 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of FIG. 12, the XR device 1430 of FIG. 14, and the like. In addition, the bricks described in this figure may correspond to slices, and vice versa. In this document, a brick may be referred to as a slice.

In embodiments, the spherical/oval regions 23001a to 23001f may correspond to or be referred to as tiles, slices, bricks, or blocks.

The point cloud data transmission device according to the embodiments may accurately encode points positioned in an important region in the point cloud data 23000 or perform encoding less accurately on an unimportant portion. For example, when the point cloud data 23000 is data representing a specific city as shown in FIG. 23, there may be a portion to be accurately encoded in the encoding process of the point cloud data transmission device. For example, the regions 23001a to 23001f marked with a circle or an ellipse in FIG. 23 may be portions to be accurately encoded in the encoding process. In particular, when the amount of the point cloud data is large, but a region to be accurately encoded is specified as a specific region, encoding the entire point cloud data cause latency in the transmission/reception process.

Accordingly, in order to efficiently encode the point cloud data, the point cloud data transmission device according to the embodiments may partition the point cloud data 2300 into one or more spherical regions (or oval regions) 23001a to 23001f, and perform encoding on the partitioned spherical regions 23001a to 23001f.

The point cloud data 23000 may be data containing one or more points. The point cloud data 23000 may contain one or more regions on which encoding is to be performed using a specific method (or regions that need to be accurately encoded in performing encoding, etc.). The region on which encoding is to be performed using the specific method may be formed in a circular (or spherical) shape as shown in 23001a and 23001b of FIG. 23, or an oval shape (or a distorted sphere shape) as shown in 23001c to 23001f of FIG. 23. It may also be formed. A region formed in a circular (or spherical) shape may be referred to as a spherical region (or circular brick). A region formed in an oval shape (or a distorted sphere shape) may be referred to as an oval region (or an ellipsoidal region).

The method of partitioning point cloud data into one or more spherical or oval regions may be referred to as spherical/oval region tiling.

According to embodiments, when point cloud data is presented based on a spherical coordinate system or a geographic coordinate system, the point cloud data may be partitioned into spherical regions. According to embodiments, various coordinate systems (such as a cylindrical coordinate system) may be used according to the shape of the brick.

The point cloud data transmission device according to the embodiments may partition the point cloud data into one or more spherical regions 23001a and 23001b or oval regions 23001c to 23001f. The point cloud data transmission device according to the embodiments may generate sphere_or_oval_flag indicating whether the bricks of the point cloud data are spherical regions or oval regions, and transmit the same in a bitstream.

The point cloud data transmission device according to the embodiments may generate information about each of the spherical regions and/or the oval regions, and transmit the information in a bitstream. For example, the point cloud data may contain information related to the shape of each of the spherical regions or the oval regions.

The spherical regions 23001a and 23001b may represent bricks configured in a spherical shape. The spherical regions 23001a and 23001b may refer to sets of points of point cloud data in circular or spherical regions in a bounding box. The point cloud data transmission device may generate center point information (e.g., center_point_xyz) and radius information (radius_distance) about each of the spherical regions 23001a and 23001b, and transmit the same in a bitstream form for each brick.

The oval regions 23001c to 23001f may refer to bricks configured in an oval shape or a prolate shape. The oval regions 23001c to 23001f may refer to sets of points of point cloud data in a circular or spherical region in the bounding box. The point cloud data transmission device may generate center point information (e.g., center_point_xyz), radius information (radius_distance), azimuth angle information (azimuth_angle) about each of the oval regions 23001c to 23001f, and transmit the same in a bitstream form for each brick.

The point cloud data transmission device according to the embodiments may use spherical/oval region tiling, thereby effectively performing encoding in a sequence in which a portion of the data having an object present in a space and a portion having no object are distinguished from each other.

The point cloud data transmission device according to the embodiments may provide a high compression rate for data having position information distributed in a circular shape, such as a VP-tree, by performing spherical/oval region tiling.

Figure 24:
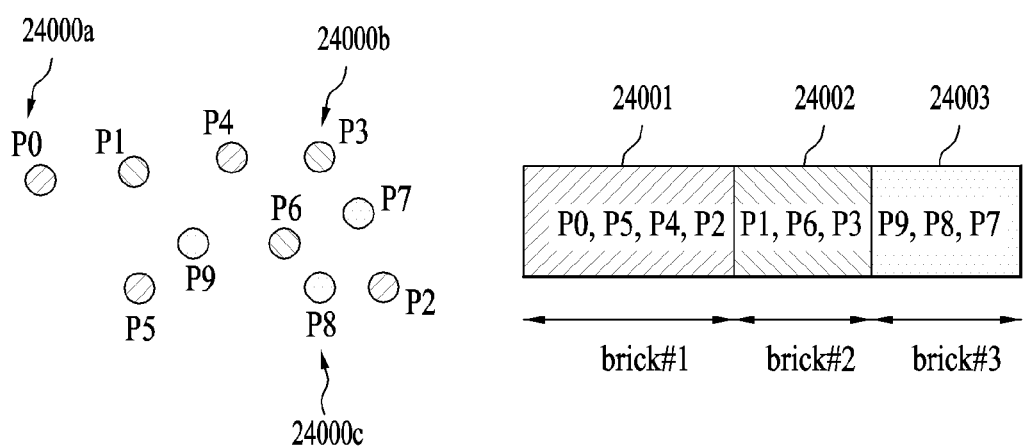
FIG. 24 illustrates a method of partitioning point cloud data into one or more regions by a point cloud data transmission device according to embodiments.

FIG. 24 illustrates a method of partitioning point cloud data into one or more regions by a point cloud data transmission device according to embodiments.

The operation according to the partitioning method illustrated in FIG. 24 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of FIG. 12, the XR device 1430 of FIG. 14, and the like. The bricks illustrated in this figure may correspond to slices, and vice versa. In this document, a brick may be referred to as a slice.

FIG. 24 illustrates that the point cloud data transmission device partitions or point cloud data 24000 or a 3D space occupied by the point cloud data into attribute-based regions 24001 to 24003. The point cloud data transmission device according to the embodiments may encode the point cloud data for each of one or more attribute-based regions 24001 to 24003. The operation of partitioning the point cloud data illustrated in FIG. 24 may be performed by the space partitioner 15001 of FIG. 15 and the brick tiling unit 16001 of FIG. 16. The operation illustrated in FIG. 24 may be performed by, for example, the data input unit 12000 of FIG. 12.

The point cloud data transmission device according to the embodiments may partition the point cloud data based on attribute information about the points in the point cloud data 24000. For example, the point cloud data transmission device may configure one or more regions according to attributes (color, reflectance, transparency, time information, object index, etc.) constituting the point cloud data. According to embodiments, the method of partitioning regions based on attribute information may be referred to as attribute-based region tiling (e.g., attribute-based brick tiling).

The left part of FIG. 24 illustrates a plurality of points 24000a to 24000c in a bounding box. The plurality of points may include, for example, points P0, P2, P4, and P5 of a red color, points P7, P8, and P9 of a blue color, and points P1, P3, and P6 of a green color. The point cloud data transmission device according to the embodiments may partition the data into one or more regions (e.g., bricks) according to the colors of the points.

The right part of FIG. 24 illustrates that a plurality of points 24000a to 24000c is partitioned into three bricks 24001, 24002, and 24003. For example, the points P0, P2, P4, and P5 having a red color may be partitioned into a first brick 24001, and the points P7, P8, P9 having a blue color may be partitioned into a second brick 24002, and points P1, P3, and P6 having a green color may be partitioned into a third brick 24003.

The point cloud data transmission device according to the embodiments may check attribute information about a plurality of points before partitioning the plurality of points into one or more regions based on the attribute information. The operation of checking the attribute information about the plurality of points may be performed by the data characteristic checker 16000 of FIG. 16. For example, in the point cloud data according to the embodiments, points of red color may be checked among the points. For example, the operation of checking points of the red color may be performed based on the values of RGB information about the points.

The point cloud data transmission device according to the embodiments may transmit, in the form of a bitstream, information indicating whether attribute-based region tiling according to the embodiments has been performed on the point cloud data. In addition, when the attribute-based region tiling has been performed, the point cloud data transmission device according to the embodiments may transmit referenced_attribute_type, which is a reference for partitioning, in the form of a bitstream. The reference for partitioning according to the embodiments may include a plurality of attribute types. The reference may be referenced_attribute_type_range or referenced_attribute_type_value.

The point cloud data transmission device according to the embodiments may adopt the attribute-based region tiling according to the embodiments. Thereby, encoding may be effectively performed in a sequence including one attribute information value or multiple pieces of geometry information corresponding to a similar value.

Figure 25:
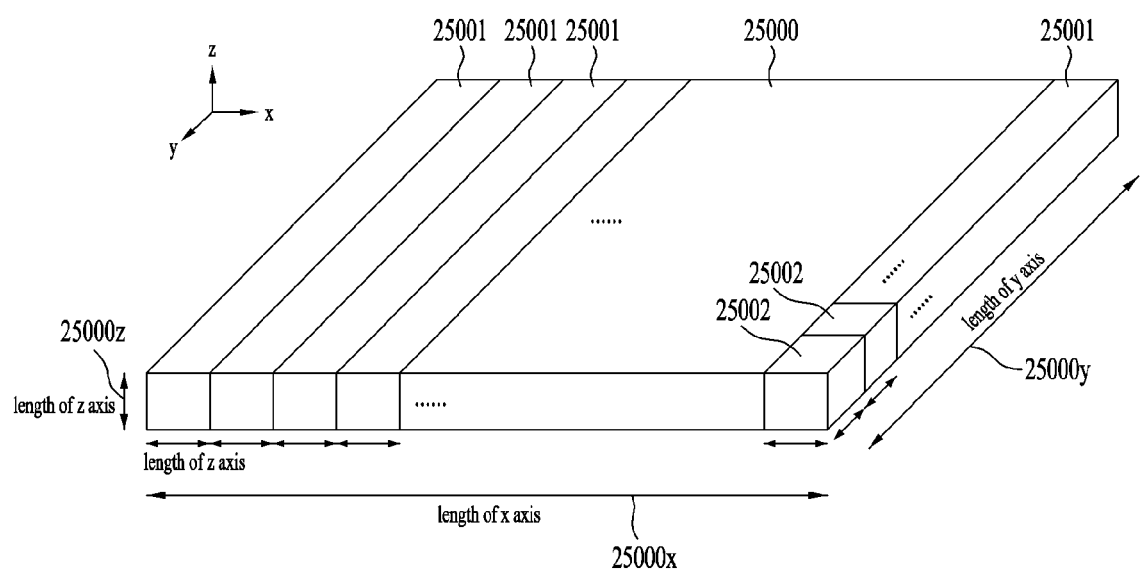
FIG. 25 illustrates a method of partitioning point cloud data into one or more regions by a point cloud data transmission device according to embodiments.

FIG. 25 illustrates a method of partitioning point cloud data into one or more regions by a point cloud data transmission device according to embodiments.

The operation according to the partitioning method illustrated in FIG. 25 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of FIG. 12, the XR device 1430 of FIG. 14, and the like. The bricks illustrated in this figure may correspond to slices, and vice versa. In this document, a brick may be referred to as a slice.

FIG. 25 illustrates that the point cloud data transmission device partitions point cloud data 25000 or a 3D space occupied by the point cloud data into regions 25001 and 25002 based on the lengths of the axes of the bounding box. The point cloud data transmission device according to the embodiments may encode the point cloud data for each of the partitioned regions 25001 and 25002 based on one or more of the lengths of the axes of the bounding box. The operation of partitioning the point cloud data illustrated in FIG. 25 may be performed by the space partitioner 15001 of FIG. 15 and the brick tiling unit 16001 of FIG. 16. According to embodiments, the operation of partitioning the data into the partitioned regions 25001 and 25002 (for example, bricks) based on the lengths of the axes of the bounding box may be referred to as adaptive axis length-based region tiling (or adaptive axis length-based brick tiling). The operation illustrated in FIG. 25 may be performed by, for example, the data input unit 12000 of FIG. 12.

The point cloud data 25000 may contain one or more points. The point cloud data may be contained in a 3D space (e.g., a bounding box). A 3D space (e.g., a bounding box) according to embodiments may be represented as an x-axis, a y-axis, and a z-axis.

For the point cloud data 25000, for example, the length of one of the x-axis, y-axis and z-axis may be shorter or significantly shorter than the lengths of the other two axes. For example, there may be point cloud data that expresses a terrain that is widely distributed along two axes except one axis. If the point cloud data transmission device performs encoding on the points in the bounding box regardless of the lengths of the axes, encoding efficiency may be degraded. Accordingly, the point cloud data transmission device needs to partition the data into one or more regions in adaptation to the lengths of the axes of the 3D space. Therefore, the point cloud data transmission device according to the embodiments may calculate the relative lengths of the x-axis, y-axis, and z-axis, and partition the point cloud data into one or more regions based on the calculated relative lengths.

The point cloud data transmission device (for example, the tile partitioner 16000 of FIG. 16) according to the embodiments may configure one or more slices (or first bricks) 25001 by partitioning the longest axis (e.g., the x-axis) among the a length of an x-axis 25000$x$, a length of a y-axis 25000$y$, and a length of the z-axis 25000$z$ into units of the length of the shortest axis (e.g., the z-axis). The data partitioned into the one or more slices (or first bricks) may be units that may be encoded and decoded in parallel.

The point cloud data transmission device according to the embodiments (for example, the tile partitioner 18000 of FIG. 18 or the tiling unit 19001 of FIG. 19) may re-partition some bricks 25001 of the first bricks. In the re-partitioning according to the embodiments, one or more sub-slices (or second bricks) may be configured by partitioning the axis of the longest length of some of the first bricks (that is, the y-axis 25000y in the case of the brick 25001 of FIG. 25) into units of the length of the shortest axis (e.g., the x-axis or the z-axis). The data partitioned into the one or more sub-slices (or second bricks) 25002 may be units that may be encoded and decoded in parallel.

The point cloud data transmission device according to the embodiments may perform partitioning based on min/max information about points without conforming to a spatial data distribution with a maximum number and a minimum number (maxPointNum, minPointNum) of points in the first bricks.

The point cloud data transmission device according to the embodiments may determine whether to re-partition the first bricks or the second bricks, based on the number of points in the regions, the size of the space allocated by each of the regions, and the density of points included in the regions. According to embodiments, spatial re-partitioning may be space-adaptively performed, and may include partitioning slices based on a specific axis and re-partitioning slices based on a middle-length axis.

The point cloud data transmission device according to the embodiments may adopt the adaptive axis length-based region tiling according to the embodiments, thereby effectively performing encoding in a sequence associated with a spatial unit within one frame of point cloud data including a large terrain feature. The point cloud data reception device according to embodiments may effectively decode the point cloud data including the large terrain feature.

The transmission device according to the embodiments may partition point cloud data (or points in a tile) into one or more slices. The slices according to embodiments may be configured such that the points included in the respective slices do not overlap each other in a 3D space. Alternatively, the slices according to the embodiments may be configured such that the points included in the respective slices overlap each other in a region in a 3D space. In this way, the transmission device may configure slices to include an overlapping region in a 3D space, and these slices may be referred to as overlapping slices. By configuring overlapping slices, the transmission device according to the embodiments may encode point cloud data to enable real-time processing/low latency, scalability, and parallel processing.

The transmission device according to the embodiments may configure the overlapping slices while partitioning the point cloud data. Before encoding the point cloud data, the transmission device according to the embodiments may partition the point cloud data (original data) into tiles that may have information about a bounding box. A tile is the smallest possible spatial unit for parallel encoding by the transmission device or parallel decoding by the reception device.

A tile according to embodiments may be composed of slices, which are the smallest unit capable of defining a data structure. A slice is a set of points constituting point cloud data, and may consist of 550,000 to 1.1 million points. The slices according to the embodiments may include overlapping spatial regions.

Before the encoding/decoding process is actually performed, the point cloud data according to the embodiments may be partitioned into N tiles, and each of the tiles may be composed of N slices. The operation of partitioning the point cloud data into one or more tiles may be performed by the tile constructor included in the transmission device, and the operation of partitioning a tile into one or more slices may be performed by the slice configuration unit of the transmission device. In this case, various methods may be used to partition the point cloud data into one or more slices to include overlapping spatial regions.

The transmission device (e.g., the slice configuration unit) may partition the point cloud data (or points in a tile) into one or more overlapping slices based on a method of multi-point sampling-based overlapping slice configuration, a method of importance-based overlapping slice configuration, a method of attribute range-based overlapping slice configuration, or a method of Morton code order-based overlapping slice configuration, according to the characteristic of the point cloud data.

The slice configuration unit according to the embodiments may include at least one of a multi-point sampling-based overlapping slice configuration unit, an importance-based overlapping slice configuration unit, an attribute range-based overlapping slice configuration unit, and a Morton code order-based overlapping slice configuration unit. The above-described methods will be described in detail with reference to FIGS. 26 to 30.

The transmission device according to the embodiments may include a sequential input slice configuration unit for each tile that sequentially partitions slices in the tile output unit in configuring overlapping slices such that the corresponding slice partitioner does not wait for a time for which another tile is partitioned. The above-described method will be described in detail with reference to FIG. 31.

A sequential input slice configuration unit for each tile that sequentially partitions slices in the tile output unit in configuring overlapping slices may be included such that the corresponding slice partitioner does not wait for a time for which another tile is partitioned. Various slice configuration methods for each tile may be used.

Figure 26:
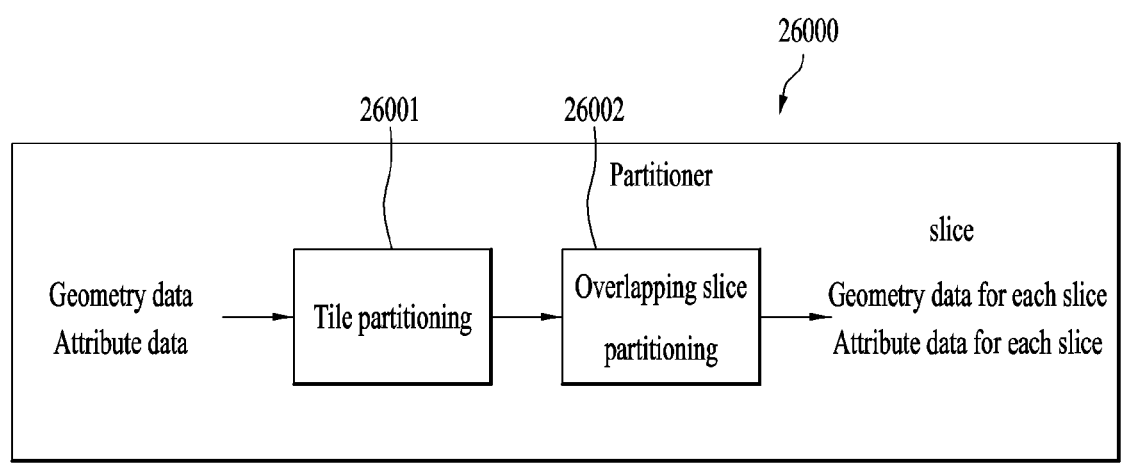
FIG. 26 illustrates a partitioner of a point cloud data transmission device according to embodiments.

FIG. 26 illustrates a partitioner of a point cloud data transmission device according to embodiments.

The partitioner 26000 illustrated in FIG. 26 may be implemented by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of FIG. 12, the XR device 1430 of FIG. 14, and the like. The bricks illustrated in this figure may correspond to slices, and vice versa. In this document, a brick may be referred to as a slice.

The point cloud data transmission device according to the embodiments may include the partitioner 26000. The partitioner 26000 according to the embodiments may refer to the space partitioner 15001 of FIG. 15 and the brick tiling unit 16001 of FIG. 16. The partitioner 26000 illustrated in FIG. 26 may be a component included in, for example, the data input unit 12000 of FIG. 12.

The partitioner 26000 according to the embodiments may receive geometry data and/or attribute data according to the embodiments. The partitioner 26000 may partition the received geometry data and/or attribute data into one or more slices, and output geometry data (bitstream) for each slice and/or attribute data (bitstream) for each slice.

The partitioner 26000 according to the embodiments may include a tile partitioner 26001 and/or a slice partitioner 26002. The point cloud data transmission device according to the embodiments may partition the point cloud data into one or more tiles based on the geometry data and attribute data before performing slice partitioning according to the embodiments.

The partitioner 26000 according to the embodiments may divide or partition the points of the point cloud data according to the embodiments into one or more slices. The slices according to the embodiments may include regions overlapping each other among the regions in a 3D space. Accordingly, the slice partitioner of the point cloud data transmission device according to the embodiments may be referred to as an overlapping slice partitioner 26002.

The tile partitioner 26001 partitions the acquired point cloud data according to the embodiments into one or more tiles.

The slice partitioner 2602 may partition the points of the point cloud data in a tile into one or more slices. For example, when there are 100 points in a tile, the slice partitioner 2602 may partition the tile into 10 slices each containing 10 points. In this case, the slices each composed of 10 points may overlap each other. That is, some of the one or more slices may include an overlapping region.

The slice partitioner 26002 according to the embodiments may partition the points of point cloud data or a tile into one or more slices, and output a geometry bitstream for each slice and an attribute bitstream for each slice. After the overlapping slice partitioning is performed, the transmission device according to the embodiments may independently output a pair of a geometry bitstream and an attribute bitstream for each slice, and the combiner may decode the same.

The partitioner 26000 according to the embodiments may configure slices by partitioning points such that an overlapping region between slices is included in a tile. The partitioner 26000 or the slice partitioner 26002 according to the embodiments may generate overlapping slice composition information (or flag) (overlapping_slice_compose_flag) indicating whether to configure slices to include an overlapping region.

When the value of overlapping_slice_compose_flag according to the embodiments indicates that overlapping slices are not configured (this may be referred to as non-overlapping slice partitioning), the partitioner according to the embodiments may perform partitioning based on the axis-based slice configuration method or the octree-based slice configuration method described above.

When the value of overlapping_slice_compose_flag according to the embodiments indicates that overlapping slices are configured (this may be referred to as overlapping slice partitioning), the partitioner according to the embodiments may partition the points based on the multi-point sampling-based overlapping slice configuration method, the importance-based overlapping slice configuration method, the attribute range-based overlapping slice configuration method, the Morton code order-based overlapping slice configuration method, or the like.

When the slice partitioner 2602 according to the embodiments performs the sequential input slice partitioning for each tile without a waiting state in performing slice partitioning for each tile, the slice partitioner may signal, to the reception device, information (sequential_input_slice_configuration_in_tile_flag) indicating whether partitioning is performed based on this method.

The slice partitioner 2602 according to the embodiments may transmit, to the encoder according to the embodiments, information (overlapping_slice_compose_method) indicating a partitioning method used by the encoding device to transmit a geometry bitstream and an attribute bitstream. Various partitioning methods may be used within a tile. In this case, a partitioning method may be signaled for each slice.

A method of partitioning points in a tile or points of point cloud data into one or more slices to include an overlapping region (that is, the method of overlapping slice partitioning) will be described in detail with reference to FIG. 27 and subsequent figures.

The slice partitioner 26000 according to the embodiments may also be referred to as a slice configuration unit. The slice configuration unit according to the embodiments may configure slices according to embodiments based on a partitioning method such as multi-point sampling-based overlapping slice configuration, importance-based overlapping slice configuration, attribute data range-based overlapping slice configuration, sequential input-based overlapping slice configuration, or Morton code order-based overlapping slice configuration, according to the characteristic of the point cloud data. According to embodiments, slices partitioned based on various slice configuration methods may be included in a tile.

Figure 27:
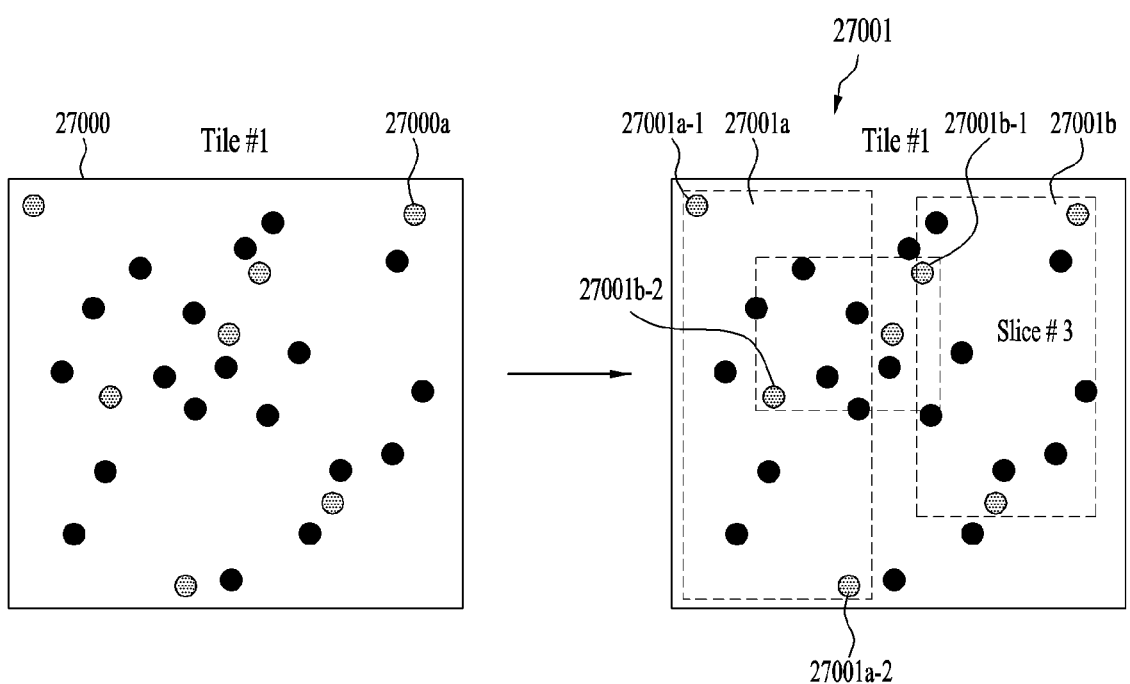
FIG. 27 illustrates a method of partitioning an overlapping slice according to embodiments.

FIG. 27 illustrates a method of partitioning an overlapping slice according to embodiments.

FIG. 27 illustrates multi-point sampling-based overlapping slice configuration, which is an example of a method of partitioning an overlapping slice according to embodiments. The slice partitioning illustrated in FIG. 27 may be performed by the partitioner 26000 or the slice partitioner 26002 of FIG. 26. In addition, the slice partitioning method illustrated in FIG. 27 may be performed by the space partitioner 15001 of FIG. 15 and the brick tiling unit 16001 of FIG. 16. The operation illustrated in FIG. 27 may be performed by, for example, the data input unit 12000 of FIG. 12.

The operation according to the partitioning method illustrated in FIG. 27 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of FIG. 12, the XR device 1430 of FIG. 14, and the like. The bricks illustrated in this figure may correspond to slices, and vice versa. In this document, a brick may be referred to as a slice.

The multi-point sampling-based overlapping slice according to the embodiments represents a method of configuring one or more slices with N points randomly sampled in a tile as illustrated in FIG. 27.

The transmission device according to the embodiments may perform sampling using points close to the edges of the x, y, and z axes in a tile 27000 in order to partition the tile into one or more slices. For example, in order to configure a first slice 27001a, the transmission device according to the embodiments may sample the closest point 27001a-2 on the horizontal axis (e.g., x-axis) in a tile 27001, and the closest point 27001a-1 on the vertical axis (e.g., y-axis) in the tile. A method to derive points close to the edges of the x, y, z axes in the tile 27000 is to calculate a point with the least values of x, y, and z coordinates or a point with the greatest point values of x, y, and z coordinates in a 3D space (bounding box). The transmission device according to the embodiments may configure a slice to include the two sampled points 27001a-1 and 27001a-2.

The transmission device according to the embodiments may sample points 27001b-1 and 27001b-2 in the tile 27000 to partition the tile according to the embodiments into one or more slices. The transmission device according to the embodiments may configure a slice 27001b to include the two sampled points 27001b-1 and 27001b-2.

The transmission device according to the embodiments may use a method of deriving N points separated by a specific distance as a method of deriving sampled points among the points according to the embodiments. The transmission device according to the embodiments may generate a slice using two or more points, and also create a bounding box of slices. The transmission device according to the embodiments may reuse a point sampled to configure a bounding box in one slice to configure a bounding box of another slice. In this case, an overlapping slice may be configured.

The transmission device according to the embodiments may configure slices composed of sampled points, and may generate a set including identifiers of points included in each slice. In this case, there may be points that cannot be included in the slice may occur, and the reception device may configure one or more slices with only these points. Alternatively, the reception device may configure slices by adding these points to the slice with the smallest number of points.

For each slice composed of sampled points, the reception device according to the embodiments may check whether distribution of the points corresponds to the minimum number of points (e.g. 550,000) and the maximum number of points (e.g. 1,100,000). When the slice does not satisfy distribution of the above-described number of points, the reception device may generate a new bounding box by sampling other points among the points in the tile, and then determine whether the generated bounding box corresponds to the distribution of the number of next points.

Due to this configuration, when the reception device quantizes, sorts, offsets, and scales points belonging to different slices in one slice, it may enhance scalability for point cloud compression, and effectively transfer information about the user's ROI.

Figure 28:
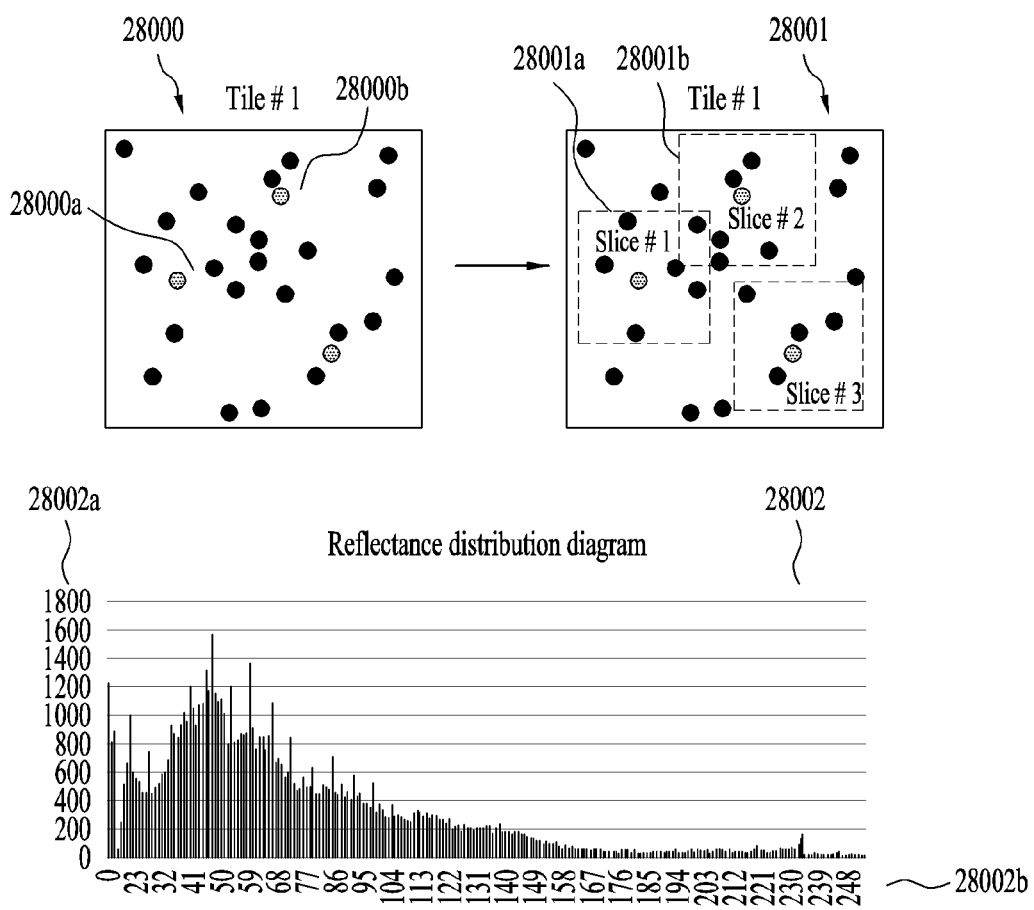
FIG. 28 illustrates a method of partitioning an overlapping slice according to embodiments.

FIG. 28 illustrates a method of partitioning an overlapping slice according to embodiments.

The operation according to the partitioning method illustrated in FIG. 28 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of FIG. 12, the XR device 1430 of FIG. 14, and the like. The bricks illustrated in this figure may correspond to slices, and vice versa. In this document, a brick may be referred to as a slice.

FIG. 28 illustrates importance-based overlapping slice configuration, which is an example of the method of partitioning an overlapping slice according to the embodiments. The slice partitioning illustrated in FIG. 28 may be performed by the partitioner 26000 of FIG. 26 or the slice partitioner 26002. In addition, the slice partitioning illustrated in FIG. 27 may be performed by the space partitioner 15001 of FIG. 15 and the brick tiling unit 16001 of FIG. 16. The operation illustrated in FIG. 28 may be performed by, for example, the data input unit 12000 of FIG. 12.

The method of importance-based overlapping slice configuration according to the embodiments refers to a method of sampling one or more points of high importance within one tile and configuring one or more slices with the sampled points as illustrated in FIG. 28.

As shown in FIG. 28, the transmission device according to embodiments may sample points of high importance within one tile and configure one or more slices based on the sampled points. A point of high importance may be distinguished by the transmission device according to embodiments by a color value or a reflectance value selected as a representative value from among the attribute values within a tile.

The importance-based representative value according to the embodiments may be referred to as a representative point.

For example, for the color value, there may be more points having similar colors in a specific space (or a neighboring space), and accordingly the transmission device according to the embodiments may specify a point having a representative color value (or the value itself) for each tile or each 3D space. The transmission device according to the embodiments may generate a slice having a 3D shape centered on the point specified to a representative value as a bounding box. The 3D shape centered on the point specified to the representative value may be, for example, a cubic shape, a spherical shape, a cuboid shape, or a cylindrical shape. The transmission device according to the embodiments may configure one slice with the points included in a range of the 3D shape centered on the point specified to the representative value.

There may be various methods to derive or find a point having an importance-based representative value according to embodiments. For example, the transmission device according to the embodiments may determine one or more of points of a color most widely distributed as points having an importance-based representative value after deriving distribution of attribute values. For example, a reflectance distribution diagram 28002 depicting the distribution of attribute values based on reflectance values of points in a 3D space or tile is shown at the bottom of FIG. 28.

Referring to the reflectance distribution diagram 28002, for example, the x-axis represents reflectance values 28002$b$, and the y-axis represents the number of points 28002$a$ having a corresponding reflectance value. For example, referring to the reflectance distribution diagram 28002 shown in FIG. 28, there may be many points having reflectance ranging from 32 to 50 in a corresponding 3D space or tile, and the number of points having reflectance greater than or equal to 140 may be less than 200. Accordingly, the transmission device according to the embodiments may take, for example, points having reflectance of 47 as points having an importance-based representative value with reference to the reflectance distribution diagram 28002.

Further, for example, referring to the reflectance distribution diagram 2802 shown in FIG. 28, there may be a plurality of points for a specific reflectance in the 3D space or tile, depending on the characteristic of data. For example, the number of points having reflectance values of 0, 15, 28, 50, 62, etc. may be larger than the number of points having the other reflectance values. These reflectance values may be referred to as peak values. In this case, the transmission device according to the embodiments may determine these reflectance values as points having a importance-based representative value.

The transmission device according to the embodiments may specify a point having a peak value among the attribute data according to the embodiments as a representative point. Further, the transmission device according to the embodiments may specify a point having an attribute data value most similar to the average value of the attribute data as a representative point. The transmission device according to the embodiments may also specify a point having an average value of the attribute data, a point having an attribute value similar to the average value, or a point having the minimum value/maximum value of the attribute data, as the representative point.

The transmission device according to the embodiments may configure a slice including points in a bounding box in a cubic shape or a cuboid shape that occupies spaces reaching a predetermined distance from the representative points upward, downward, leftward, rightward, forward and backward, respectively. The transmission device according to the embodiments may configure a slice including points in a sphere-shaped bounding box occupying spaces reaching a specific distance from the representative points. According to embodiments, points that do not belong to the slice may belong to the nearest slice, and the transmission device according to the embodiments may separately configure another slice using these points.

When the point cloud data is partitioned based on the method illustrated in FIG. 28, the transmission device according to the embodiments may signal signaling information (e.g., value_based_overlapping_slice_partition) for the partitioning to the transmission device.

Due to this configuration, the reception device quantizes, aligns, offsets, and scales points belonging to different slices in one slice, thereby achieving scalability for point cloud compression and delivering about information about the user's ROI.

Figure 29:
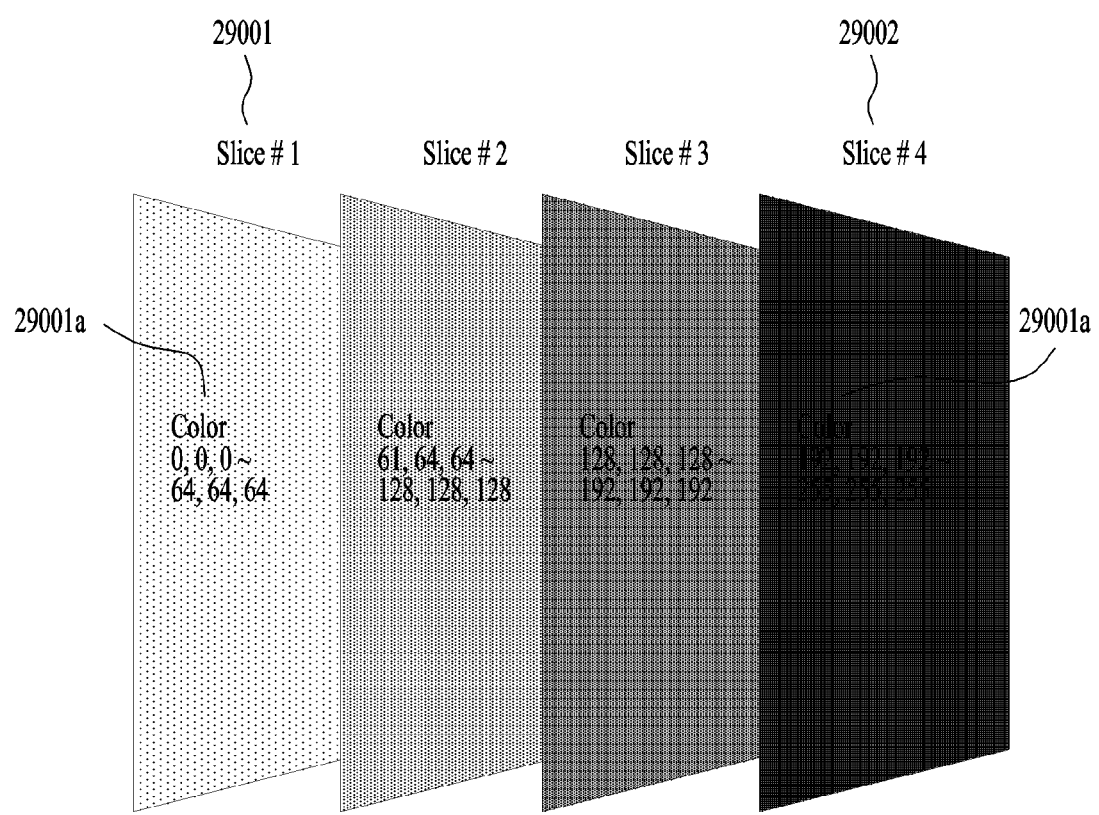
FIG. 29 illustrates a method of partitioning an overlapping slice according to embodiments.

FIG. 29 illustrates a method of partitioning an overlapping slice according to embodiments.

The operation according to the partitioning method illustrated in FIG. 29 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, and the encoder of FIG. 4, the transmission device of FIG. 12, the XR device 1430 of FIG. 14, and the like. In addition, the bricks illustrated in this figure may correspond to slices, and vice versa. In this document, a brick may be referred to as a slice.

FIG. 29 illustrates a method of configuring an overlapping slice based on an attribute data range, which is an example of a method of partitioning an overlapping slice according to embodiments. The slice partitioning method illustrated in FIG. 29 may be performed by the partitioner 26000 of FIG. 26 or the slice partitioner 26002. In addition, the slice partitioning method illustrated in FIG. 29 may be performed by the space partitioner 15001 of FIG. 15 and the brick tiling unit 16001 of FIG. 16. The operation illustrated in FIG. 29 may be performed, for example, in the data input unit 12000 of FIG. 12.

As shown in FIG. 29, the method of constructing an overlapping slice based on an attribute data range according to the embodiments refers to configuring one or more slices by deriving (sampling) one or more points having an attribute value within a specific range in one tile.

The point cloud data transmission device according to the embodiments sorts points belonging to one tile or 3D space (in an ascending or descending order) based on the values of the attribute data and partitions the same into the range of the attribute data values to configure one or more slices.

The transmission device according to the embodiments may skip the sorting in ascending order for the attribute data of points of the point cloud data. Instead, it may allocate a range of attribute data values for each slice, and allocate points to slices based on the allocated range of attribute data values to configure slices.

For example, referring to FIG. 29, the transmission device according to embodiments may allocate a range of attribute data values (e.g., color values) to each of N slices. The transmission device according to the embodiments may check the attribute data of points and compare a range of attribute data values (e.g., color values) corresponding to the respective points. The transmission device according to the embodiments may configure a slice by inserting a point index into the slice. According to embodiments, a reference for the range of attribute data values (color values) may be a color value and a reflectance value. According to embodiments, since one or more slices are partitioned based on attribute data values, slices may overlap each other based on a bounding box. This method may be used in a scenario in which, when point cloud data according to embodiments is decoded, a value in a range of specific attribute data should be decoded first.

In addition to the method of allocating a range of values of attribute data, the transmission device according to the embodiments may automatically determine the range of values of attribute data according to a distribution diagram of the attribute data to perform partitioning. Similar to the reflectance distribution of the overlapping slices based on importance, the distribution of attribute data according to the embodiments may be partitioned based on the attribute value of a representative point. The representative point may correspond to an average value of the attribute data and a similar attribute value.

According to embodiments, when the transmission device partitions a slice based on the attribute data value, selecting a neighbor node tends to decrease the residual value because the range of attribute data values is narrower than that of the entire sequence. Accordingly, when a slice is partitioned based on a range of values of attribute data according to the embodiments, the compression rate may increase.

When the point cloud data is partitioned based on the method illustrated in FIG. 29, the transmission device according to the embodiments may signal the partitioning to the transmission device through signaling information (e.g., attribute_range_based_slice_partition).

Figure 30:
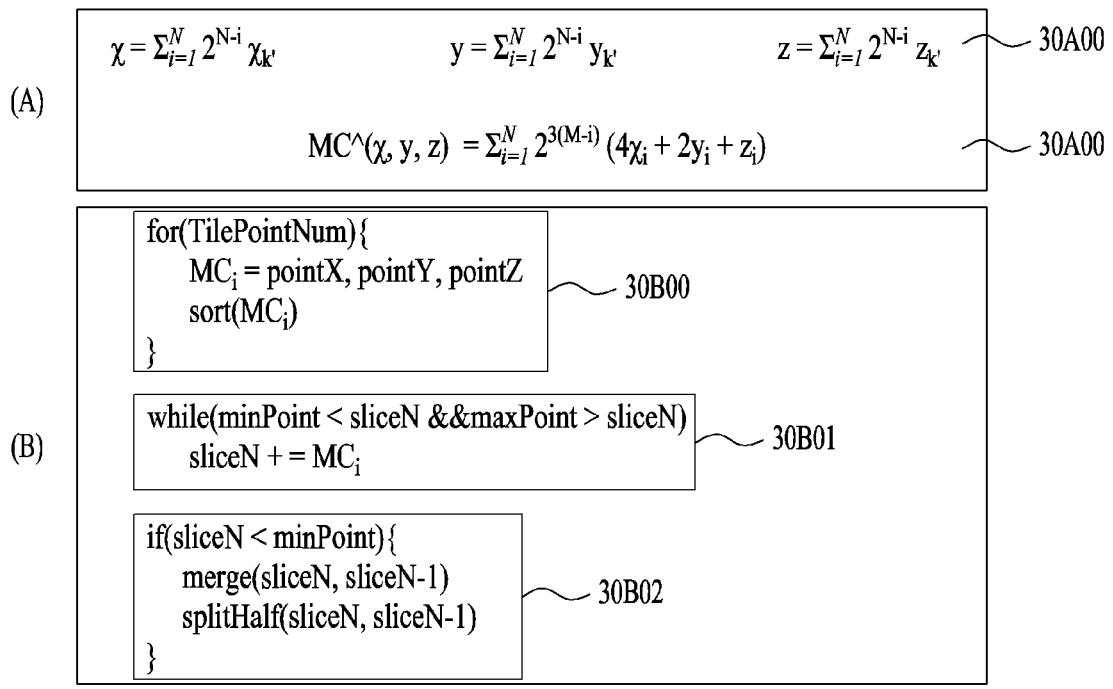
FIG. 30 illustrates a method of partitioning an overlapping slice according to embodiments.

FIG. 30 illustrates a method of partitioning an overlapping slice according to embodiments.

The operation according to the partitioning method illustrated in FIG. 30 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, and the encoder of FIG. 4, the transmission device of FIG. 12, the XR device 1430 of FIG. 14, and the like. In addition, the bricks illustrated in this figure may correspond to slices, and vice versa. In this document, a brick may be referred to as a slice.

FIG. 30 illustrates a method of configuring an overlapping slice based on a Morton code, which is an example of a method of partitioning an overlapping slice according to embodiments. The slice partitioning method illustrated in FIG. 30 may be performed by the partitioner 26000 or the slice partitioner 26002 of FIG. 26. In addition, the slice partitioning method illustrated in FIG. 27 may be performed by the space partitioner 15001 of FIG. 15 and the brick tiling unit 16001 of FIG. 16. The operation illustrated in FIG. 30 may be performed by, for example, the data input unit 12000 of FIG. 12.

As shown in FIG. 30, the method of configuring an overlapping slice based on a Morton code according to embodiments refers to deriving a Morton code of points in one tile and configuring one or more slices. The Morton code according to the embodiments may be generated by the transmission device according to the embodiments, for example, the space partitioner 15001 of FIG. 15 or the brick tiling unit 16001 of FIG. 16.

The Morton code refers to a code generated by interleaving coordinate values (e.g., x-coordinate, y-coordinate, and z-coordinate values) of point position information (which may be present in geometry data) in units of bits. According to embodiments, points of point cloud data may have different Morton codes.

FIG. 30(A) shows an equation for generating a Morton code using coordinate values of points according to embodiments. For example, generating a Morton code according to the embodiments may include changing the coordinate values of a point to a binary number as shown in 30A00 of FIG. 30(A) and/or interleaving bits of the coordinate values expressed in binary numbers as shown in 30A01 of FIG. 30(A).

In FIG. 30(A), x_k, y_k, and z_k denote the k-th digit bits of the x coordinate value, y coordinate value, and z coordinate value, respectively. In FIG. 30(A), N denotes the total number of digits of the coordinate value expressed as a binary number. x_i, y_i, and z_i denote the i-th point among the points of the point cloud data according to the embodiments. MC(x, y, z) means a Morton code of a specific point according to embodiments. M denotes the total number of digits of the coordinate value of the point according to the embodiments.

The point cloud data transmission device may generate a Morton code by interleaving the bits of the coordinate values of the points. For example, the transmission device according to the embodiments may transform a coordinate value on each axis of a point into a binary number (30A00). The point cloud data transmission device according to the embodiments may generate a Morton code by sequentially interleaving coordinate values on the respective axes (30A01).

For example, it is assumed that a first point having coordinate values (3, 4, 5) as position information is interleaved. The transmission device may derive binary numbers (011, 100, 101) of the coordinate values on the respective axes of the first point (30A00). The transmission device may sequentially arrange the most significant bit (e.g., 0) of the x value among the coordinate values of the first point, the most significant bit (e.g., 1) of the y value among the coordinate values of the first point, and the most significant bit (e.g., 1) the z value among the coordinate values of the first point (e.g., 011). The transmission device may sequentially arrange the second most significant bit (e.g., 1) of the x value among the coordinate values of the first point, the second most significant bit (e.g., 0) of the y value among the coordinate values of the first point, and the second most significant bit (e.g. 0) of the z value among the coordinate values of the first point (e.g. 100). The Morton code according to the embodiments may include an array of the most significant bits of the coordinate values and an array of the second most significant bits of the coordinate values, which are consecutively arranged (e.g., 011100). The point cloud data transmission device (or Morton code generator) may sequentially arrange the least significant bit (e.g., 1) of the x value among the coordinate values of the first point, the least significant bit (e.g., 0) of the y value among the coordinate values of the first point, and the least significant bit (e.g., 1) of the z value among the coordinate values of the first point. The Morton code according to the embodiments may include an array of the least significant bits of the coordinate values, is arranged consecutive to the array of the most significant bits of the coordinate values and the array of the second most significant bits of the coordinate values, and arranged consecutively (e.g., 011100101) (30A01). The Morton code (e.g., 01110010) expressed as a binary number of the first point according to the embodiments may be expressed 299 in decimal.

The transmission device according to the embodiments may configure one or more slices according to the embodiments using Morton code order search (which may be referred to as a Z-order search) for the points of point cloud data. The Morton code order search may refer to searching Morton codes in ascending or descending order when position information about the points according to the embodiments is changed to Morton codes.

FIG. 30(B) illustrates a method of partitioning one or more slices by the transmission device according to embodiments, which uses Morton codes of points according to the embodiments. FIG. 30(B) illustrates a method of configuring an overlapping slice based on Morton codes according to embodiments.

The method of configuring an overlapping slice based on the Morton codes illustrated in FIG. 30(B) may include sorting the points in ascending or descending order based on Morton code values (30B00), partitioning the sorted points into slices such that the number of points in a slice is in a range from a minimum number of points (minPoint) to a maximum number of point (maxPoint) (30B01), and/or merging and re-partitioning slices each having points the number of which is outside the range from the minimum number of points (minPoint) to the maximum number of points (maxPoint) (30B02).

The transmission device according to the embodiments may generate one Morton code per point using the method of deriving Morton codes according to the embodiments (30B00). The transmission device according to the embodiments may sort the Morton codes for the respective points in ascending or descending order. Referring to 30B00 of FIG. 30(B), TilePointNum denotes the number of points in a tile according to embodiments. MC_i denotes the Morton code of the i-th point. sort(MC_i) denotes a function for sorting points in ascending order and/or descending order based on the Morton codes according to embodiments. The sorting method according to the embodiments (e.g., sorting in ascending order or descending order, etc.) may be transferred through signaling information transmitted from the transmission device to the reception device.

The transmission device according to the embodiments may partition the point cloud data into one or more slices using the sorted Morton codes according to the embodiments such that points within the range from the minimum number of points to the maximum number of points are distributed in each slice (30B01). For example, the transmission device according to the embodiments may insert indexes of the points in slices such that points within the range from the minimum number of points to the maximum number of points are included in each slice.

Referring to 30B01 of FIG. 30(B), minPoint may mean the minimum number of points present in one slice, and maxPoint may mean the maximum number of points present in one slice. minPoint and maxPoint mean the minimum number of points and the maximum number of points according to embodiments. sliceN denotes an N-th slice according to embodiments. For example, the transmission device according to the embodiments may generate N slices.

Referring to 30B02 of FIG. 30B, the transmission device may merge some of the generated N slices with other slices. The transmission device may split some of the generated N slices (into, for example, half (splitHalf)). For example, N−1 slices may be slices including maxPoint-1 points. In addition, the remaining one slice may be a slice including points whose number is smaller than (minPoint). The remaining one slice may be merged with some of the N−1 slices according to the embodiments, or may be split by the transmission device and merged with each of the N−1 slices.

When the point cloud data is partitioned based on the method illustrated in FIG. 30, the transmission device according to the embodiments may signal the partitioning as signaling information (e.g., morton_order_based_slice_partition) to be transmitted to the transmission device.

According to embodiments, the Morton code searches for all points present in a 3D space based on a close distance. Accordingly, the transmission device according to the embodiments may search for points close to a specific point with a small amount of computation, using the method of configuring an overlapping slice based on the Morton code.

In addition, due to the method of configuring the overlapping slice based on the Morton code according to the embodiments, the transmitter according to the embodiments may perform operation very quickly by deriving the Morton code, compared to the case of the spatial partitioning operation using the octree. In addition, by minimizing the overlapping space in space partitioning, point cloud data may be efficiently encoded.

Figure 31:
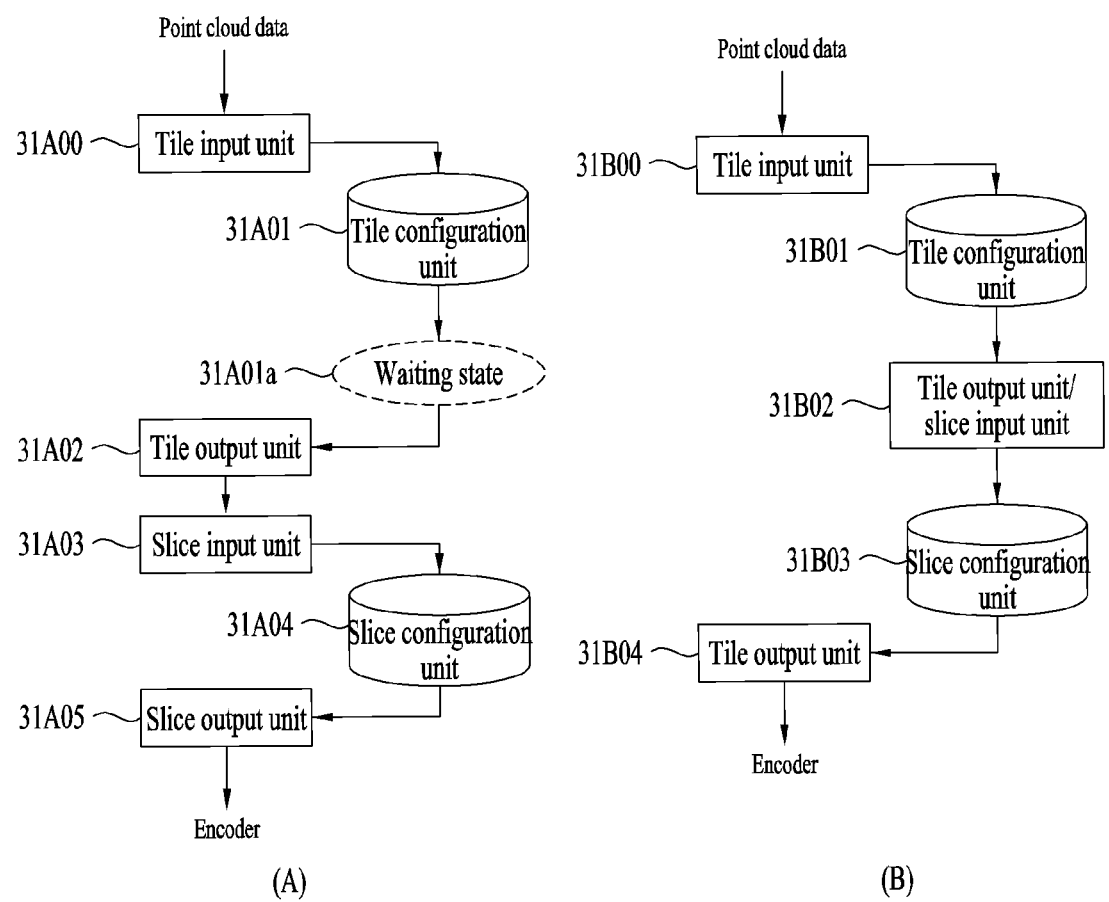
FIG. 31 illustrates a method of partitioning an overlapping slice according to embodiments.

FIG. 31 illustrates a method of partitioning an overlapping slice according to embodiments.

The operation according to the partitioning method illustrated in FIG. 31 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, and the encoder of FIG. 4, the transmission device of FIG. 12, the XR device 1430 of FIG. 14, and the like. The bricks illustrated in this figure may correspond to slices, and vice versa. In this document, a brick may be referred to as a slice.

FIG. 31 illustrates a method of configuring a slice for each tile, which is an example of a method of partitioning an overlapping slice according to embodiments. The method of configuring sequential input slices for each tile illustrated in FIG. 31 may be performed by the partitioner 26000 or the slice partitioner 26002 of FIG. 26. In addition, the method of configuring sequential input slices for each tile illustrated in FIG. 31 may be performed by the space partitioner 15001 of FIG. 15 and the brick tiling unit 16001 of FIG. 16. The operation illustrated in FIG. 31 may be performed by, for example, the data input unit 12000 of FIG. 12.

In the method of configuring the sequential input slices for each tile according to the embodiments illustrated in FIG. 31 refers to partitioning the point cloud data according to the embodiments into one or more tiles and partitioning each partitioned tile into one or more slices.

FIG. 31(A) illustrates an operation of partitioning point cloud data into tiles and partitioning each of the partitioned tiles into slices by a transmission device according to embodiments.

As illustrated in FIG. 31(A), the transmission device according to the embodiments may partition the point cloud data into one or more tiles based on the number of points (or data size) and the like, and store the partitioned tiles in a buffer. Data in the tiles stored in the buffer may be sequentially partitioned into one or more slices, and transmitted to the encoder according to the embodiments.

Accordingly, the transmission device according to the embodiments (or the space partitioner of FIG. 15) may include, for example, a tile input unit 31A00, a tile configuration unit 31A01, a tile output unit 31A02, a slice input unit 31A03, and a slice configuration unit 31A04, and/or a slice output unit 31A05.

The tile input unit 31A00 receives an input of the acquired point cloud data according to the embodiments.

The tile configuration unit 31A01 receives the point cloud data received by the tile input unit 31A00 according to the embodiments and partitions the point cloud data into one or more tiles. Before outputting a tile, the tile configuration unit 31A01 according to the embodiments may stay in a waiting state 31A01a until a tile received first is generated.

The tile output unit 31A02 outputs one or more tiles generated by partitioning the point cloud data.

The slice input unit 31A03 receives data for one tile to receive an input of points contained therein.

The slice configuration unit 31A04 generates (or partitions) one or more slices based on the points included in one tile input by the slice input unit 31A03.

The slice output unit 31A05 outputs the one or more generated slices. The output slices are individually transmitted to the encoder according to the embodiments.

The one or more partitioned slices according to the embodiments may or may not overlap each other in the space.

FIG. 31(B) illustrates an operation in which a transmission device according to embodiments partitions point cloud data into tiles and partitions the each of the partitioned tiles into slices.

As illustrated in FIG. 31(B), the transmission device according to the embodiments may partition the point cloud data into one or more tiles based on the number of points (or data size) and the like, and store the partitioned tiles in a buffer. Data in the tiles stored in the buffer may be sequentially partitioned into one or more slices, and transmitted to the encoder according to the embodiments.

Accordingly, the transmission device according to the embodiments (or the space partitioner of FIG. 15) may include, for example, a tile input unit 31B00, a tile configuration unit 31A01, a tile output unit 31B02, a slice input unit 31B02, and a slice configuration unit 31B03, and/or a slice output unit 31B04.

The tile input unit 31B00 receives an input of the acquired point cloud data according to the embodiments.

The tile configuration unit 31B01 receives the point cloud data received by the tile input unit 31B00 according to the embodiments and partitions the point cloud data into one or more tiles.

The tile output unit or slice input unit 31A02 generates the one or more tiles generated by partitioning the point cloud data, and receives data about the points included therein.

The slice configuration unit 31B03 generates (or partitions) one or more slices based on the points included in one tile input by the slice input unit 31B02.

The slice output unit 31B04 outputs the one or more generated slices. The output slices are individually transmitted to the encoder according to the embodiments.

The one or more partitioned slices according to the embodiments may or may not overlap each other in the space.

The transmission device according to the embodiments partitions the point cloud data into one or more slices as illustrated in FIG. 31(B). Accordingly, while the transmission device according to the embodiments configures a tile by tile size, other tiles may be separately partitioned into slices. Accordingly, due to the configuration as shown in FIG. 31(B), the transmission device may efficiently partition points into multiple slices quickly.

When the point cloud data is partitioned based on the method illustrated in FIG. 30, the transmission device according to the embodiments may signal the partitioning as signaling information (e.g., sequential_input_slice_configuration_in_tile) to be transmitted to the transmission device.

Figure 32:
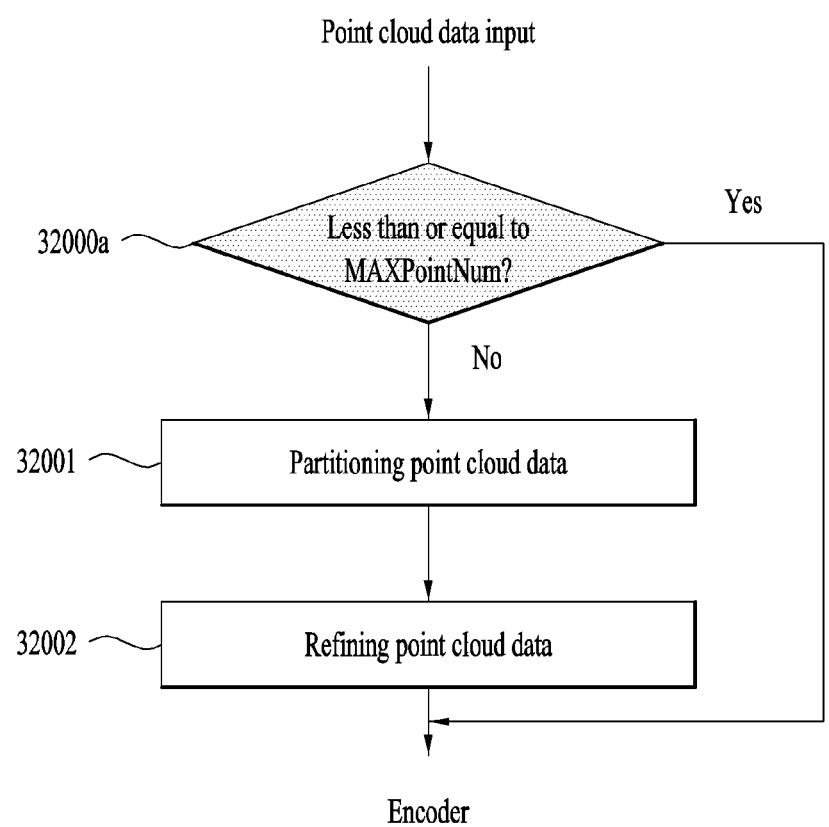
FIG. 32 illustrates an operation of partitioning point cloud data into one or more slices by a point cloud data transmission device according to embodiments.

FIG. 32 illustrates an operation of partitioning point cloud data into one or more slices by a point cloud data transmission device according to embodiments.

The operation of determining whether to perform partitioning illustrated in FIG. 32 may be performed by a combination of the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of FIG. 12, the XR device 1430 of FIG. 14, and the like. The bricks illustrated in this figure may correspond to slices, and vice versa. In this document, a brick may be referred to as a slice.

The operation illustrated in FIG. 32 may be performed by the point cloud data transmission device according to the embodiments, the space partitioner 15001 shown in FIG. 15, the data characteristic checker 16000, the brick tiling unit 16001 and the partitioned data input unit 16002 shown in FIG. 16, the partitioner 26000 shown in FIG. 26, and the like. The point cloud data transmission device (or space partitioner) according to the embodiments may partition the point cloud data into one or more slices. The operation illustrated in FIG. 32 may be performed by, for example, the data input unit 12000 of FIG. 12.

Before performing the partitioning according to the embodiments, the point cloud data transmission device according to the embodiments may first check a condition on which the slice partitioning operation is performed to determine whether the partitioning operation is performed.

When the number of points contained in one frame of the point cloud data is less than the maximum number of points (MaxPointNum) (Yes) before the partitioning operation is performed, the transmission device according to the embodiment may perform encoding by the encoder without the partitioning operation and the refinement operation (or the merging operation) according to the embodiments (Yes in 32000a).

The maximum number of points (MaxPointNum) according to the embodiments may be information (value) preset in the point cloud data transmission device or a value received and set by a user. According to embodiments, the maximum number of points may be determined based on the characteristic of the point cloud data. The maximum number of points according to the embodiments may be transmitted to the reception device according to the embodiments through signaling information.

As the maximum number of points according to the embodiments is set in the transmission device according to the embodiments, encoding efficiency of the encoder of the transmission device for the point cloud data, which is encoded on a slice-by-slice basis. The transmission device according to the embodiments may increase encoding efficiency in adaptation to the characteristic of the data by setting the maximum number of points based on the characteristic of the point cloud data.

Accordingly, the operation may include operation 32000a of checking the number of inserted points in one slice.

The number of inserted points in the slice may be greater than the maximum number of points (MaxPointNum). In this case, the point cloud data transmission device (or space partitioner) according to embodiments may partition the point cloud data (32001) and/or refine the point cloud data (32002).

The number of inserted points in the slice may be less than the maximum number of points (MaxPointNum). In this case, the point cloud data transmission device (or space partitioner) may encode the point cloud data by the encoder according to the embodiments, skipping the partitioning operation 32001 and the refining operation 32002.

The operation 32001 of partitioning the point cloud data may refer to the operation of partitioning the point cloud data (or points in a tile) described with reference to FIGS. 15 to 31. The point cloud data transmission device (or space partitioner) may further include a point cloud data partitioner configured to perform the operation 32001 of partitioning the point cloud data.

The operation 32002 of refining the point cloud data refers to an operation of refining the points in partitioned slices according to embodiments. The point cloud data transmission device (or space partitioner) may further include a point cloud data refiner configured to perform the operation 32002 of refining the point cloud data.

The refinement operation according to the embodiments may mean an operation of merging or splitting one or more slices according to the embodiments. For example, the transmission device may merge some of the slices for a specific purpose to generate one slice. Similarly, the transmission device may generate more slices by splitting each of some of the slices. The transmission device according to the embodiments may check the number of points in slices neighboring a specific slice to perform the refinement operation.

For example, when the number of points in one slice is greater than the maximum number of points (MaxPointNum) according to embodiments, the transmission device may split the slice into two or more slices. As another example, when the number of points in one slice is less than the minimum number of points (MinPointNum) according to embodiments, the transmission device may merge the slice with a neighbor slice.

For example, after the partitioning operation according to the embodiments (i.e., slice partition), the point cloud data transmission device according to the embodiments may split a splice having points whose number is greater than MaxPointNum into one or more sub-slices, or merge slices each having fewer points than MinPointNum into one slice.

Splitting is an example of the refinement operation according to the embodiments. When the point count (Asize) is greater than MaxPointNum, the slice including the corresponding points may be split into n partitions. The partitions may be slices. For example, n=ceil (Asize/MaxPointNum).

In the merging operation, when the point count of point cloud data in one slice is less than MinPointNum, the slice may be merged with either the prior slice or the next slice. The prior slice may refer to a slice with a slice index less than that of the current slice by 1, and the next slice may refer to a slice with a slice index greater than that of the current slice by 1.

The merging may be performed based on, for example, the following operation principle.

1) When the current slice is the first slice, the direction of merging is toward the next slice.
2) When the current slice is the end slice, the direction of merging is toward the prior slice.
3) There may be a case where the current slice is neither the first slice nor the end slice. When it is assumed that the sum of the points of the current slice and the prior slice is SumFront and the sum of the points of the current slice and the next slice is SumNext:
  a) If SumFront>MaxPointNum and SumNext>MaxPointNum or SumFront<MaxPointNum and SumNext<MaxPointNum, the direction of merging may be the direction of merging with the slice with more points;

b) Otherwise, the direction of merging may be the direction of merging with the slice with fewer points.

The transmission device according to the embodiments may traverse all merged slices after the merging and compare the same with SubMerged and MaxPointNum. Assume that SubMerged is the number of points in the merged slice. If SubMerged<MinPointNum, the transmission device may continue to perform merging for the current slice. If SubMerged>MaxPointNum, the transmission device may split the merged slice with the interval of MaxPointNum. If MinPointNum<SumMerged<MaxPointNum, the transmission device may keep the current slice and check the next slice.

The operation illustrated in FIG. 32 may be represented by a pseudo code as follows.

```
std::vector <Partition> curSlices;
|    |    switch (params->partition.method ||
|    |    inputPointCloud.getPointCount( )
|    |    < params->partition.sliceMaxPoints) {
|    |    case PartitionMethod::kNone:
|    |        return 1
|    |    case PartitionMethod::kUniformGeom:
|    |        partitionByUniformGeom( )
|    |    case PartitionMethod::kOctreeUniform:
|    |        partitionByOctreeDepth( )
``` params->partition.method indicates a partitioning method for the partitioning operation according to the embodiments. The partitioning method may be one of the methods illustrated in FIGS. 26 to 31.

inputPointCloud.getPointCount( ) may be a method for returning the number of points of point cloud data according to embodiments.

params->partition.sliceMaxPoints may indicate the maximum number of points that may be contained in one slice (or tile). That is, referring to the pseudo code, when the number of points of the input point cloud data is less than params->partition.sliceMaxPoints (or MaxPointNum), execution of partitionByUniform( ) and partitionByOctreeDepth( ) may be skipped and a single slice may be output as shown in the pseudo code. Referring to the pseudo code, when the number of points of the input point cloud data is greater than params->partition.sliceMaxPoints, the point cloud data according to the embodiments may be partitioned by executing the syntax of at least one of partitionByUniform( ) or partitionByOctreeDepth( ). For example, when the partitioning operation is signaled to be performed based on the slice partition scheme of the Uniform-Geometry partition along the longest edge shown in FIG. 19 (params->partition.method==PartitionMethod::kUniformGeom), partitioning may be performed based on this partition scheme (partitionByUniformGeom( )). For example, when the partitioning operation is signaled to be performed based on the slice partition scheme of Uniform-Geometry partitioning using Octree shown in FIG. 19 (params->partition.method==PartitionMethod::kOctreeUniform), partitioning may be performed based on this partition scheme (partitionByOctreeDepth( )).

Accordingly, the point cloud data transmission/reception device according to the embodiments may determine whether to perform data partitioning and/or data refinement based on the maximum number of points (MaxPointNum). When the number of points of the point cloud data is less than a specific value, the points may be quickly compressed or decoded without a separate process of partitioning or merging points.

Similarly, when the number of points of the point cloud data is greater than a specific value, operations such as data partitioning and/or data refinement may be additionally performed to process the data on an efficient data unit basis to increase encoding/decoding performance.

According to embodiments, the value of the maximum number of points (MaxPointNum) may be input by a user.

According to embodiments, MaxPointNum may be generated from system settings.

According to embodiments, MaxPointNum may be transmitted in a point cloud bitstream (see FIG. 38) as parameter information.

The transmission device according to the embodiments is not limited to the above-described pseudo code, and may perform the partitioning method based on the partitioning methods described with reference to FIGS. 26 to 31.

Figure 33:
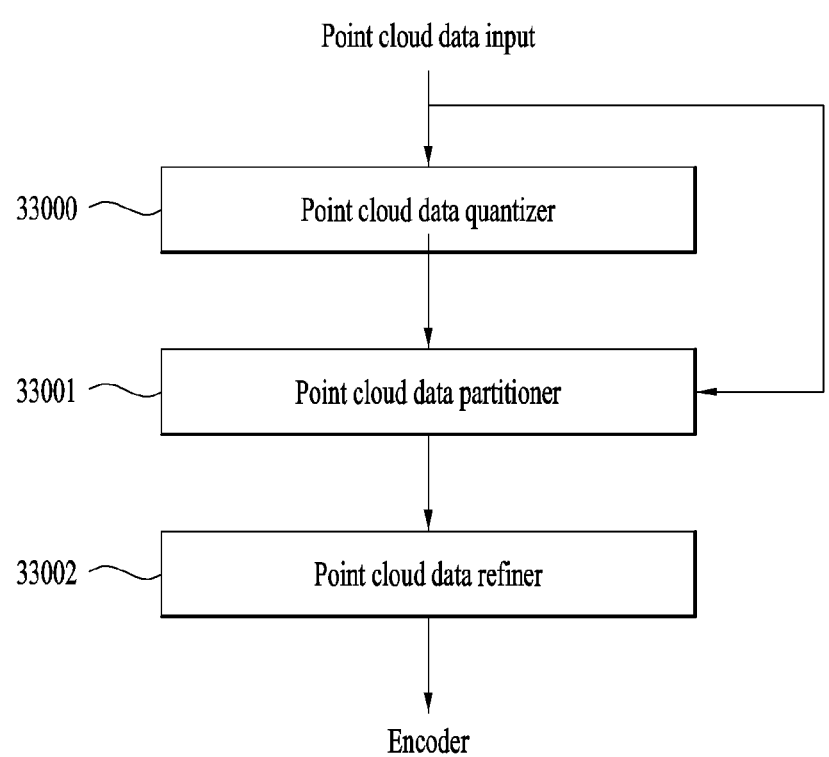
FIG. 33 illustrates an operation of partitioning point cloud data into one or more slices by a point cloud data transmission device according to embodiments.

FIG. 33 illustrates an operation of partitioning point cloud data into one or more slices by a point cloud data transmission device according to embodiments.

The partitioning operation illustrated in FIG. 33 may be performed by a combination of includes the transmission device 1000 of FIG. 1, the transmitter 10003 of FIG. 1, the point cloud video encoder 10002 of FIG. 1, the encoding 18001 of FIG. 2, the transmitter 18002 of FIG. 2, the encoder of FIG. 4, the transmission device of 12, the XR device 1430 of FIG. 14, and the like. The bricks illustrated in this figure may correspond to slices, and vice versa. In this document, a brick may be referred to as a slice.

When the transmission device (or the space partitioner included in the transmission device) according to the embodiments performs partitioning using the partitioning method according to the embodiments, a target to be partitioned may be pre-designated. The target to be partitioned may be various data.

As the input point cloud data according to embodiments, point cloud data on which quantization has not been performed may be input to the partitioner, or quantized point cloud data may be input to the partitioner. As the input point cloud data according to embodiments, point cloud data to which an offset is applied or not applied may be input to the partitioner.

Accordingly, the point cloud data transmission device (or partitioner) according to the embodiments may further perform an operation of quantizing the point cloud data before partitioning the point cloud data. The point cloud data transmission device (or space partitioner) may further include a point cloud data quantizer 33000 configured to quantize the point cloud data.

The point cloud data transmission device (or partitioner) according to the embodiments may partition the point cloud data into one or more slices without quantizing the point cloud data.

The point cloud data transmission device (or partitioner) according to the embodiments may generate and transmit signaling information indicating whether the quantization operation according to the embodiments has been performed. Accordingly, the point cloud data reception device according to the embodiments may perform decoding based on the signaling information indicating whether the quantization operation according to the embodiments has been performed.

The point cloud data quantizer 33000 according to the embodiments may perform some or all operations of the quantizer (Quantize and remove points (Voxelize)) 40001 shown in FIG. 4. For example, the quantizer 33000 may perform voxelization based on quantized positions to reconstruct quantized points.

Point positions are represented internally as non-negative d-bit integers before being encoded (compressed). In order for the transmission device (or quantizer) 33000 according to the embodiments to obtain these integers, the point positions in the internal coordinate system may be rounded. Let $X^{int}_n$ be a point position in the internal coordinate system. Then its representation as a non-negative d-bit integer may be $X_n = \text{Round}(X^{int}_n)$, where Round(•) is the function that rounds the components of a vector to the nearest integer.

According to embodiments, after such quantization by the transmission device (or the quantizer 33000), there may be multiple points with the same position, called duplicate points. The duplicate points removal process may be optionally performed by the transmission device (or the quantizer 33000). If the transmission device (or the quantizer 33000) is enabled, the transmission device (or the quantizer 33000) removes points with the same quantized coordinates. In order for the transmission device to detect duplicates according to embodiments, the STL set data structure may be leveraged (utilized).

Multiple points with the same quantized position and different attributes may be merged in a single point by the quantizer 33000 according to the embodiments.

Part or the entirety of the process of position quantization, duplicate point removal, and/or assignment of attributes to the remaining points by the quantizer 33000 according to the embodiments may be called voxelization. According to embodiments, voxelization may be the process of grouping points together into one or more voxels. The set of voxels may be the unit cubes [i−0.5, i+0.5)×[j−0.5, j+0.5)×[k−0.5, k+0.5) for integer values of i, j, and k between 0 and $2^d-1$. According to embodiments, the locations of all the points within a voxel may be quantized to the voxel center, and the attributes of all the points within the voxel may be combined or averaged and assigned to the voxel. According to embodiments, a voxel is said to be occupied if it contains any point of the point cloud.

The point cloud data partitioner 33001 and the point cloud data refiner 33002 according to the embodiments may be the point cloud data partitioner 32001 and the point cloud data refiner 32002 described with reference to FIG. 32. The operation of FIG. 33 according to the embodiments may be represented by the following pseudo code.

```
quantizedInputCloud = quantization(inputPointCloud)
switch (params->partition.method)
refineSlices(quantizedInputCloud)
```

The point cloud data transmission device according to the embodiments may perform operations such as data quantization, data partitioning, and data refinement in the encoding process.

The point cloud data transmission device according to the embodiments may skip the operation of the data quantization 33000 for efficient compression performance according to the type and attributes of the data. In addition, information about whether data quantization is performed may be transmitted in a bitstream (see FIG. 38) as signaling information. The point cloud data reception device according to embodiments may check whether data quantization is performed based on the information contained in the bitstream, and may reconstruct the point cloud data with low latency according to a reverse process at the transmitting side.

According to embodiments, quantization(inputPointCloud) represents an operation of the quantizer 33000 quantizing the point cloud data according to embodiments.

The switch (param->partition.method) represents an operation of partitioning the quantized point cloud data according to embodiments. For example, switch (param->partition.method) represents partitioning the quantized point cloud data into one or more slices according to a slice partitioning method. The operation of partitioning the quantized point cloud data may be the operation described above with reference to FIG. 32.

refineSlices(quantizedInputCloud) represents an operation of the transmission device according to the embodiments refining the point cloud data partitioned by the switch (param->partition.method) syntax. The operation of refining the point cloud data may be the operation described above with reference to FIG. 33.

Figure 34:
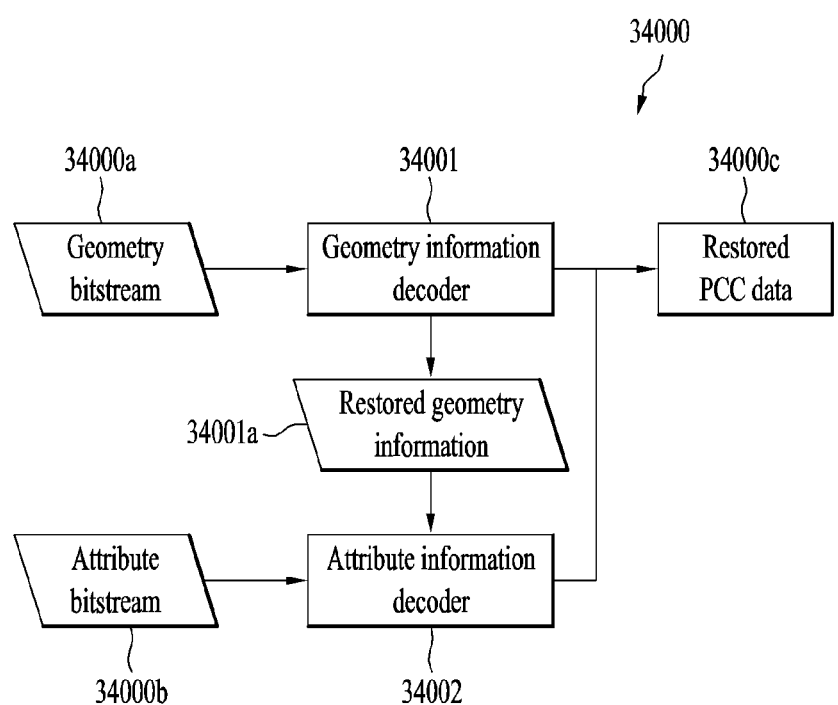
FIG. 34 illustrates a point cloud decoder according to embodiments.

FIG. 34 illustrates a point cloud decoder according to embodiments.

The partitioning operation illustrated in FIG. 34 may be performed by a combination of the reception device 10004 of FIG. 1, the receiving unit 10005 of FIG. 1, the point cloud video decoder 10006 of FIG. 1, the decoding 18003 of FIG. 2, the transmitter 18002 of FIG. 2, the decoders of FIGS. 10 and 11, the reception device of FIG. 13, the XR device 1430 of FIG. 14, and the like. The bricks illustrated in this figure may correspond to slices, and vice versa. In this document, a brick may be referred to as a slice.

A point cloud decoder 34000 according to the embodiments may include a geometry information decoder 34001 and/or an attribute information decoder 34002. According to embodiments, the point cloud decoder may be referred to as a PCC decoding device, a PCC decoding unit, a point cloud device, a point cloud decoding unit, a PCC decoder, or the like.

The geometry information decoder 34001 receives a geometry information bitstream 34000a of point cloud data. The geometry information decoder 34001 may decode the geometry information bitstream 34000a of the point cloud data and output attribute information about the restored point cloud data 34000c. The geometry information decoder 34001 may reconstruct the geometry information bitstream into geometry information and output the restored geometry information 34001. The geometry information bitstream 34000a may be the geometry information bitstream or geometry bitstream of FIG. 15. The attribute information bitstream 34000b may be the attribute information bitstream or attribute bitstream of FIG. 15.

The geometry information decoder 34001 restores the geometry information by decoding the received geometry information bitstream. The restored geometry information may be input to the attribute information decoder. The attribute information decoder 34002 restores the attribute information from an attribute information bitstream input thereto and the restored geometry information received from the geometry information decoder. The restored geometry information may be the geometry reconstructed by the geometry reconstructor (Reconstruct geometry) 11003 described with reference to FIG. 11. The restored geometry information may be an octree occupancy code reconstructed by the occupancy code-based octree reconstruction processor 13003 described with reference to FIG. 13.

The geometry information decoder 34001 receives the geometry information bitstream received by the reception device according to the embodiments. The geometry information decoder 34001 may decode the geometry information bitstream.

The geometry information decoder 34001 may perform all/part of the operations of the point cloud video decoder of FIG. 1, the decoding 20003 of FIG. 2, the geometry decoder of FIG. 10, the arithmetic decoder 11000 of FIG. 11, the octree synthesizer 11001 of FIG. 11, the surface approximation synthesizer 11002 of FIG. 11, the geometry reconstructor 11003 of FIG. 11, and/or the coordinate inverse transformer 11004 of FIG. 11.

The attribute information decoder 34002 receives the attribute information bitstream 34000*b* of point cloud data. The attribute information decoder 34002 may decode the attribute information bitstream 34000*b* of the point cloud data and output attribute information about the restored point cloud data 34000*c*. The attribute information decoder 34002 may decode the attribute information bitstream based on the restored geometry information 34001*a* generated by the geometry information decoder 34001.

The attribute information decoder 34002 receives the attribute information bitstream received by the reception device according to the embodiments. The attribute information decoder may decode the attribute information in the attribute information bitstream based on the restored geometry information. The geometry information and/or attribute information contained in the point cloud data may be decoded and restored PCC data.

The attribute information decoder 3402 may perform all/part of the operation of the point cloud video decoder of FIG. 1, the operation of the decoding 20003 of FIG. 2, the operation of the attribute decoder of FIG. 10, the operations of the inverse quantizer 11006, the RAHT 11007, the LOD generator 11008, the inverse lifter 11009, and/or the color inverse transformer 11010 of FIG. 11, and the operations of the arithmetic decoder 13007, the inverse quantization processor 13008, the prediction/lifting/RAHT inverse transform processor 13009, the color inverse transform processor 13010, and/or the renderer 13011 of FIG. 13.

Figure 35:
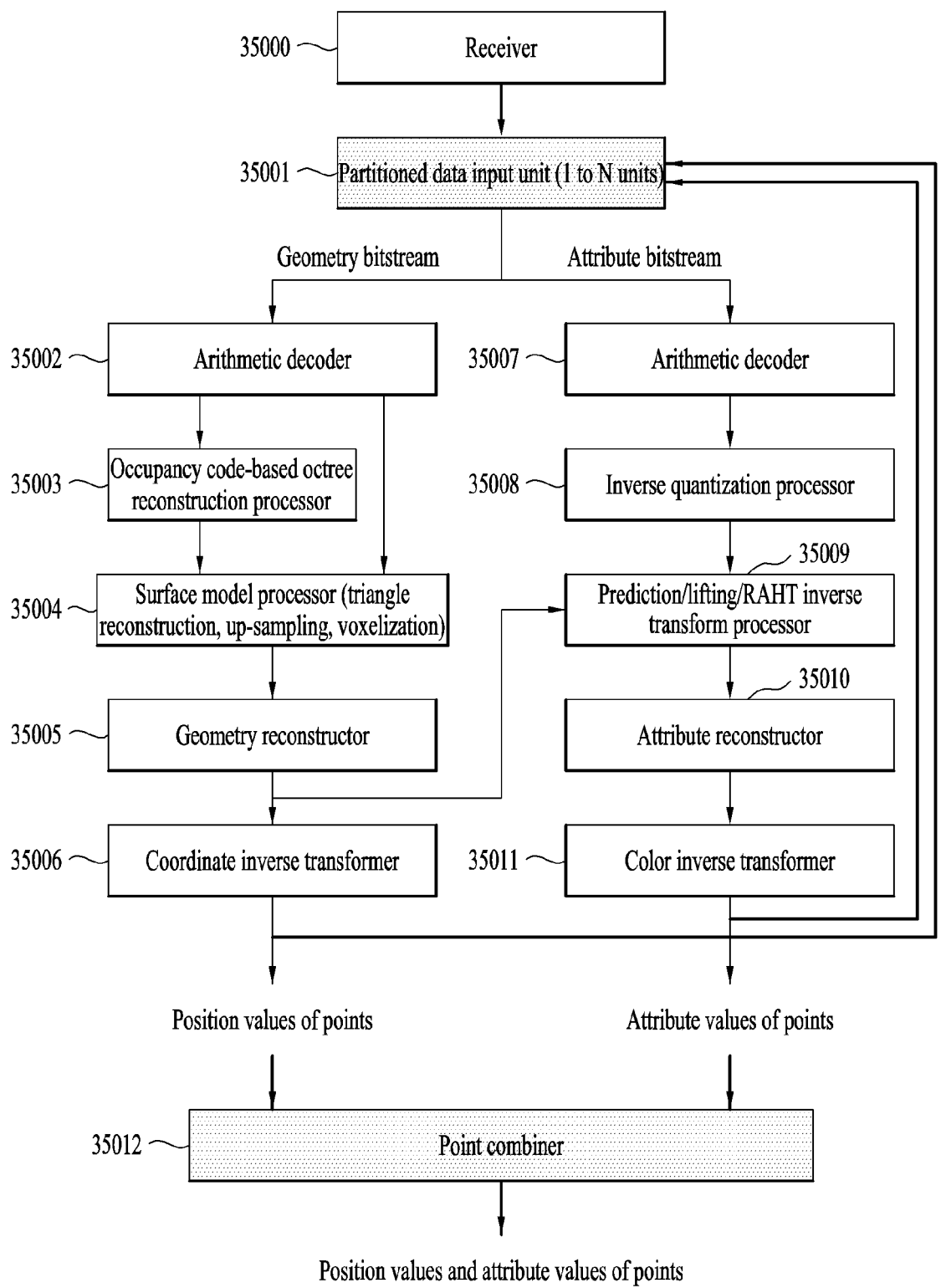
FIG. 35 illustrates a point cloud decoder according to embodiments.

FIG. 35 illustrates a point cloud decoder according to embodiments.

A part or all of the operations of the point cloud data decoder according to the embodiments shown in FIG. 35 may be performed by a combination of the reception device 10004 of FIG. 1, the receiver 10005 of FIG. 1, the point cloud video decoder 10006 of FIG. 1, the decoding 18003 of FIG. 2, the transmitter 18002 of FIG. 2, the decoders of FIGS. 10 and 11, the reception device of FIG. 13, the XR device 1430 of FIG. 14, and the like. The bricks illustrated in this figure may correspond to slices, and vice versa. In this document, a brick may be referred to as a slice.

The point cloud decoder according to the embodiments of FIG. 35 may be the point cloud data decoder 34000 according to the embodiments of FIG. 34. The point cloud decoder according to the embodiments may include a receiver 35000, a partitioned data input unit 35001, a first arithmetic decoder 35002, an occupancy code-based octree reconstruction processor 35003, a surface model processor 35004, a geometry reconstructor 35005, a coordinate inverse transformer 35006, a second arithmetic decoder 35007, an inverse quantization processor 35008, a prediction/lifting/RAHT inverse transform processor 35009, an attribute reconstructor 35010, a color inverse transformer 35011, and/or a point combiner 35012.

The operations of the components of the point cloud data decoder according to the embodiments shown in FIG. 35 may be performed on a brick-by-brick basis or may be independently performed on a brick-by-brick basis.

The receiver 35000 may receive a bitstream containing point cloud data according to embodiments. The receiver 35000 may transmit the received bitstream to the partitioned data input unit 35001. The receiver 35000 may perform the operations of the receiver 10007 of FIG. 1, the transmission 20002 of FIG. 2, and the receiver 13000 of FIG. 13.

The partitioned data input unit 35001 receives a bitstream containing point cloud data according to embodiments on a brick-by-brick basis, and outputs a geometry bitstream and an attribute bitstream of the point cloud data on the brick-by-brick basis to perform decoding on the brick-by-brick basis. The partitioned data input unit 35001 may transmit the geometric bitstream in a brick unit to the first arithmetic decoder 35002 and transmit the attribute bitstream in a brick unit to the second arithmetic decoder 35002.

When the bitstream received by the receiver 35000 contains signaling information (e.g., bistream_brick_decoding_flag) indicating that encoding has been performed on a brick-by-brick basis (or indicates that encoding has been performed on a brick-by-brick basis), the point cloud data reception device (the partitioned data input unit 35001) according to the embodiments may perform decoding on the received bitstream N times. The partitioned data input unit 35001 may perform the operations of the receiver 10007 of FIG. 1, the transmission 20002 of FIG. 2, and the reception processor 13001 of FIG. 13.

The first arithmetic decoder 35002 receives a geometry bitstream on a brick-by-brick basis. The first arithmetic decoder 35002 may decode the geometry bitstream. The first arithmetic decoder 29002 outputs the decoded geometry information.

The first arithmetic decoder 35002 may perform the operations of the point cloud video decoder 10006 of FIG. 1, the decoding 20003 of FIG. 2, the arithmetic decoder 11000 of FIG. 11, and the arithmetic decoder 13002 of FIG. 13.

The occupancy code-based octree reconstruction processor 35003 receives the decoded geometry information. The occupancy code-based octree reconstruction processor 35003 may reconstruct an occupancy-based octree based on the geometry bitstream in a brick unit. The occupancy code-based octree reconstruction processor 35003 may transmit the reconstructed octree to the surface model processor 35004.

The occupancy code-based octree reconstruction processor 35003 may perform the operations of the point cloud video decoder 10006 of FIG. 1, the decoding 20003 of FIG. 2, the octree analyzer 11001 of FIG. 11, and the occupancy code-based octree reconstruction processor 13003 of FIG. 13.

The surface model processor 35004 may perform surface model processing on the geometry information based on the geometry information decoded by the first arithmetic decoder 35002 and/or the octree reconstructed by the occupancy code-based octree reconstruction processor 35003. The surface model processing of the geometry information may include, for example, triangle reconstruction, up-sampling, and voxelization.

The surface model processor 35004 may perform the operations of the point cloud video decoder 10006 of FIG. 1, the decoding 20003 of FIG. 2, the surface approximation analyzer 11002 of FIG. 11, and the surface model processor 13004 of FIG. 13.

The geometry reconstructor 35005 receives the geometry information processed by the surface model processor 35004. The geometry reconstructor reconstructs the surface model-processed geometry information. The geometry reconstructor 35005 may transmit the reconstructed geometry information to the prediction/lifting/RAHT inverse transform processor 35009 and/or the coordinate inverse transformer 35006.

The geometry reconstructor 35005 may perform the operations of the point cloud video decoder 10006 of FIG. 1, the decoding 20003 of FIG. 2, and the geometry reconstructor 11003 of FIG. 11.

The coordinate inverse transformer 35006 inversely transforms the coordinate information about the geometry information generated by the geometry reconstructor 35005. The coordinate inverse transformer 35006 inversely transforms the geometry information and outputs position information about the points of the point cloud data. The coordinate inverse transformer 35006 may transmit the position information about the points to the point combiner 35012.

The coordinate inverse transformer 35006 may transmit information indicating that geometry decoding has been performed on bricks corresponding to the points to the partitioned data input unit 35001.

The coordinate inverse transformer 35006 may perform the operations of the point cloud video decoder 10006 of FIG. 1, the decoding 20003 of FIG. 2, and the coordinate inverse transformer 11004 of FIG. 11.

The second arithmetic decoder 35007 receives a geometry bitstream on a brick-by-brick basis. The second arithmetic decoder 35007 may decode the attribute bitstream. The second arithmetic decoder 35007 outputs the decoded attribute information.

The second arithmetic decoder 35007 may perform the operations of the point cloud video decoder 10006 of FIG. 1, the decoding 20003 of FIG. 2, the arithmetic decoding 11005 of FIG. 11, and the arithmetic decoder 13007 of FIG. 13.

The inverse quantization processor 35008 receives the decoded attribute information generated by the second arithmetic decoder 35007. The inverse quantization processor 35008 inversely quantizes the received decoded attribute information. The inverse quantization processor 35008 may output inversely quantized attribute information and transmit the inversely quantized attribute information to the prediction/lifting/RAHT inverse transform processor 35009.

The inverse quantization processor 35008 may perform the operations of the point cloud video decoder 10006 of FIG. 1, the decoding 20003 of FIG. 2, the inverse quantizer 11006 of FIG. 11, and the arithmetic decoder 13007 of FIG. 13.

The prediction/lifting/RAHT inverse transform processor 35009 receives the geometry information inversely quantized by the inverse quantization processor 35008, and inversely transforms the same. The prediction/lifting/RAHT inverse transform processor 35009 may inversely transform the inversely quantized attribute information based on at least one of a prediction method, a lifting method, and a RAHT method. The prediction/lifting/RAHT inverse transform processor 35009 may inversely transform the attribute information based on the geometry information (or restored geometry information) reconstructed by the geometry reconstructor 35005.

The prediction/lifting/RAHT inverse transform processor 35009 may perform the operations of the point cloud video decoder 10006 of FIG. 1, the decoding 20003 of FIG. 2, the RAHT 11007 of FIG. 11, the LOD generator 11008 of FIG. 11, and the inverse lifter 11009 of FIG. 11.

The attribute reconstructor 35010 reconstructs the attribute information based on the attribute information inversely transformed by the prediction/lifting/RAHT inverse transform processor 35009. The attribute reconstructor outputs the reconstructed attribute information and transmits the same to the color inverse transform processor 35011.

The attribute reconstructor 35010 may perform the operations of the point cloud video decoder 10006 of FIG. 1, the decoding 20003 of FIG. 2, the color inverse transformer 11010 of FIG. 11, and the color inverse transform processor 13010 of FIG. 13.

The color inverse transformer 35011 receives the geometry information reconstructed by the attribute reconstructor 35010. The color inverse transformer 35011 may perform inverse color transform on the reconstructed geometry information. The color inverse transformer 35011 outputs the attribute information about the points of the point cloud data.

The color inverse transformer 35006 may transmit, to the partitioned data input unit 35001, information indicating that attribute decoding has been performed on bricks corresponding to the points. The attribute reconfiguration unit 35010 may perform the operations of the point cloud video decoder 10006 of FIG. 1, the decoding 20003 of FIG. 2, the color inverse transformer 11010 of FIG. 11, and the color inverse transform processor 13010 of FIG. 13.

The point combiner 35012 receives the geometry information (position information) about the points of the point cloud data and/or the attribute information about the points according to embodiments. The point combiner 35012 receives the geometry information (position information) about the points of the point cloud data and/or the attribute information about the points in a brick unit, and combines the same on a brick-by-brick basis. The point combiner 35012 outputs the point cloud data in a brick unit containing the position information and attribute information about the points.

Figure 36:
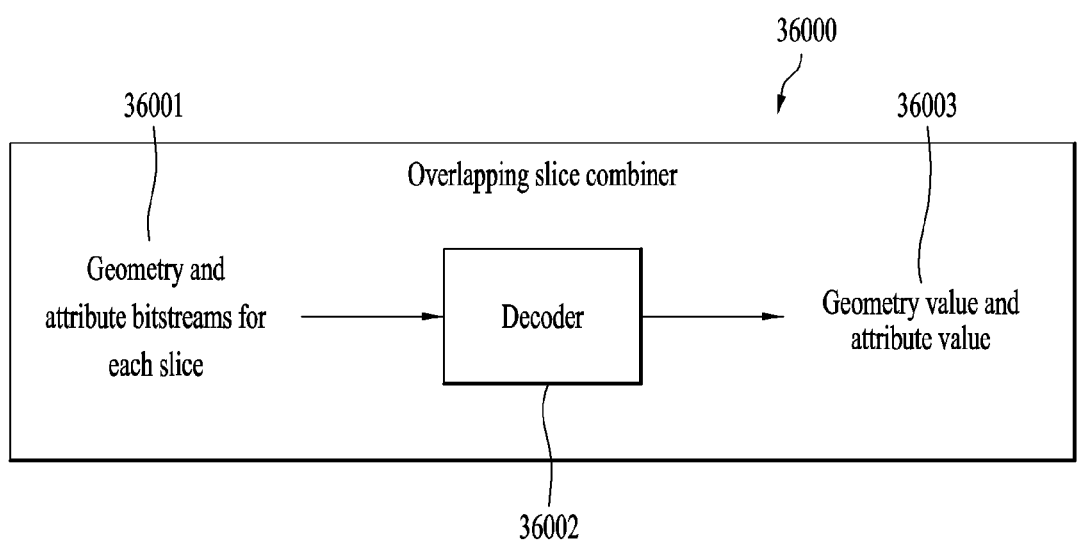
FIG. 36 illustrates a point cloud data reception device according to embodiments.

FIG. 36 illustrates a point cloud data reception device according to embodiments.

The point cloud data reception device 36000 according to the embodiments may include a point cloud data decoder 36002 according to embodiments.

Some or all of the operations of the point cloud data reception device according to the embodiments shown in FIG. 36 may be performed by a combination of the reception device 10004 of FIG. 1, the receiver 10005 of FIG. 1, the point cloud video decoder 10006 of FIG. 1, the decoding 18003 of FIG. 2, the transmitter 18002 of FIG. 2, the decoders of FIGS. 10 and 11, the reception device of FIG. 13, the XR device 1430 of FIG. 14, and the like. The bricks illustrated in this figure may correspond to slices, and vice versa. In this document, a brick may be referred to as a slice.

The point cloud data reception device 36000 may receive a bitstream 36001 containing point cloud data encoded for each slice. The bitstream 36001 may contain geometry information and/or attribute information about points included in each slice. The bitstream 36001 may be input from the point cloud data decoder 36002 according to the embodiments.

The bitstream 36001 according to the embodiments may be data in which point cloud data is partitioned into one or more tiles and/or slices. The slices according to the embodiments may be slices partitioned as described with reference to FIGS. 21 to 31.

The decoder 36002 according to the embodiments decodes the geometry bitstream and the attribute bitstream contained in the bitstream 36001, respectively. The decoder 36002 according to the embodiments may perform decoding based on information indicating a partitioning method according to embodiments signaled from the transmission device or information indicating an overlapping slice partitioning method.

Figure 37:
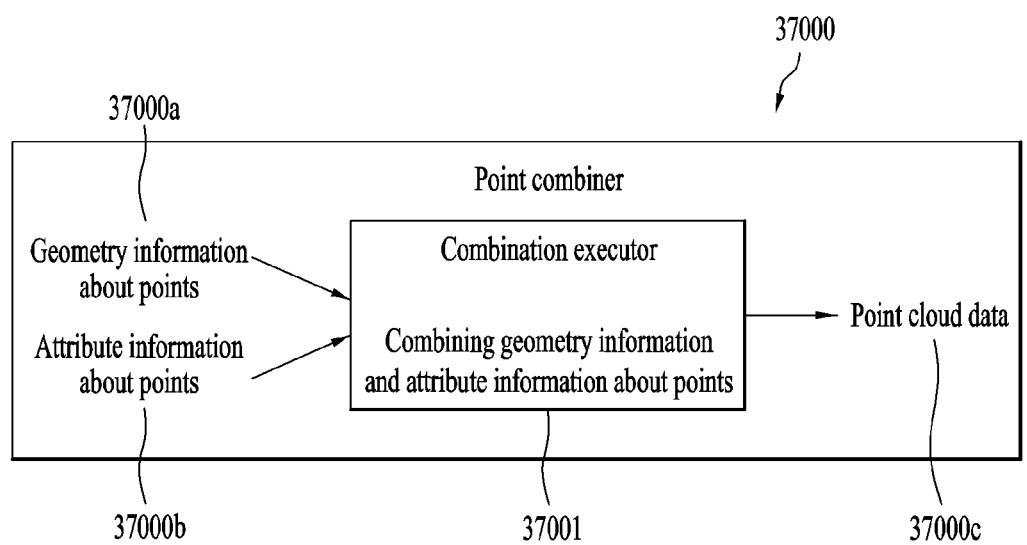
FIG. 37 illustrates a point combiner of a point cloud decoder according to embodiments.

FIG. 37 illustrates a point combiner of a point cloud decoder according to embodiments.

Some or all of the operations of the point combiner 37000 according to the embodiments shown in FIG. 37 may be performed by a combination of the reception device 10004 of FIG. 1, the receiver 10005 of FIG. 1, the point cloud video decoder 10006 of FIG. 1, the decoding 18003 of FIG. 2, the transmitter 18002 of FIG. 2, the decoders of FIGS. 10 and 11, the reception device of FIG. 13, the XR device 1430 of FIG. 14, and the like. The bricks illustrated in this figure may correspond to slices, and vice versa. In this document, a brick may be referred to as a slice.

The point combiner 37000 is illustrated. The point combiner 37000 receives geometry information 37000*a* about points and/or attribute information 37000*b* about the points. The point combiner 37000 may output point cloud data 37000*c* by combining the received geometry information 37000*a* and attribute information 37000*b* about the points. The point combiner 37000 includes a combination executor 37001.

The combination executor 37001 may receive geometry information and attribute information about points for each brick or tile. The point combiner 37000 may receive the geometry information and attribute information about the points for each brick or tile, and combine the same based on a combination method.

The combination method according to the embodiments refers to an operation based on the reverse process of at least one of the methods such as multiplexing, MVC bit string combination, sequential combination, importance-based combination, and the like. After the position value (geometry information) of the points and the attribute value (attribute information) of the points are each decoded, the point cloud decoder according to the embodiments determines a combination method to use to combine the position value and the attribute value.

The combination executor 37001 according to the embodiments may map one attribute value (attribute information) to one position value (geometry information) in a one-to-one correspondence manner. The combination executor 37001 according to the embodiments may use the method of lossy combination when one attribute value (attribute information) cannot be mapped to one position value (geometry information) in the one-to-one correspondence manner. For example, the attribute value (attribute information) that has been present for a specific position value (geometry information) may be absent, and multiple attribute values may be present for one position value. In the lossy combination according to the embodiments, when multiple pieces of attribute information are mapped, point information may be configured with duplicated_attribute_index.

The point cloud decoder according to the embodiments (e.g., the point combiner 37000 or the combination executor 37001) may combine geometry information about points and attribute information of the points based on information indicating a combination method contained in the bitstream received by the point cloud data reception device (e.g. combining_filter_index).

The geometry information 37000*a* about the points refers to a geometry bitstream decoded by the point cloud decoder according to the embodiments. The point geometry information 37000*a* may be the geometry information about the points output from the coordinate inverse transformer 29006 of FIG. 29 and the decoded geometry information output from the geometry information decoder 28001 of FIG. 28.

The attribute information 37000*b* about the points refers to the attribute bitstream decoded by the point cloud decoder according to embodiments. The point attribute information 37000*b* may be the attribute information about the points output from the color inverse transform processor 35011 of FIG. 35 and the decoded attribute information output from the attribute information decoder 34002 of FIG. 34.

Figure 38:
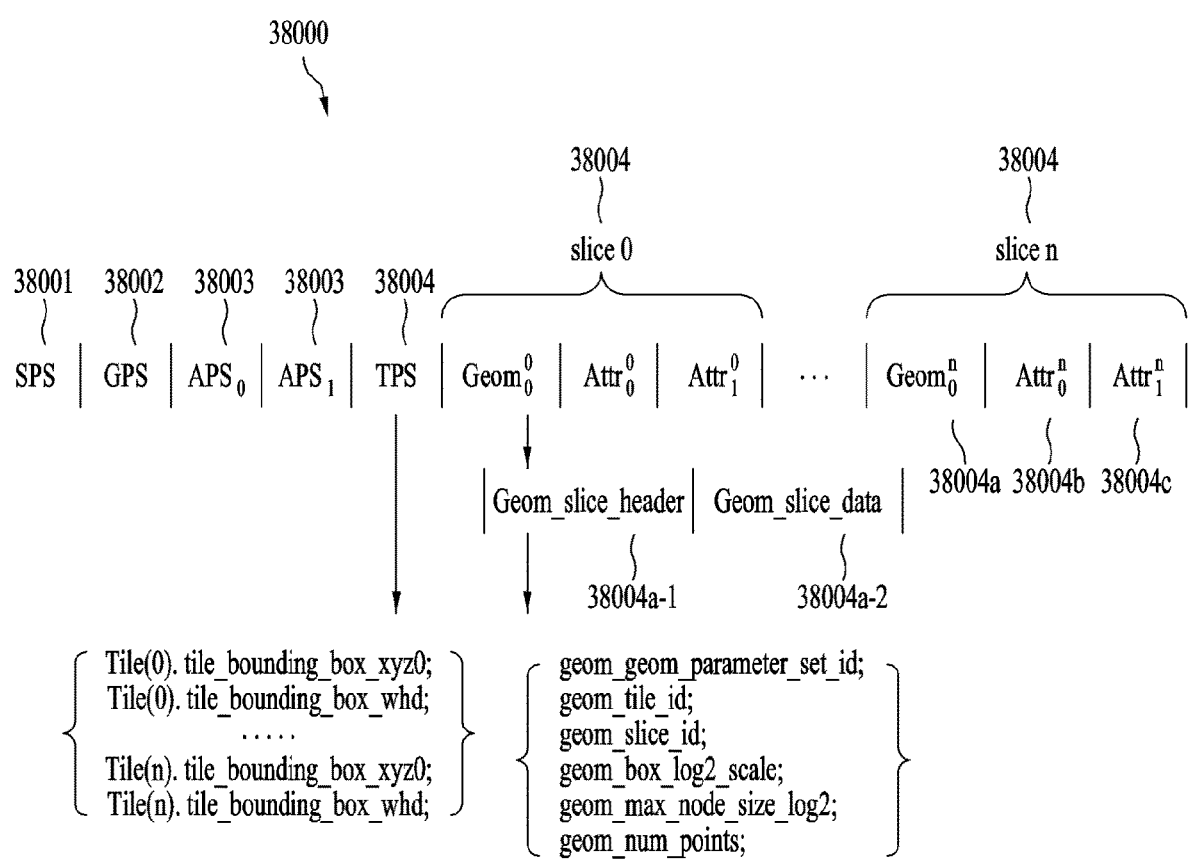
FIG. 38 illustrates an example of a bitstream structure of point cloud data according to embodiments.

FIG. 38 illustrates an example of a bitstream structure of point cloud data according to embodiments.

FIG. 38 illustrates an example of a bitstream structure 38000 of point cloud data according to embodiments. The bitstream structure 38000 of the point cloud data illustrated in FIG. 38 may be generated by the transmitter 10003 of FIG. 1, the transmitter 18002 of FIG. 2, the transmission processor 12012 of FIG. 12, the bitstream combiner 16014 of FIG. 16, and the bitstream combiner 17000 of FIG. 17.

The bitstream structure 38000 of the point cloud data illustrated in FIG. 38 may be a bitstream received by the receiver 10005 of FIG. 1, the decoder 18003 of FIG. 2, the receiver 13000 of FIG. 13, and the receiver 35000 of FIG. 35 in the reception device according to the embodiments. The bitstream structure 38000 of the point cloud data illustrated in FIG. 38 may be the geometry and attribute bitstream 36001 for each slice of FIG. 36.

A part of the entirety of the bitstream structure 38000 according to the embodiments illustrated in FIG. 38 may be generated by the XR device 1430 of FIG. 14. The bricks illustrated in this figure may correspond to slices, and vice versa. In this document, a brick may be referred to as a slice.

The point cloud data transmission device according to the embodiments may transmit the bitstream 38000 having the bitstream structure illustrated in FIG. 38. The bitstream 38000 of the point cloud data may contain a sequential parameter set (SPS) 38001, a geometry parameter set (GPS) 38002, an attribute parameter set (APS) 38003, a tile parameter set (TPS) 38004, and one or more slices (slice 0, slice 1, . . . , slice n) 38004. The bitstream 38000 of the point cloud data may contain one or more tiles. A tile according to embodiments may be a group of slices including one or more slices. The bitstream 38000 according to the embodiments provides the tiles or slices such that the point cloud data may be partitioned and processed by regions. Each region of the bitstream 38000 according to the embodiments may have a different importance. Accordingly, when the point cloud data is partitioned into tiles, different filters (encoding methods) and different filter units may be applied to the respective tiles. When the point cloud is partitioned into slices, different filters and different filter units may be applied to the respective slices.

By transmitting the point cloud data according to the structure of the bitstream 38000 illustrated in FIG. 38, the point cloud data transmission device according to the embodiments may allow the encoding operation to be applied differently according to the importance, and allow a good-quality encoding method to be used in an important region.

The point cloud data reception device according to the embodiments may be allowed to apply different filtering (decoding methods) to the respective regions (partitioned into tiles or partitioned into slices) according to the processing capacity of the reception device, rather than using a complex decoding (filtering) method to the entire point cloud data. Thereby, a better image quality may be ensured for regions important to the user and appropriate latency may be ensured in the system.

The SPS 38001 is a syntax structure containing syntax elements that apply to zero or more entire CVSs as determined by the content of a syntax element found in the PPS referred to by a syntax element found in each slice segment header. The SPS may include sequence information about the point cloud data bitstream according to the embodiments.

The GPS 38002 may be a syntax structure containing syntax elements that apply to zero or more entire geometry (or encoded geometry). The GPS 3802 according to embodiments may include information about a method of encoding attribute information of the point cloud data contained in the one or more slices 38004. The GPS 38002 may include SPS identifier information indicating the SPS 38001 to which the included geometry parameter is related according to embodiments, and GPS identifier information for identifying the GPS.

The APS 38003 may be a syntax structure containing syntax elements that apply to zero or more entire attributes (or encoded attributes). The APS 38003 according to the embodiments may include information about a method of encoding attribute information of the point cloud data contained in the one or more slices 38004. The APS 38003 may include SPS identifier information indicating the SPS 38001 to which the included geometry parameter is related according to embodiments, and APS identifier information for identifying the APS.

The TPS 38004 may be a syntax structure containing syntax elements that apply to zero or more entire tiles (or encoded tiles). A tile inventory includes information about zero or more tiles contained in the point cloud data bitstream according to the embodiments. The tile inventory may be referred to as a tile parameter set (TPS) according to embodiments.

The TPS 38004 may include identifier information for identifying one or more tiles and information indicating a range of the one or more tiles (i.e., a bounding box of the tiles). The information indicating the range of the one or more tiles (i.e., a bounding box of the tiles) may include coordinate information about a point that is a reference of a bounding box represented by a corresponding tile (e.g., Tile(n).tile_bounding_box_xyz0) and information about the width, height, and depth of the bounding box (e.g., Tile(n).tile_bounding_box_whd). When a plurality of tiles is given, the tile inventory 33004 may include information indicating a bounding box for each of the tiles. For example, when each tile is indicated as 0 to n by the identifier information for the tiles, the information indicating the bounding box of each tile may be expressed as Tile(0).tile_bounding_box_xyz0, Tile(0).tile_bounding_box_whd, Tile(1).tile_bounding_box_xyz0 Tile(1).tile_bounding_box_whd, and so on.

The slice 38004 may be a unit for encoding point cloud data by a point cloud data transmission device according to embodiments. The slice 38004 according to the embodiments may be a unit including one geometry bitstream (Geom00) 38004a and one or more attribute bitstreams (Attr00, Attr10) 38004b.

The slice 38004 may include a geometry slice (Geom) 38004a representing geometry information about the point cloud data contained in the slice, and one or more attribute slices (Attr) 38004b and 38004c representing attribute information about the point cloud data contained in the slice.

The geometry slice (Geom) 38004a includes geometry slice data (Geom_slice_data) 38004a-2 containing geometry information about the point cloud data, and a geometry slice header (GSH, Geom_slice_header) 38004a-1 containing information about the geometry slice data.

The GSH 38004a-1 contains information about the geometry slice data 38004a-2 in the slice. For example, the GSH 38004a-1 may contain a geometry parameter set identifier (geom_geom_parameter_set_id) for identifying the GPS 38002 representing the geometry information about the slice, and a geometry slice identifier (geom_slice_id) for identifying the geometry slice, geometry box origin information (geomBoxOrigin) indicating the origin of the box of the geometry slice data, information (geom_box_log 2_scale) indicating a logarithmic scale of the geometry slice, and information (geom_num_points) related to the number of points in the geometry slice.

When the point cloud data bitstream according to the embodiments contains one or more tiles, the header of the geometry bitstream according to the embodiments may further contain information (geom_tile_id) for identifying a tile including the geometry bitstream.

The attribute slice (Attr) 38004b, 38004c) includes attribute slice data (Attr_slice_data) containing attribute information about the point cloud data and an attribute slice header (ASH, Attr_slice_header) 33005c containing information about the attribute slice data.

According to embodiments, parameters needed to encode a point cloud may be newly defined as a parameter set and header information for the point cloud. For example, the parameters may be added to attribute parameter set RBSP syntax in encoding attribute information, and be added to tile_header syntax in performing tile-based encoding.

According to embodiments, the transmission device may generate a different slice configuration header unit for each tile or each slice in order to signal the configuration of an overlapping slice according to the embodiments.

As the point cloud data transmission/reception method according to the embodiments provides the above-described bitstream structure, it may increase the decoding performance of the receiver for the attribute information for the point cloud data.

FIG. 39 illustrates a sequence parameter set (SPS) in a bitstream according to embodiments.

The parameters shown in FIG. 39 may be included in the SPS illustrated in FIG. 38. The SPS according to the embodiments may contain signaling information related to a method of partitioning of a slice (slice partitioning) or slice tiling according to the embodiments, and/or related signaling information.

profile_idc may indicate a profile to which the bitstream conforms as specified in Annex A. Bitstreams shall not contain values of profile_idc other than those specified in Annex A. Other values of profile_idc may be reserved for future use by ISO/IEC.

profile_compatibility_flags equal to 1 may indicate that the bitstream conforms to the profile indicated by profile_idc equal to j as specified in Annex A. The value of profile_compatibility_flag[j] may be equal to 0 for any value of j that is not specified as an allowed value of profile_idc in Annex A.

level_idc indicates a level to which the bitstream conforms as specified in Annex A. Bitstreams may not contain values of level_idc other than those specified in Annex A. Other values of level_idc are reserved for future use by ISO/IEC.

sps_bounding_box_present_flag equal to 1 may specify that the bounding box offset and size information is signaled. When the value of sps_bounding_box_present_flag is 'true', the SPS according to the embodiments further includes sps_bounding_box_offset_x, sps_bounding_box_offset_y, sps_bounding_box_offset_z, sps_bounding_box_scale_factor, sps_bounding_box_size_width, sps_bounding_box_size_height, and sps_bounding_box_size_depth.

sps_bounding_box_offset_x indicates the x offset of the source bounding box in the Cartesian coordinates. When not present, the value of sps_bounding_box_offset_x may be inferred to be 0.

sps_bounding_box_offset_y indicates the y offset of the source bounding box in the Cartesian coordinates. When not present, the value of sps_bounding_box_offset_y may be inferred to be 0.

sps_bounding_box_offset_z indicates indicates the z offset of the source bounding box in the Cartesian coordinates. When not present, the value of sps_bounding_box_offset_z may be inferred to be 0.

sps_bounding_box_scale_factor indicates the scale factor the source bounding box in the Cartesian coordinates. When not present, the value of sps_bounding_box_scale_factor may be inferred to be 1. When not present, the value of sps_bounding_box_scale_factor may be inferred to be 0.

sps_bounding_box_size_width indicates the width of the source bounding box in the Cartesian coordinates. When not present, the value of sps_bounding_box_size_width may be inferred to be a specific value such as 10.

sps_bounding_box_size_height indicates the height of the source bounding box in the Cartesian coordinates. When not present, the value of sps_bounding_box_size_height may be inferred to be 1. When not present, the value of sps_bounding_box_size_height may be inferred to be 0.

sps_bounding_box_size_depth indicates the depth of the source bounding box in the Cartesian coordinates. When not present, the value of sps_bounding_box_size_depth may be inferred to be 1. When not present, the value of sps_bounding_box_size_depth may be inferred to be 0.

sps_source_scale_factor indicates the scale factor of the source point cloud.

sps_seq_parameter_set_id provides an identifier for the SPS for reference by other syntax elements. The value of sps_seq_parameter_set_id may be in the range of 0 to 15, inclusive in bitstreams conforming to the version of this Specification. The value other than 0 for sps_seq_parameter_set_id may be reserved for future use by ISO/IEC.

sps_num_attribute_sets indicates the number of coded attributes in the bitstream. The value of sps_num_attribute_sets may be in the range of 0 to 64.

According to embodiments, the SPS may include attribute_dimension[i], attribute_instance_id[i], attribute_bitdepth[i], attribute_cicp_colour_primaries[i], attribute_cicp_transfer_characteristics[i], attribute_cicp_matrix_coeffs[i], attribute_cicp_video_full_range_flag[i], and/or known_attribute_label_flag[i] as many as sps_num_attribute_sets.

attribute_dimension[i] specifies the number of components of the i-th attribute.

attribute_instance_id[i] specifies attribute instance id.

attribute_bitdepth[i] specifies the bitdepth of the i-th attribute signal(s).

attribute_cicp_colour_primaries[i] indicates the chromaticity coordinates of the color attribute source primaries.

attribute_cicp_transfer_characteristic[i] may either indicate the reference opto-electronic transfer characteristic function of the colour attribute as a function of a source input linear optical intensity Lc with a nominal real-valued range of 0 to 1 or indicate the inverse of the reference electro-optical transfer characteristic function as a function of an output linear optical intensity Lo with a nominal real-valued range of 0 to 1.

attribute_cicp_matrix_coeffs[i] describes the matrix coefficients used in deriving luma and chroma signals from the green, blue, and red, or Y, Z, and X primaries.

attribute_cicp_video_full_range_flag[i] specifies the black level and range of the luma and chroma signals as derived from E'Y, E'PB, and E'PR or E'R, E'G, and E'B real-valued component signals.

known_attribute_label_flag[i] equal to 1 specifies that know_attribute_label is signaled for the i-th attribute. known_attribute_label_flag[i] equal to 0 specifies that attribute_label_four_bytes is signaled for the i-th attribute.

When known_attribute_label_flag[i]) is 1 (true), the SPS according to embodiments may further include known_attribute_label[i].

known_attribute_label[i] equal to 0 specifies the attribute is color. known_attribute_label[i] equal to 1 specifies the attribute is reflectance. known_attribute_label[i] equal to 2 specifies the attribute is frame index.

According to embodiments, the SPS may further include partitioning_enabling_flag.

partitioning_enabling_flag represents information (or a flag) indicating whether the point cloud transmission device according to the embodiments partitions point cloud data into slices or bricks.

The point cloud data reception device according to the embodiments (e.g., the receiver 35000 or the partitioned data input unit 35001 of FIG. 35) may determine whether the point cloud data in the received bitstream is partitioned into slices based on partitioning_enabling_flag, and may receive the point cloud data in the received bitstream on a slice-by-slice basis.

split_recursive_enabling_flag represents information (or a flag) indicating whether the point cloud transmission device according to the embodiments has re-partitioned the partitioned slice or brick.

When partitioning_enabling_flag is equal to 1 (true), the SPS according to the embodiments may further include split_recursive_enabling_flag, multiple_brick_partitioning_flag, partitioning_unit_size, and/or partitioning_type_index.

The point cloud data reception device according to embodiments (e.g., the receiver 35000 or the partitioned data input unit 35001 of FIG. 35) may determine whether the slices of the point cloud data in the received bitstream are partitioned into sub-partitioning units, based on the split_recursive_enabling_flag.

partitioning_unit_size is information indicating a partitioning unit of a slice or brick partitioned by the point cloud transmission device according to embodiments. For example, partitioning_unit_size may indicate the unit size of the slice or brick according to embodiments.

The point cloud data reception device according to the embodiments (e.g., the receiver 35000 or the partitioned data input unit 35001 of FIG. 35) may determine the partition unit of the slices of the point cloud data in the received bitstream based on partitioning_unit_size, and decode a bitstream portion corresponding to the partitioning unit.

multiple_brick_partitioning_flag is information (or a flag) indicating whether to perform partitioning based on a method of partitioning point cloud data into a plurality of slices according to embodiments. That is, this parameter may be information indicating whether to use various partitioning methods as a partitioning type to be used for slice partitioning.

Based on multiple_brick_partitioning_flag, the point cloud data reception device according to the embodiments (e.g., the receiver 35000 or the partitioned data input unit 35001 of FIG. 35) may determine whether partitioning is performed based the method of partitioning point cloud data into one or more slices.

partitioning_type_index specifies a method of partitioning point cloud data into slices according to embodiments. The method of partitioning in units of slices according to the embodiments may include point density-based slice partitioning according to embodiments, circular sector slice partitioning according to embodiments, layer slice partitioning according to embodiments, and spherical/oval region slice partitioning according to embodiments, attribute-based slice partitioning according to embodiments, and adaptive axis length-based slice partitioning according to embodiments. partitioning_type_index may be determined, for example, as follows.

partitioning_type=mdex=1 indicates that point density-based slice partitioning (brick tiling) has been performed. The point density-based slice partitioning (brick tiling) may be slice partitioning according to the method illustrated in FIG. 21.

partitioning_type_index=2 indicates that circular sector slice partitioning (brick tiling) has been performed. The circular sector slice partitioning (brick tiling) may be brick partitioning according to the method illustrated in FIG. 22.

partitioning_type_index=3 indicates that layer slice partitioning (brick tiling) has been performed. The layer slice partitioning (brick tiling) may be slice partitioning according to the method illustrated in FIG. 23.

partitioning_type_index=4 indicates that spherical/oval slice partitioning (brick tiling) has been performed. The spherical/oval slice partitioning may be slice (brick) partitioning according to the method illustrated in FIG. 24.

partitioning_type_index=5 indicates that attribute-based slice partitioning (brick tiling) has been performed. The attribute-based slice partitioning (brick tiling) may be slice (brick) partitioning according to the method illustrated in FIG. 25.

partitioning_type_index=6 indicates that adaptive axis length-based slice partitioning (brick tiling) has been performed. The adaptive axis length-based slice partitioning (brick tiling) may be slice (brick) partitioning according to the method illustrated in FIG. 26.

partitioning_type_index=7 indicates that a user-defined slice partitioning (brick tiling) method other than the above-described methods has been performed. According to embodiments, a long axis among the coordinate axes of a bounding box may be partitioned based on a short axis, and then the partitioned slices may be re-partitioned. In this case, a process of re-partitioning the middle-length axis based on the short axis may be performed.

The point cloud data reception device according to the embodiments (e.g., the receiver 35000 or the partitioned data input unit 35001 of FIG. 35) may decode the point cloud data on a slice-by-slice basis based on partitioning_type_index.

According to embodiments, when split_recursive_enabling_flag is equal to 1 (true), the SPS may further include partition_current_unit.

partition_current_unit is information indicating a partitioning unit of a re-partitioned slice or brick when the point cloud transmission device according to the embodiments re-partitioning slices or bricks. For example, partition_current_unit may indicate a unit size of a re-partitioned slice or brick according to embodiments.

Upon determining that slices of the point cloud data of the received bitstream are partitioned into sub-partition units according to split_recursive_enabling_flag, the point cloud data reception device according to the embodiments (e.g., the receiver 35000 or the partitioned data input unit 35001 of FIG. 35) may determine a partition unit of the re-partitioned slices based on partition_current_unit.

combining_filter_index represents information about a combination method used by the encoder to transmit the combined geometry bitstream and attribute bitstream. According to embodiments, a combination method may be signaled according to a transmission environment and characteristic of a bitstream. Accordingly, the compression rate may be improved.

When combining_filter_index=0, it indicates that combination has been performed based on the multiplexing method. According to embodiments, the multiplexing method may sequence an individual bitstream as a group of bits or bytes.

When combining_filter_index=1, it indicates that combination has been performed based on the sequential combination method. According to embodiments, the sequential combination method is to sequentially combine the geometry bitstream and the attribute bitstream.

When combining_filter_index=2, it indicates that combination has been performed based on the importance-based combination method. According to embodiments, in the importance-based combination, bitstreams with higher importance may be combined first.

The point cloud data reception device according to the embodiments (e.g., the point combiner 35012 of FIG. 35, the point combiner 37000 of FIG. 37) may extract a geometry bitstream and an attribute bit from the received bitstream based on combining_filter_index. For example, when combining_filter_index is 0, the point cloud data reception device according to the embodiments may extract the geometry bitstream and the attribute bitstream from the received bitstream based on the reverse process of the multiplexing. For example, when combining_filter_index is 1, the point cloud data reception device may extract the geometry bitstream and the attribute bitstream from the received bitstream based on the reverse process of the sequential combination. For example, when combining_filter_index is 2, the point cloud data reception device may extract the geometry bitstream and the attribute bitstream from the received bitstream based on the reverse process of the importance-based combination.

When a plurality of pieces of attribute information is mapped to the same geometry information, duplicated_attribute_index indicates that the corresponding geometry includes duplicated attribute information. A duplicated attribute may be applied to the attribute information about a duplicated point.

When duplicated_attribute_index=0, it indicates color duplication. When multiple color values are mapped to the same geometry information in a duplicated manner, the duplicated attribute may be used.

When duplicated_attribute_index=1, it indicates reflectance duplication. When multiple reflectance values are mapped to the same geometry information in a duplicated manner, the duplicated attribute may be used.

The point cloud data reception device according to the embodiments may determine attribute information in which geometry is duplicated based on duplicated_attribute_index.

sps_extension_present_flag equal to 1 specifies that the sps_extension_data syntax structure is present in the SPS RBSP syntax structure. sps_extension_present_flag equal to 0 specifies that this syntax structure is not present. When not present, the value of sps_extension_present_flag may be inferred to be equal to 0.

sps_extension_data_flag may have any value. Its presence and value do not affect decoder conformance to profiles specified in Annex A Decoders conforming to a profile specified in Annex A.

The SPS according to the embodiments may further include sequential_input_slice_configuration_in_tile_flag, overlapping_slice_compose_flag, and overlapping_slice_compose_method[i].

sequential_input_slice_configuration_in_tile_flag represents information indicating whether the transmission device according to the embodiments performs the sequential input slice partitioning for each tile without waiting for the tile-based slice partitioning operation.

overlapping_slice_compose_flag represents information indicating whether the transmission device according to the embodiments uses the overlapping slice partitioning method.

When overlapping_slice_compose_flag is equal to 1 (true), the SPS according to the embodiments may further include overlapping_slice_compose_method[i]. The SPS may include overlapping_slice_compose_method[i] as many as the number of slices transmitted by the transmission device according to the embodiments.

overlapping_slice_compose_method[i] represents information indicating a slice partitioning method for the i-th slice. The slice partitioning method for the i-th slice and the corresponding value of overlapping_slice_compose_method[i] may be configured as follows.

0=multiple_point_sampling_based_overlapping_slice_parititon_method: The multi-point sampling-based overlapping slice configuration method according to embodiments is used to configure slices.

1=value_based_overlapping_slice_partition_method: The importance-based overlapping slice configuration method according to embodiments is used to configure slices.

2=attribute_range_based_slice_partition_method: The attribute range-based overlapping slice configuration method according to embodiments is used to configure slices.

3=morton_order_based_slice_partition_method: The Morton code order-based overlapping slice configuration method according to embodiments is used to configure slices.

4~=other_slice_partition_method: Other partitioning methods are used.

FIG. 40 illustrates a tile parameter set (TPS) of a bitstream according to embodiments.

The parameters shown in FIG. 40 may be included in the TPS described with reference to FIG. 38. The TPS according to the embodiments may include signaling information related to a slice partitioning or slice tiling method according to the embodiments, and/or related signaling information.

num_tiles represents the number of tiles signaled for the bitstream. When not present, num_tiles may be inferred to be 0.

The TPS according to the embodiments may include the following pieces of signaling information as many as a value indicated by num_tiles.

tile_bounding_box_offset_x[i] indicates the x offset of the i-th tile in the Cartesian coordinates. When not present, the value of tile_bounding_box_offset_x[0] may be inferred to be sps_bounding_box_offset_x.

tile_bounding_box_offset_y[i] indicates the y offset of the i-th tile in the Cartesian coordinates. When not present, the value of tile_bounding_box_offset_y[0] may be inferred to be sps_bounding_box_offset_y.

tile_bounding_box_offset_z[i] indicates the z offset of the i-th tile in the Cartesian coordinates. When not present, the value of tile_bounding_box_offset_z[0] may be inferred to be sps_bounding_box_offset_z.

tile_bounding_box_scale_factor[i] indicates the scale factor related to the i-th tile in the Cartesian coordinates. When not present, the value of tile_bounding_box_scale_factor[0] may be inferred to be sps_bounding_box_scale_factor.

tile_bounding_box_size_width[i] indicates the width of the i-th tile in the Cartesian coordinates. When not present, the value of tile_bounding_box_size_width[0] may be inferred to be sps_bounding_box_size_width.

tile_bounding_box_size_height[i] indicates the height of the i-th tile in the Cartesian coordinates. When not present, the value of tile_bounding_box_size_height[0] may be inferred to be sps_bounding_box_size_height.

tile_bounding_box_size_depth[i] indicates the depth of the i-th tile in the Cartesian coordinates. When not present, the value of tile_bounding_box_size_depth[0] may be inferred to be sps_bounding_box_size_depth.

The TPS according to the embodiments may include partitioning_enable_flag.

partitioning_enable_flag represents information (or a flag) indicating whether the point cloud transmission device according to embodiments partitions point cloud data into slices or bricks. partitioning_enable_flag may be information indicating the same information as the partitioning_enabling_flag described with reference to FIG. 39.

The point cloud data reception device according to the embodiments (e.g., the receiver 35000 or the partitioned data input unit 35001 of FIG. 35) may determine, based on partitioning_enabling_flag, whether the point cloud data in the received bitstream is partitioned into slices, and receive the point cloud data in the bitstream on a slice-by-slice basis based on partitioning_enabling_flag.

When partitioning_enable_flag is equal to 1 (true), the TPS according to embodiments may further include multiple_brick_partitioning_flag, partitioning_unit_size, and/or partitioning_type_index.

multiple_brick_partitioning_flag may be the multiple_brick_partitioning_flag included in the SPS as described with reference to FIG. 39. partitioning_unit_size may be the partitioning_unit_size included in the SPS as described with reference to FIG. 39. partitioning_type_index may be the partitioning_type_index included in the SPS as described with reference to FIG. 39.

The TPS according to embodiments may further include brick_tiling_type.

brick_tiling_type indicates a method in which the transmission device according to the embodiments partitions the point cloud data into one or more bricks (or slices).

brick_tiling_type may indicate the same information as partitioning_type_index described with reference to FIG. 39. In other words, brick_tiling_type may be referred to as partitioning_type_index.

When brick_tiling_type is equal to 1 (indicating the point density-based brick tiling (slice partitioning)), the TPS according to the embodiments may further include brick_unit_information and brick_density_quantization_step.

brick_unit_information represents unit information about one brick (or slice) and/or information about a partitioning method.

brick_density_quantization_step represents the degree to sampling can be performed for a brick (or slice) to be partitioned by specifying a quantization coefficient to be used in the brick (or slice).

The bounding_box_radius is information indicating the radius of a corresponding brick (or slice) when the point cloud data transmission device performs circular sector brick tiling (slice partitioning) according to embodiments. This parameter may be the bounding_box_radius parameter of FIG. 22. This parameter may be present in each brick (or slice).

When brick_tiling_type is equal to 2 (indicating the circular sector brick tiling (slice partitioning)), the TPS according to the embodiments may further include bounding_box_radius, central_node_xyz, moving_direction_vector, and use_identical_bounding_box_information_flag.

central_node_xyz is information indicating the x-coordinate, y-coordinate, and z-coordinate of the center point information about the brick (or slice) when the point cloud data transmission device performs the circular sector brick tiling (slice partitioning) according to the embodiments. This parameter may be the parameter central_node_xyz of FIG. 22.

moving_direction_vector indicates a movement direction of an object represented by the point cloud data when the point cloud data transmission device performs the circular sector brick tiling (slice partitioning) according to the embodiments. moving_direction_vector may be expressed in a vector form. It may be the parameter moving_direction_vector of FIG. 22.

use_identical_bounding_box_information_flag is information (or a flag) indicating whether to define the identical bounding box for all frames when the point cloud data transmission device performs the circular sector brick tiling (slice partitioning) according to the embodiments. According to embodiments, the bounding box information may be defined for each frame, or may be determined by the x, y, and z values of each frame.

When brick_tiling_type is equal to 3 (indicating layer brick tiling (slice partitioning)), the TPS according to the embodiments may further include enable_sorting_flag.

enable_sorting_flag is information (or a flag) indicating whether the point cloud data has been sorted (in, for example, ascending order, descending order, Morton code order) when the point cloud data transmission device performs the layer brick tiling (slice partitioning) according to the embodiments. It may be the parameter enable_sorting_flag of FIG. 23. This parameter may be present in each brick (slice).

When brick_tiling_type is equal to 4 (indicating spherical/oval brick tiling (slice partitioning)), the TPS according to embodiments may further include sphere_or_oval_flag, center_point_xyz, radius_distance, and azimuth_angle.

sphere_or_oval_flag indicates whether to partition the point cloud data into spherical or oval regions when the point cloud data transmission device performs the spherical/oval region tiling (slice partitioning) according to the embodiments. It may be the parameter sphere_or_oval_flag of FIG. 24. This parameter may be present in each brick (slice).

center_point_xyz contains coordinate information (e.g., (x, y, z) information) about the center point of a spherical/oval region according to the embodiments when the point cloud data transmission device performs the spherical/oval region tiling according to the embodiments. It may be the parameter center_point_xyz of FIG. 24. This parameter may be present in each brick (slice).

radius_distance represents the radius information (or distance information) about a brick (slice) of a spherical/oval shape according to embodiments when the point cloud data transmission device performs the spherical/oval region tiling according to the embodiments. It may be the parameter radius_distance of FIG. 24. This parameter may be present in each brick (slice).

azimuth_angle may specify an angle formed between a distance from the origin and a reference vector in a spherical coordinate system when the point cloud data transmission device performs the spherical/oval region tiling according to embodiments. This parameter may be present in each brick (slice). It may be the parameter azimuth_angle of FIG. 24.

When brick_tiling_type is equal to 4 (indicating the spherical/oval brick tiling (slice partitioning)), the TPS according to the embodiments may further include referenced_attribute_type, referenced_attribute_type_range, and referenced_attribute_type_value.

referenced_attribute_type indicates attribute information that is a reference for brick (slice) partitioning when the point cloud data transmission device performs the attribute-based brick tiling (slice partitioning) according to the embodiments. It may be the parameter referenced_attribute_type of FIG. 25.

referenced_attribute_type_range indicates whether to configure a brick (slice) with a range of attribute values of the attribute information when the point cloud data transmission device performs the attribute-based brick tiling (slice partitioning) according to the embodiments. It may be the parameter referenced_attribute_type of FIG. 25.

referenced_attribute_type_value is information indicating whether to configure a brick (slice) with the attribute value of the attribute information. It may be the parameter referenced_attribute_type_value of FIG. 25.

The TPS according to the embodiments may further include combining_filter_index, duplicated_attribute_index, and divide_mid_length_axis.

combining_filter_index represents information about a combination method used by the encoder to transmit the combined geometry bitstream and attribute bitstream. According to embodiments, the combination method may be signaled according to a transmission environment and characteristic of the bitstream. Accordingly, the compression rate may be improved. combining_filter_index may be combining_filter_index of FIG. 32.

When a plurality of pieces of attribute information is mapped to one piece of geometry information, duplicated_attribute_index indicates that the corresponding geometry includes duplicated attribute information. The duplicated attribute may be applied to the attribute information about a duplicated point. duplicated_attribute_index may be duplicated_attribute_index of FIG. 32.

partition_mid_length_axis represents information about a middle-length axis when the point cloud data transmission device performs the adaptive axis length-based tiling of FIG. 26 according to the embodiments. For example, partition_mid_length_axis equal to 0 may indicate that the X-axis is the middle-length axis. partition_mid_length_axis equal to 1 may indicate that the Y-axis is the middle-length axis. partition_mid_length_axis equal to 2 may indicate that the Z-axis is the middle-length axis.

The point cloud data reception device according to the embodiments (e.g., the receiver 35000 of FIG. 35, the partitioned data input unit 35001 of FIG. 35, the point combiner 35012 of FIG. 35, the point combiner 37000 of FIG. 37) may determine the shape of slices according to embodiments based on the parameters brick_unit_information, brick_density_quantization_step, bounding_box_radius, central_node_xyz, moving_direction_vector, use_identical_bounding_box_information_flag, enable_sorting_flag, sphere_or_oval_flag, center_point_xyz, radius_distance, azimuth_angle, referenced_attribute_type, referenced_attribute_type_range, referenced_attribute_type_value, combining_filter_index, and duplicated_attribute_index, divide_mid_length_axis, and may identify point cloud data to be decoded based on the above-described parameters.

The TPS according to the embodiments may further include sequential_input_slice_configuration_in_tile_flag, overlapping_slice_compose_flag, and overlapping_slice_compose_method[i].

sequential_input_slice_configuration_in_tile_flag represents information indicating whether the transmission device according to the embodiments performs the sequential input slice partitioning for each tile without waiting for the tile-based slice partitioning operation.

overlapping_slice_compose_flag represents information indicating whether the transmission device according to the embodiments uses the overlapping slice partitioning method.

When overlapping_slice_compose_flag is equal to 1 (true), the SPS according to the embodiments may further include overlapping_slice_compose_method[i]. The SPS may include overlapping_slice_compose_method[i] as many as the number of slices transmitted by the transmission device according to the embodiments.

overlapping_slice_compose_method[i] represents information indicating a slice partitioning method for the i-th slice. The slice partitioning method for the i-th slice and the corresponding value of overlapping_slice_compose_method[i] may be configured as follows.

0=multiple_point_sampling_based_overlapping_slice_parititon_method: The multi-point sampling-based overlapping slice configuration method according to embodiments is used to configure slices.

1=value_based_overlapping_slice_partition_method: The importance-based overlapping slice configuration method according to embodiments is used to configure slices.

2=attribute_range_based_slice_partition_method: The attribute range-based overlapping slice configuration method according to embodiments is used to configure slices.

3=morton_order_based_slice_partition_method: The Morton code order-based overlapping slice configuration method according to embodiments is used to configure slices.

4~=other_slice_partition_method: Other partitioning methods are used.

FIG. 41 illustrates a geometry parameter set (GPS) of a bitstream according to embodiments.

The parameters shown in FIG. 41 may be included in the GPS described with reference to FIG. 38. The GPS according to the embodiments may include signaling information related to a slice partitioning or slice tiling method according to the embodiments, and/or related signaling information.

gps_geom_parameter_set_id provides an identifier for the GPS for reference by other syntax elements. The value of gps_seq_parameter_set_id may be in the range of 0 to 15, inclusive.

gps_seq_parameter_set_id specifies the value of sps_seq_parameter_set_id for the active SPS. The value of gps_seq_parameter_set_id may be in the range of 0 to 15, inclusive.

geometry_coding_type may indicate the coding type for the geometry information. The value of geometry_coding_type may be equal to 0 or 1. Other values of geometry_coding_type may be reserved for future use by ISO/IEC. Decoders may ignore reserved values of geometry_coding_type. geometry_coding_type equal to 0 may indicate octree, and geometry_coding_type equal to 1 may indicate Triangle Soup (Trisoup).

gps_box_present_flag equal to 1 equal to 1 specifies that additional bounding box information is provided in a geometry header that references the current GPS. gps_bounding_box_present_flag equal to 0 specifies that additional bounding box information is not signaled in the geometry header.

unique_geometry_points_flag equal to 1 indicates that all output points have unique positions. unique_geometry_points_flag equal to 0 indicates that the output points may have same positions.

neighbour_context_restriction_flag equal to 0 indicates that octree occupancy coding uses contexts determined from six neighboring parent nodes. neighbour_context_restriction_flag equal to 1 indicates that octree coding uses contexts determined from sibling nodes only inferred_direct_coding_mode_enabled_flag equal to 0 indicates that the octree coding uses inferred_direct_coding_mode. inferred_direct_coding_mode_enabled_flag equal to 1 indicates the octree coding uses multiple contexts determined from sibling neighboring nodes.

log 2_neighbour_avail_boundary specifies the value of the variable NeighbAvailBoundary that is used in the decoding process as follows:

NeighbAvailBoundary=2 log 2_neighbour_avail_boundary

When neighbour_context_restriction_flag is equal to 1, NeighbAvailabilityMask may be set equal to 13. When neighbour_context_restriction_flag I sequal to 0, NeighbAvailabilityMask may be set equal to:

(1<<log 2_neighbour_avail_boundary).

log 2_trisoup_node_size specifies the variable TrisoupNodeSize as the size of the triangle nodes as follows.

TrisoupNodeSize=2 log 2_trisoup_node_size

The value of log 2_trisoup_node_size may be greater than or equal to 0. When log 2_trisoup_node_size is equal to 0, the geometry bitstream may include only the octree coding syntax.

trisoup_depth specifies the number of bits used to represent each component of a point coordinate. The value of trisoup_depth may be in the range of 2 to 21. [Ed(df):21 should perhaps be a level limit].

trisoup_triangle_level specifies the level at which the octree is pruned. The value of trisoup_triangle_level may be in the range of 1 to trisoup_depth-1.

gps_extension_present_flag equal to 1 specifies that the gps_extension_data syntax structure is present in the GPS RBSP syntax structure. gps_extension_present_flag equal to 0 specifies that this syntax structure is not present. When not present, the value of gps_extension_present_flag is inferred to be equal to 0.

gps_extension_data_flag may have any value. Its presence and value do not affect decoders.

The GPS according to the embodiments may further include partitioning_enable_flag, multiple_brick_partitioning_flag, partitioning_unit_size, partitioning_type_index, brick_unit_information, brick_density_quantization_step, bounding_box_radius, central_node_xyz, moving_direction_vector, use_identical_bounding_box_information_flag, enable_sorting_flag, sphere_or_oval_flag, center_point_xyz, radius_distance, azimuth_angle, referenced_attribute_type, referenced_attribute_type_range, referenced_attribute_type_value, divide_mid_length_axis, combining_filter_index, and duplicated_attribute_index described above with reference to FIGS. 39 to 40.

The point cloud data reception device according to the embodiments (e.g., the receiver 35000 of FIG. 35, the partitioned data input unit 35001 of FIG. 35, the point combiner 35012 of FIG. 35, the point combiner 37000 of FIG. 37) may determine the shape of slices according to embodiments based on the above-described parameters in the GPS, and may identify point cloud data to be decoded based on the above-described parameters.

The GPS according to the embodiments may further include sequential_input_slice_configuration_in_tile_flag, overlapping_slice_compose_flag, and overlapping_slice_compose_method[i].

sequential_input_slice_configuration_in_tile_flag represents information indicating whether the transmission device according to the embodiments performs the sequential input slice partitioning for each tile without waiting for the tile-based slice partitioning operation.

overlapping_slice_compose_flag represents information indicating whether the transmission device according to the embodiments uses the overlapping slice partitioning method.

When overlapping_slice_compose_flag is equal to 1 (true), the SPS according to the embodiments may further include overlapping_slice_compose_method[i]. The SPS may include overlapping_slice_compose_method[i] as many as the number of slices transmitted by the transmission device according to the embodiments.

overlapping_slice_compose_method[i] represents information indicating a slice partitioning method for the i-th slice. The slice partitioning method for the i-th slice and the corresponding value of overlapping_slice_compose_method[i] may be configured as follows.

0=multiple_point_sampling_based_overlapping_slice_parititon_method: The multi-point sampling-based overlapping slice configuration method according to embodiments is used to configure slices.

1=value_based_overlapping_slice_partition_method: The importance-based overlapping slice configuration method according to embodiments is used to configure slices.

2=attribute_range_based_slice_partition_method: The attribute range-based overlapping slice configuration method according to embodiments is used to configure slices.

3=morton_order_based_slice_partition_method: The Morton code order-based overlapping slice configuration method according to embodiments is used to configure slices.

4~=other_slice_partition_method: Other partitioning methods are used.

FIG. 42 illustrates a geometry slice header (GSH) of a bitstream according to embodiments.

The parameters shown in FIG. 42 may be included in the GSH described with reference to FIG. 38. The GSH according to the embodiments may include signaling information related to a slice partitioning or slice tiling method according to the embodiments, and/or related signaling information.

gsh_geometry_parameter_set_id specifies the value of the gps_geom_parameter_set_id of the active GPS.

gsh_tile_id specifies id of a tile.
gsh_slice_id specifies id of a slice.
gsh_box_log 2_scale specifies a scale value.
gsh_box_origin_x specifies the x of the source bounding box in the Cartesian coordinates.
gsh_box_origin_y specifies the y of the source bounding box in the Cartesian coordinates.
gsh_box_origin_z specifies the z of the source bounding box in the Cartesian coordinates.
gsh_log 2_max_nodesize specifies the value of the variable MaxNodeSize that is used in the decoding process as follows:
MaxNodeSize=2(gbh_log 2_max_nodesize)
gsh_points_number specifies the number of coded points in the slice.

The GSH according to the embodiments may further include partitioning_enable_flag, multiple_brick_partitioning_flag, partitioning_unit_size, partitioning_type_index, brick_unit_information, brick_density_quantization_step, bounding_box_radius, central_node_xyz, moving_direction_vector, use_identical_bounding_box_information_flag, enable_sorting_flag, sphere_or_oval_flag, center_point_xyz, radius_distance, azimuth_angle, referenced_attribute_type, referenced_attribute_type_range, referenced_attribute_type_value, divide_mid_length_axis, combining_filter_index, and duplicated_attribute_index described above with reference to FIGS. 39 to 41.

The point cloud data reception device according to the embodiments (e.g., the receiver 35000 of FIG. 35, the partitioned data input unit 35001 of FIG. 35, the point combiner 35012 of FIG. 35, the point combiner 37000 of FIG. 37) may determine the shape of slices according to embodiments based on the above-described parameters in the GSH, and may identify point cloud data to be decoded based on the above-described parameters.

FIG. 43 illustrates an attribute slice header (ASH) of a bitstream according to embodiments.

The parameters shown in FIG. 43 may be included in the ASH described with reference to FIG. 38. The ASH according to the embodiments may include signaling information related to a slice partitioning or slice tiling method according to the embodiments, and/or related signaling information.

abh_attr_parameter_set_id specifies the value of the aps_attr_parameter_set_id of the active APS.

abh_attr_sps_attr_idx specifies the attribute set in the active SPS. The value of abh_attr_sps_attr_idx may be in the range of 0 to sps_num_attribute_sets in the active SPS.

abh_attr_geom_slice_id specifies the value of geom slice id.

The ASH according to the embodiments may further include partitioning_type_index, brick_unit_information, brick_density_quantization_step, bounding_box_radius, central_node_xyz, moving_direction_vector, use_identical_bounding_box_information_flag, enable_sorting_flag, sphere_or_oval_flag, center_point_xyz, radius_distance, azimuth_angle, referenced_attribute_type, referenced_attribute_type_range, referenced_attribute_type_value, divide_mid_length_axis, combining_filter_index, and duplicated_attribute_index described above with reference to FIGS. 39 to 41.

The point cloud data reception device according to the embodiments (e.g., the receiver 35000 of FIG. 35, the partitioned data input unit 35001 of FIG. 35, the point combiner 35012 of FIG. 35, the point combiner 37000 of FIG. 37) may determine the shape of bricks (slices) according to embodiments based on the above-described parameters in the ASH, and may identify point cloud data to be decoded based on the above-described parameters.

Figure 44:
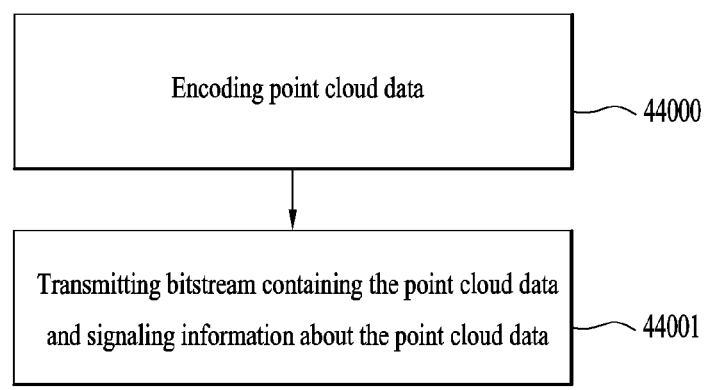
FIG. 44 illustrates an operation of transmitting point cloud data according to embodiments.

FIG. 44 illustrates an operation of transmitting point cloud data according to embodiments.

The operation of transmitting point cloud data according to the embodiments includes encoding the point cloud data (44000), and transmitting a bitstream containing the point cloud data and signaling information about the point cloud data (44001).

The operation of transmitting point cloud data according to the embodiments may further include partitioning the point cloud data. The partitioning according to embodiments may include partitioning the point cloud data into one or more slices (or tiles or macroblocks). The partitioning method according to embodiments may include partitioning the point cloud data based on information about the maximum number of points contained in the slice. According to embodiments, the maximum number information may be a preset value.

In the partitioning operation according to the embodiments, the operations of the data input unit 12000 of FIG. 12, the operations of the space partitioner 15001 of FIG. 15, the operations of the data characteristic checker 16000 of FIG. 16, the operations of the brick tiling unit 16001 of FIG. 16, the operations of the partitioned data input unit 16002 of FIG. 16, and the operations illustrated in FIGS. 18 to 33 may be performed.

Some of the slices according to the embodiments may include an overlapping region in a 3D space. For example, the one or more slices may include a first slice and a second slice. The first slice and the second slice may include an overlapping region in a 3D space containing the point cloud data.

The partitioning method according to the embodiments may be at least one of partitioning based on an octree of the point cloud data, and partitioning based on the lengths of the axes of the 3D space containing the point cloud data. A detailed description of the partitioning method according to the embodiments has been given with reference to FIGS. 15 to 43.

In the encoding 44000 of the point cloud data, the point cloud data according to the embodiments may be encoded. The encoding operation 44000 according to the embodiments may be independently performed for each tile, slice, or macroblock according to the embodiments. According to embodiments, the encoding operation 44000 may include encoding geometry data of points of the point cloud data and/or encoding attribute data of the points of the point cloud data.

In the encoding 44000 of the point cloud data, the operations of the point cloud video encoder 10002 of FIG. 1, the operations of the encoding 18001 of FIG. 2, the operations of FIG. 4, and the operations of FIGS. 5 to 9, the operations of FIG. 12, the operations of the geometry information encoder 15002 and/or the attribute information encoder 15003 of FIG. 15, and the operations of 16003 to 16014 of FIG. 16 may be performed.

In the operation of transmitting the point cloud data according to the embodiments, signaling information about the point cloud data may be transmitted. The signaling information according to the embodiments may include information indicating whether the partitioning operation is performed and/or information indicating a partitioning method when the partitioning operation is performed.

A transmission bitstream according to embodiments may have a syntax structure as shown in FIG. 38. In addition, the signaling information according to the embodiments may include all or part of the information shown in FIGS. 38 to 43.

All or part of the point cloud data transmission operation according to the embodiments illustrated in FIG. 44 may be performed by the XR device 1430 of FIG. 14. The bricks described in this document may correspond to slices, and vice versa. In this document, a brick may be referred to as a slice.

Figure 45:
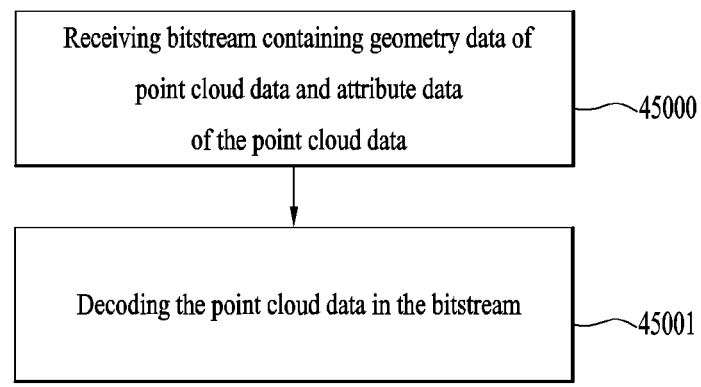
FIG. 45 illustrates an operation of receiving point cloud data according to embodiments.

FIG. 45 illustrates an operation of receiving point cloud data according to embodiments.

The operation of receiving point cloud data according to the embodiments may include receiving a bitstream containing geometry data of the point cloud data and attribute data of the point cloud data (45000), and/or decoding the point cloud data in the bitstream (45001).

In the operation 45000 of receiving a bitstream containing the geometry data of the point cloud data and the attribute data of the point cloud data, a bitstream transmitted by the point cloud data transmission device according to the embodiments is received. The bitstream according to the embodiments may contain point cloud data. The point cloud data may be carried by one or more tiles, slices, macroblocks, or bricks.

In the decoding operation 45001 according to the embodiments, the operations of the point cloud video decoder 10006 of FIG. 1, the decoding 18003 of FIG. 2, the operations of FIG. 11, and the operations of FIG. 13 may be performed. All or part of the operations of the geometry information decoder 34001 and/or the attribute information decoder 34002 of FIG. 34 and the operations of FIGS. 35 to 37 may be performed.

The operation 45001 of decoding the point cloud data in the bitstream may include decoding geometry data of the point cloud data and/or decoding attribute data of the point cloud data. In the decoding operation 45001 according to the embodiments, decoding may be separately performed for each brick or slice by which the point cloud data is carried.

Some of the slices according to the embodiments may include regions overlapping each other. For example, the slices according to the embodiments may include a first slice and a second slice. The first slice and the second slice may include an overlapped region in a 3D space containing the point cloud data.

The bitstream according to the embodiments may further include signaling information about the point cloud data according to the embodiments. The signaling information according to the embodiments may include information indicating whether the point cloud data is partitioned into one or more slices. When the received point cloud data is partitioned into one or more slices, the one or more slices may be independently decoded in the decoding operation according to the embodiments. The number of points in a slice or a brick according to embodiments may be determined based on the maximum number of points.

The signaling information according to the embodiments may include information indicating a partitioning method for the one or more slices. The partitioning method according to the embodiments may be at least one of partitioning based on an octree of point cloud data, and partitioning based on the lengths of the axes of the 3D space containing the point cloud data.

The received bitstream according to the embodiments may have a syntax structure as shown in FIG. 38. In addition, the signaling information according to the embodiments may include all or part of the information shown in FIGS. 38 to 43.

All or part of the point cloud data reception operation according to the embodiments illustrated in FIG. 45 may be performed by the XR device 1430 of FIG. 14. The bricks described in this document may correspond to slices, and vice versa. In this document, a brick may be referred to as a slice.

Embodiments have been described from the method and/or device perspective, and descriptions of methods and devices may be applied so as to complement each other.

Although the accompanying drawings have been described separately for simplicity, it is possible to design new embodiments by merging the embodiments illustrated in the respective drawings. Designing a recording medium readable by a computer on which programs for executing the above-described embodiments are recorded as needed by those skilled in the art also falls within the scope of the appended claims and their equivalents. The devices and methods according to embodiments may not be limited by the configurations and methods of the embodiments described above. Various modifications may be made to the embodiments by selectively combining all or some of the embodiments. Although preferred embodiments have been described with reference to the drawings, those skilled in the art will appreciate that various modifications and variations may be made in the embodiments without departing from the spirit or scope of the disclosure described in the appended claims. Such modifications are not to be understood individually from the technical idea or perspective of the embodiments.

Various elements of the devices of the embodiments may be implemented by hardware, software, firmware, or a combination thereof. Various elements in the embodiments may be implemented by a single chip, for example, a single hardware circuit. According to embodiments, the components according to the embodiments may be implemented as separate chips, respectively. According to embodiments, at least one or more of the components of the device according to the embodiments may include one or more processors capable of executing one or more programs. The one or more programs may perform any one or more of the operations/methods according to the embodiments or include instructions for performing the same. Executable instructions for performing the method/operations of the device according to the embodiments may be stored in a non-transitory CRM or other computer program products configured to be executed by one or more processors, or may be stored in a transitory CRM or other computer program products configured to be executed by one or more processors. In addition, the memory according to the embodiments may be used as a concept covering not only volatile memories (e.g., RAM) but also nonvolatile memories, flash memories, and PROMs. In addition, it may also be implemented in the form of a carrier wave, such as transmission over the Internet. In addition, the processor-readable recording medium may be distributed to computer systems connected over a network such that the processor-readable code may be stored and executed in a distributed fashion.

In this specification, the term "/" and "," should be interpreted as indicating "and/or." For instance, the expression "A/B" may mean "A and/or B." Further, "A, B" may mean "A and/or B." Further, "A/B/C" may mean "at least one of A, B, and/or C." Also, "A/B/C" may mean "at least one of A, B, and/or C." Further, in this specification, the term "or" should be interpreted as indicating "and/or." For instance, the expression "A or B" may mean 1) only A, 2) only B, or 3) both A and B. In other words, the term "or" used in this document should be interpreted as indicating "additionally or alternatively."

Terms such as first and second may be used to describe various elements of the embodiments. However, various components according to the embodiments should not be limited by the above terms. These terms are only used to distinguish one element from another. For example, a first user input signal may be referred to as a second user input signal. Similarly, the second user input signal may be referred to as a first user input signal. Use of these terms should be construed as not departing from the scope of the various embodiments. The first user input signal and the second user input signal are both user input signals, but do not mean the same user input signals unless context clearly dictates otherwise.

The terms used to describe the embodiments are used for the purpose of describing specific embodiments, and are not intended to limit the embodiments. As used in the description of the embodiments and in the claims, the singular forms "a", "an", and "the" include plural referents unless the context clearly dictates otherwise. The expression "and/or" is used to include all possible combinations of terms. The terms such as "includes" or "has" are intended to indicate existence of figures, numbers, steps, elements, and/or components and should be understood as not precluding possibility of existence of additional existence of figures, numbers, steps, elements, and/or components. As used herein, conditional expressions such as "if" and "when" are not limited to an optional case and are intended to be interpreted, when a specific condition is satisfied, to perform the related operation or interpret the related definition according to the specific condition.

Operations according to the embodiments described in this specification may be performed by a transmission/reception device including a memory and/or a processor according to embodiments. The memory may store programs for processing/controlling the operations according to the embodiments, and the processor may control various operations described in this specification. The processor may be referred to as a controller or the like. In embodiments, operations may be performed by firmware, software, and/or a combination thereof. The firmware, software, and/or a combination thereof may be stored in the processor or the memory.

MODE FOR INVENTION

As described above, related contents have been described in the best mode for carrying out the embodiments.

INDUSTRIAL APPLICABILITY

As described above, the embodiments may be fully or partially applied to the point cloud data transmission/reception device and system.

It will be apparent to those skilled in the art that variously changes or modifications may be made to the embodiments within the scope of the embodiments.

Thus, it is intended that the embodiments cover the modifications and variations of this disclosure provided they come within the scope of the appended claims and their equivalents.

What is claimed is:

1. A method for processing point cloud data by a transmitting system, the method comprising:
performing a partition of the point cloud data into one or more slices selectively based on a comparison determination between a number of points of the point cloud data and maximum number information, wherein, when the number of points of the point cloud data is larger than the maximum number information for representing a maximum number of points in a slice, the partition of the point cloud data into one or more slices is performed based on an octree of the point cloud data and wherein, when the number of points of the point cloud data is less than or equal to the maximum number information, the partition of the point cloud data into one or more slices is not performed;

encoding the point cloud data on which the partition is performed or not performed; and transmitting a bitstream including the encoded point cloud data and signaling information for the point cloud data.

2. The method of claim 1, wherein the encoding includes, encoding geometry data of the point cloud data; and encoding attribute data of the point cloud data.

3. The method of claim 1, wherein the signaling information includes, information representing whether the partition is performed and information representing a method of the partition when the partition is performed.

4. The method of claim 1, wherein, when the one or more slices includes a first slice and a second slice, the first slice and the second slice include a nested region of 3-dimensional space including the point cloud data.

5. A transmitting system for processing point cloud data, the transmitting system comprising:

a partitioner configured to perform a partition of the point cloud data into one or more slices selectively based on a comparison determination between a number of points of the point cloud data and maximum number information, wherein, when the number of points of the point cloud data is larger than the maximum number information for representing a maximum number of points in a slice, the partition of the point cloud data into one or more slices is performed based on an octree of the point cloud data and wherein, when the number of points of the point cloud data is less than or equal to the maximum number information, the partition of the point cloud data into one or more slices is not performed;

an encoder configured to encode the point cloud data on which the partition is performed or not performed; and a transmitter configured to transmit a bitstream including the encoded point cloud data and signaling information for the point cloud data.

6. The apparatus of claim 5, wherein the encoder includes, a geometry encoder configured to encode geometry data of the point cloud data; and an attribute encoder configured to encode attribute data of the point cloud data.

7. The apparatus of claim 1, wherein the signaling information includes, information representing whether the partition is performed and information representing a method of the partition when the partition is performed.

8. The apparatus of claim 5, wherein, when the one or more slices include a first slice and a second slice, the first slice and the second slice include a nested region of 3-dimensional space including the point cloud data.

9. A receiving system for processing encoded point cloud data, the receiving system comprising:

a receiver configured to receive a bitstream including the encoded point cloud data and signaling information for the encoded point cloud data;

a decoder configured to decode the encoded cloud data, wherein the point cloud data is partitioned into one or more slices selectively based on a comparison determination between a number of points of the point cloud data and maximum number information by a transmitting system, wherein, when the number of points of the point cloud data is larger than the maximum number information for representing a maximum number of points in a slice, the point cloud data is partitioned into one or more slices based on an octree of the point cloud data and wherein, when the number of points of the point cloud data is less than or equal to the maximum number information, the point cloud data is not partitioned into one or more slices; and a render configured to render the decoded point cloud data.

10. The apparatus of claim 9, wherein the decoder includes, a geometry decoder configured to decode geometry data of the point cloud data; and, an attribute decoder configured to decode attribute data of the point cloud data.

11. The apparatus of claim 9, wherein the signaling information includes, information representing whether the point cloud data is partitioned into one or more slices, and information representing a partitioning method for the one or more slices when the partitioning is performed.

12. The apparatus of claim 9, wherein, when the one or more slices include a first slice and a second slice, the first slice and the second slice include a nested region of 3-dimensional space including the point cloud data.

13. A method of processing encoded point cloud data by a receiving system, the method comprising:

receiving a bitstream including the encoded point cloud data and signaling information for the encoded point cloud data;

decoding the encoded point cloud data, wherein the point cloud data is partitioned into one or more slices selectively based on a comparison determination between a number of points of the point cloud data and maximum number information by a transmitting system, wherein, when the number of points of the point cloud data is larger than the maximum number information for representing a maximum number of points in a slice, the point cloud data is partitioned into one or more slices based on an octree of the point cloud data and wherein, when the number of points of the point cloud data is less than or equal to the maximum number information, the point cloud data is not partitioned into one or more slices; and rendering the decoded point cloud data.

14. The method of claim 13, wherein the decoding the encoded point cloud data includes, decoding geometry data of the point cloud data; and, decoding attribute data of the point cloud data.

15. The method of claim 13, wherein the signaling information includes, information representing whether the point cloud data is partitioned into one or more slices, and information representing a partitioning method for the one or more slices.

16. The method of claim 13, wherein, when the one or more slices include a first slice and a second slice, the first slice and the second slice include a nested region of 3-dimensional space including the point cloud data.

* * * * *